US008481351B2

(12) United States Patent
Kawasaki

(10) Patent No.: US 8,481,351 B2
(45) Date of Patent: Jul. 9, 2013

(54) ACTIVE MATRIX SUBSTRATE MANUFACTURING METHOD AND LIQUID CRYSTAL DISPLAY DEVICE MANUFACTURING METHOD

(75) Inventor: Kiyohiro Kawasaki, Hirakata (JP)

(73) Assignee: Sharp Kabushiki Kaisha, Osaka (JP)

( * ) Notice: Subject to any disclaimer, the term of this patent is extended or adjusted under 35 U.S.C. 154(b) by 141 days.

(21) Appl. No.: 13/139,732

(22) PCT Filed: Dec. 16, 2009

(86) PCT No.: PCT/JP2009/070999
§ 371 (c)(1),
(2), (4) Date: Jun. 15, 2011

(87) PCT Pub. No.: WO2010/071160
PCT Pub. Date: Jun. 24, 2010

(65) Prior Publication Data
US 2011/0250713 A1 Oct. 13, 2011

(30) Foreign Application Priority Data

Dec. 19, 2008 (JP) ................................ 2008-324392

(51) Int. Cl.
*H01L 21/84* (2006.01)
(52) U.S. Cl.
USPC ............................................ 438/30; 438/158
(58) Field of Classification Search
USPC ...................... 438/151–166; 257/E21.561
See application file for complete search history.

(56) References Cited

U.S. PATENT DOCUMENTS

| 5,731,856 | A | 3/1998 | Kim et al. | |
|---|---|---|---|---|
| 6,287,899 | B1 | 9/2001 | Park et al. | |
| 6,562,670 | B2 * | 5/2003 | Shih .............................. | 438/160 |
| 7,112,512 | B2 * | 9/2006 | Lan et al. ...................... | 438/430 |
| 2001/0046016 | A1 | 11/2001 | Park et al. | |
| 2003/0133067 | A1 | 7/2003 | Park et al. | |
| 2005/0082536 | A1 | 4/2005 | Park et al. | |
| 2005/0185126 | A1 | 8/2005 | Kawasaki | |
| 2007/0242178 | A1 | 10/2007 | Kawasaki et al. | |
| 2008/0164470 | A1 | 7/2008 | Wang et al. | |

FOREIGN PATENT DOCUMENTS

| JP | 2987045 B2 | 12/1999 |
|---|---|---|
| JP | 2000-206571 A | 7/2000 |
| JP | 2003-124213 A | 4/2003 |
| JP | 2005-010806 A | 1/2005 |

(Continued)

OTHER PUBLICATIONS

Official Communication issued in International Patent Application No. PCT/JP2009/070999, mailed on Mar. 16, 2010.

*Primary Examiner* — Richard Booth
(74) *Attorney, Agent, or Firm* — Keating & Bennett, LLP

(57) ABSTRACT

Provided is an active matrix substrate manufacturing method, including the steps of: selectively forming a laminated structure pattern, by forming the laminated structure on a glass substrate (2), by forming a first photosensitive resin pattern (PR) on the laminated structure, and by selectively forming the laminated structure pattern using the first photosensitive resin pattern (PR), the laminated structure including a metal layer (a scanning signal line (11) material), a gate insulative layer (30), and a semiconductor layer (31, 33) (transistor material); fluorinating a surface of the first photosensitive resin pattern (PR) by dry-etching with fluorine gas; applying a coating-type transparent insulative resin (60) onto the glass substrate (2) to fill a space in the laminated structure pattern; and removing the fluorinated first photosensitive resin pattern (PR). This enables to form, in an active matrix substrate manufacturing process, a scanning signal line and a semiconductor layer with a single mask process.

14 Claims, 38 Drawing Sheets

FOREIGN PATENT DOCUMENTS

| | | |
|---|---|---|
| JP | 2005-017669 A | 1/2005 |
| JP | 2005-049667 A | 2/2005 |
| JP | 2005-074367 A | 3/2005 |
| JP | 2005-181984 A | 7/2005 |
| JP | 2006-301560 A | 11/2006 |
| JP | 2008-166765 A | 7/2008 |

* cited by examiner

ACTIVE MATRIX SUBSTRATE MANUFACTURING METHOD AND LIQUID CRYSTAL DISPLAY DEVICE MANUFACTURING METHOD

TECHNICAL FIELD

The present invention relates to (i) a method for manufacturing an active matrix-type liquid crystal display device including a transistor provided for each pixel and (ii) a method for manufacturing an active matrix substrate included in the liquid crystal display device.

BACKGROUND ART

Along with the recent development in (i) a microfabrication technology, (ii) a technology related to liquid crystal materials, and (iii) a high-density packaging technique, 5 cm through 100 cm diagonal liquid crystal display devices for displaying television images and/or various kinds of images have been distributed in mass quantities on a commercial basis. Such the liquid crystal display device is provided with a liquid crystal panel including two glass substrates, one of which is provided with an RGB colored layer, so that the liquid crystal display device can easily carry out a color display. Further, a so-called active matrix-type liquid crystal panel, which includes a switching element integrated into each pixel, has guaranteed to provide images with less crosstalk, a high response speed, and a high contrast ratio, since it was first commercialized.

The liquid crystal display device (liquid crystal panel) typically includes approximately 200 through 1200 scanning signal lines (gate wires) and approximately 300 through 1600 data signal lines (source wires), the scanning signal lines and the data signal lines being arranged in a matrix. Further, a liquid crystal display device is recently being developed to have a larger screen and a higher resolution, in order to deal with an increasing display capacity.

FIG. 33 is a perspective view illustrating a method disclosed in Patent Literature 7 for mounting a liquid crystal panel. An electric signal is allowed to be supplied to an image display section by a mounting method such as a COG (Chip-On-Glass) method or a TCP (Tape-Carrier-Package) method. According to the COG method, a semiconductor integrated circuit chip 3 for supplying a drive signal is connected with, by an electrically conductive adhesive, an electrode terminal 5 of a scanning signal line formed on one of transparent insulative substrates included in a liquid crystal panel 1, for example, on a glass substrate 2. According to the TCP method, a TCP film 4 which includes, e.g., (i) a base made of a polyimide resin thin film and (ii) a terminal made of copper foil and plated with gold or solder is brought into contact with and fixed to an electrode terminal 6 of a data signal line by a suitable adhesive containing an electrically conductive medium. Here, for convenience of explanation, these two mounting methods are both illustrated in FIG. 33. Actually, however, one of the two mounting methods is selected as needed.

Reference number 7 indicates a wiring path allowing (i) a pixel in an image display section, which is positioned in a substantially center part of the liquid crystal panel 1, and (ii) the electrode terminal 5 of the scanning signal line to be connected with each other, whereas reference number 8 indicates a wiring path allowing (i) a pixel in the image display section and (ii) the electrode terminal 6 of the data signal line to be connected with each other. The wiring paths 7 and 8 are not necessarily made of the same material as that of the electrode terminals 5 and 6. Reference number 9 indicates a counter glass substrate or a color filter substrate. The counter glass substrate or the color filter substrate is the other one of the transparent insulative substrates, and is provided with, on its surface facing the one transparent insulative substrate, a transparent electrically conductive counter electrode, which is common to all liquid crystal cells.

FIG. 34 is an equivalent circuit diagram of an active matrix-type liquid crystal display device including, as a switching element, an insulated gate transistor 10 which is provided for each pixel. In FIG. 34, reference number 11 (in FIG. 33, reference number 7) indicates a scanning signal line, reference number 12 (in FIG. 33, reference number 8) indicates a data signal line, and reference number 13 indicates a liquid crystal cell. Electrically, the liquid crystal cell 13 is regarded as a capacitor element. Elements depicted by full lines are provided on a glass substrate 2, which is one of glass substrates included in a liquid crystal panel 1. A counter electrode 14, which is depicted by broken lines and is common to all liquid crystal cells 13, is formed on a main surface of a glass substrate (color filter substrate) 9, i.e., the other one of the glass substrates, the main surface facing the glass substrate 2. In a case (i) where the insulated gate transistor 10 has a low resistance during off or the liquid crystal cell 13 has a low resistance or (ii) where gradation properties of a display image are regarded as important, the circuit is given an additional feature; for example, an auxiliary storage capacitor (auxiliary capacitor) 15 is additionally provided in parallel with the liquid crystal cell 13, which auxiliary storage capacitor increases a time constant of the liquid crystal cell 13 serving as a load. Reference number 16 indicates a storage capacitor line or a common electrode, which serves as a common bus line for the storage capacitors 15.

FIG. 35 is a cross-sectional view illustrating a main part of an image display section of a liquid crystal display device. As shown in FIG. 35, a liquid crystal panel 1 includes two glass substrates 2 and 9, which are provided so as to be away from each other by a predetermined distance of some μm by a spacer material (not illustrated) such as a resin fiber, a resin bead, or a columnar spacer which is provided on the color filter substrate 9. The clearance (gap) between the glass substrates 2 and 9 is a closed space sealed with a sealing material (not illustrated) which is provided in the periphery of the glass substrate 9 and is made of an organic resin. The closed space is filled with liquid crystal 17.

In order to provide a color display, on a surface of the glass substrate 9 facing the closed space, such an organic thin film (referred to as a "colored layer 18") is deposited that has a thickness of approximately 1 μm through approximately 2 μm and contains dye and/or pigment. Consequently, a color display function is attained. In this case, the glass substrate 9 is also referred to as a "color filter" (abbreviated as "CF"). Further, depending on the properties of the liquid crystal material 17, an upper surface of the glass substrate 9 and/or a lower surface of the glass substrate 2 is/are provided with a polarizing plate(s) 19, so that the liquid crystal panel 1 serves as an electro-optic element. Currently, most of commercially-available liquid crystal panels employ a TN (twisted nematic) liquid crystal material, and typically require two polarizing plates 19. A transmissive liquid crystal panel includes a back-side light source (not illustrated) as a light source, so that white light is emitted from its lower side.

Each of the two grass substrates 2 and 9 is provided with a polyimide resin thin film 20 which is formed so as to be in contact with the liquid crystal 17 and to have a thickness of, e.g., approximately 0.1 μm. The polyimide resin thin film 20 is an alignment film for aligning liquid crystal molecules along a predetermined direction. Reference number 21 indicates a drain electrode (wire) by which (i) a drain of an insulated gate transistor 10 and (ii) a transparent electrically conductive pixel electrode 22 are connected with each other. In many cases, the drain electrode 21 and a data signal line (source wire) 12 are formed concurrently. Provided between the source electrode 12 and the drain electrode 21 is a semiconductor layer 23, which will be described in detail later. In a boundary between colored layers 18 which are adjacent to each other on the color filter substrate 9, there provided a Cr thin film layer 24 having a thickness of approximately 0.1 μm. The Cr thin film layer 24 is a light-shielding member for preventing external light from entering the semiconductor layer 23, the scanning signal line 11, and the data signal line 12. This is an established technique, i.e., a so-called black matrix (abbreviated as "BM").

In order to manufacture an active matrix substrate 71 including a glass substrate 2 on which a scanning signal line, a data signal line, an insulated gate transistor serving as a switching element, and a pixel electrode are provided, it is indispensable to carry out two or more photolithography (photo-etching) steps each using a photo mask, as well as in a process for manufacturing a semiconductor integrated circuit. However, a step of patterning a semiconductor layer into islands has been streamlined, and a step of forming a contact to the scanning signal line has been eliminated (details thereof are omitted here). In addition, a dry etching technique has been introduced. Thanks to these, the number of necessary photo masks has been now reduced to five, although seven or eight photo masks were necessary before. This greatly contributes to a reduction of a process cost. In order to reduce a manufacturing cost of a liquid crystal display device, it is effective to reduce the process cost in a procedure for manufacturing an active matrix substrate, and it is effective to reduce a cost of components in a panel assembling procedure and a module mounting procedure. These have been commonly-known objects in development. Further, it is clear that reducing the number of manufacturing steps including the photo-etching step would greatly contribute to (i) improvement in productivity in manufacturing of liquid crystal display devices and (ii) a reduction of the cost thereof.

As already described, the typical method for manufacturing the active matrix substrate 71 requires five photo-etching steps. However, Patent Literature 1 discloses a manufacturing method which enables a further reduction of the manufacturing cost. The following will describe a four-mask process disclosed in Patent Literature 1. The four-mask process is a technique for reducing the number of steps or streamlining the steps. Specifically, the four-mask process uses a halftone exposure technique, and carries out, with a single photo mask, (i) a step of patterning a semiconductor layer (including a channel) into islands and (ii) a step of forming a source wire and a drain wire.

Each of FIGS. 36 and 37 shows plan views of one unit of a pixel included in an active matrix substrate 71 to which the four-mask process is applied. Each of FIGS. 38 and 39 shows cross-sectional views illustrating manufacturing steps, viewed in an A-A' line (i.e., a region of an insulated gate transistor), a B-B' line (i.e., a region of an electrode terminal of a scanning signal line), and a C-C' line (i.e., a region of an electrode terminal of a data signal line), each of these lines being shown in (b) of FIG. 37. Conventionally, the insulated gate transistor is often selected from two types, an etch stop type insulated gate transistor and a channel etch type insulated gate transistor. Here, as one example, the channel etch type insulated gate transistor is illustrated.

As shown in (a) of FIG. 36 and (a) of FIG. 38, a glass substrate 2 having a thickness of approximately 0.5 mm through approximately 1.1 mm, for example, "1737" (product name) manufactured by Corning Incorporated, is used as an insulative substrate having high heat resistance, high chemical resistance, and high transparency. First, on one main surface of the glass substrate 2, a first metal layer (i.e., a metal layer for a scanning signal line) having a film thickness of approximately 0.1 μm through approximately 0.3 μm is deposited by use of a vacuum film forming device such as SPT (sputtering). Then, through a microfabrication technology, a scanning signal line 11, which serves also as a gate electrode 11A, and a storage capacitor line 16 are selectively formed. The scanning signal line is made of a material which is determined by comprehensively considering heat resistance, chemical resistance, hydrofluoric acid resistance, and electric conductivity. Typically, the scanning signal line is made of (i) a metal thin film layer made of, e.g., Cr or Ta, each of which has high heat resistance, or (ii) an alloy thin film layer made of, e.g., an MoW alloy.

It is reasonable to use Al (aluminum) as the material of the scanning signal line, in order to reduce a resistance of the scanning signal line and cope with a liquid crystal panel having a larger screen and a higher resolution. However, Al alone has low heat resistance; therefore, currently, the scanning signal line is typically made of a lamination of Al and the above-mentioned heat resistant metal, i.e., Cr, Ta, Mo, or a silicide thereof. Namely, the scanning signal line 11 is typically made of one or more metal layers.

Next, a PCVD (plasma CVD) device is used to sequentially deposit, on an entire surface of the glass substrate 2, three types of thin film layers, i.e., (i) a first silicon nitride (SiNx) layer 30, which becomes a gate insulative layer, (ii) a first amorphous silicon (a-Si) layer 31, which hardly contains an impurity and which becomes a channel of an insulated gate transistor, and (iii) a second amorphous silicon (n+a-Si) layer 33, which contains phosphorus as an impurity and becomes a source and a drain of the insulated gate transistor, so that the first silicon nitride layer 30, the first amorphous silicon layer 31, and the second amorphous silicon layer 33 have film thicknesses of, e.g., approximately 0.3 μm, approximately 0.2 μm, and approximately 0.05 μm, respectively. Subsequently, a vacuum film forming device such as SPT is used to sequentially deposit, e.g., a Ti thin film layer 34 as a heat resistant metal layer having a film thickness of approximately 0.1 μm, an Al thin film layer 35 as a low resistant metal layer having a film thickness of approximately 0.3 μm, and, e.g., a Ti thin film layer 36 as a buffer metal layer having a film thickness of approximately 0.1 μm. Consequently, a material of a source wire and a drain wire is provided.

Then, through a microfabrication technology, (i) a data signal line 12 and (ii) a drain electrode 21 of the insulated gate transistor are selectively formed. The data signal line 12, which serves also as a source electrode of the insulated gate transistor, includes a heat resistant metal layer 34A, a low resistant metal layer 35A, and a buffer metal layer 36A, which are laminated together and partially overlap the gate electrode 11A. Similarly, the drain electrode 21 includes a heat resistant metal layer 34B, a low resistant metal layer 35B, and a buffer metal layer 36B, which are laminated together and partially overlap the gate electrode 11A. In this selective patterning, as shown in (b) of FIG. 36 and (b) of FIG. 38, photosensitive resin patterns 80A and 80B are formed by a halftone exposure technique so that (i) a channel formed region 80B (a hatched region in (b) of FIG. 36) between the source and the drain has a film thickness of, e.g., 1.5 μm and (ii) each of a source wire formed region 80A(12) and a drain wire formed region 80A

(21) has a film thickness of 3 µm. This is a significant feature of the streamlined four-mask process.

In order to manufacture the active matrix substrate 71, a positive photosensitive resin is typically used. Therefore, the photosensitive resin patterns 80A and 80B may be formed by use of a photo mask configured as follows: (i) in a part corresponding to the source wire and drain wire formed region 80A, a black region (i.e., a Cr thin film) is provided; (ii) in a part corresponding to the channel formed region 80B, a gray (halftone) region is provided by which an amount of light transmitted through the photo mask is reduced (e.g., a Cr line-and-space pattern having a width of approximately 0.5 µm through approximately 1.5 µm); and (iii) in the other regions, a white region is provided (i.e., the Cr thin film is not provided). Since a resolution of an exposure device is insufficient in the gray region, the line-and-space pattern is not resolved. This allows approximately half of light emitted by a lamp light source toward the photo mask to be transmitted through the gray region. Consequently, it is possible to obtain the photosensitive resin patterns 80A and 80B, having a cross section shaped in a recess as shown in (c) of FIG. 38, according to the property of the positive photosensitive resin leaving as a film. Instead of the slits, the gray region can be made of a metal layer having different film thicknesses or different transmittances, e.g., of a $MoSi_2$ thin film.

As shown in (b) of FIG. 36 and (b) of FIG. 38, by use of the photosensitive resin patterns 80A and 80B as a mask, the Ti thin film layer 36, the Al thin film layer 35, the Ti thin film layer 34, the second amorphous silicon layer 33, and the first amorphous silicon layer 31 are sequentially etched, so that the gate insulative layer 30 is exposed. Thereafter, through ashing means such as oxygen plasma, the thicknesses of the photosensitive resin patterns 80A and 80B are each reduced by 1.5 µm or more. As a result, the photosensitive resin pattern 80B disappears, so that a part of the Ti thin film layer 36 which part is in the channel formed region is exposed (not illustrated). This allows, as shown in (c) of FIG. 36 and (c) of FIG. 38, photosensitive resin patterns 80C(12) and 80C(21), each of which has a reduced thickness, to be left only in the source wire formed region and the drain wire formed region.

By use of the photosensitive resin patterns 80C(12) and 80C(21), each of which has a reduced film thickness, etching is carried out in a region between the source wire and the drain wire (i.e., the channel formed region). Namely, in this region, the Ti thin film layer 36, the Al thin film layer 35, the Ti thin film layer 34, the second amorphous silicon layer 33, and the first amorphous silicon layer 31 are sequentially etched again, so that the first amorphous silicon layer 31A is left to have a thickness of approximately 0.05 µm through approximately 0.1 µm. At this time, a source 33S and a drain 33D, each of which is made of the second amorphous silicon layer, are separated from each other. Thus, the source wire 12 and the drain wire 21 are formed in such a manner that, after the metal layer is etched, the first amorphous silicon layer 31A is etched so as to be left to have a thickness of approximately 0.05 µm through 0.1 µm. On this account, an insulated gate transistor obtained by such the manufacturing method is called a "channel etch type transistor".

In the above oxygen plasma process, the photosensitive resin pattern 80A is transformed into the photosensitive resin pattern 80C, which has a reduced film thickness. Therefore, in order to suppress a variation in the pattern size, it is preferable to strengthen anisotropy. Concretely, the oxygen plasma process is preferably carried out by RIE (Reactive Ion Etching) method, further preferably by ICP (Inductive Coupled Plasma) method or TCP (Transfer Coupled Plasma) method, each involving a high-density plasma source.

The photosensitive resin patterns 80C(12) and 80C(21) are removed. Thereafter, on the entire surface of the glass substrate 2, a second SiNx layer having a film thickness of approximately 0.3 µm is deposited as a transparent insulative layer, so that a passivation insulative layer 37 is formed. Subsequently, as shown in (a) of FIG. 37 and (a) of FIG. 39, (i) an opening 62 is formed above the drain electrode 21, (ii) an opening 63 is formed in a region which is outside the image display section and in which an electrode terminal of the scanning signal line 11 is to be formed, and (iii) an opening 64 is formed in a region which is outside the image display section and in which an electrode terminal of the data signal line 12 is to be formed. A part of the passivation insulative layer 37 and a part of the gate insulative layer 30 which parts correspond to the opening 63 are removed, so as to expose, in the opening 63, a part 5 of the scanning signal line. Further, parts of the passivation insulative layer 37 which parts respectively correspond to the openings 62 and 64 are removed, so as to expose a part of the drain electrode 21 and a part 6 of the data signal line. Similarly, an opening 65 is formed above the storage capacitor line 16, so as to expose a part of the storage capacitor line 16.

Lastly, a vacuum film forming device such as SPT is used to deposit a transparent electrically conductive layer having a film thickness of approximately 0.1 µm through approximately 0.2 µm, e.g., ITO (Indium-Tin-Oxide), IZO (Indium-Zinc-Oxide), or a mixed crystal thereof. Then, as shown in (b) of FIG. 37 and (b) of FIG. 39, a pixel electrode 22, which is transparent and electrically conductive, is selectively formed on the passivation insulative layer 37 by a microfabrication technology so as to include the opening 62. Thus, the active matrix substrate 71 is completed. Now, a configuration of a storage capacitor 15 (FIG. 34) is explained. As shown in (b) of FIG. 37 and (b) of FIG. 39, the storage capacitor 15 is configured by the drain electrode 21 and the storage capacitor line 16 overlapping each other via the gate insulative layer 30, the first amorphous silicon layer 31A, and the second amorphous silicon layer 33D, when seen in a plan view (see a region 50 hatched with lines sloping from left to right in (a) of FIG. 37). Further, speaking of electrode terminals, electrode terminals 5A and 6A, each of which is transparent and electrically conductive, are selectively formed on the passivation insulative layer 37 so as to include the openings 63 and 64, respectively.

As described above, in order to use Al to make the source wire 12 and the drain wire 21, each of the source wire 12 and the drain wire 21 needs the heat resistant layer 34 for securing electrical connection with the second amorphous silicon 33. Furthermore, the buffer metal layer 36 needs to be provided between (i) the source wire 12 and the drain wire 21 and (ii) the transparent electrically conductive layer, in order to prevent them from working as a battery in an alkaline fluid. On this account, each of the source and drain wires must be formed to have a three-layer configuration. However, in a liquid crystal panel having a large screen or a high resolution, it is difficult to avoid use of the low resistance metal layer (Al thin film layer), since resistances of the source and drain wires must be strictly limited in such the liquid crystal panel.

Conventionally, in a case where the heat resistant metal layer 34 and the buffer metal layer 36 are made of Ti, etching of such the heat resistant metal layer 34 and buffer metal layer 36 need be carried out by a dry etching process with a chlorine gas, and accordingly etching of Al also needs to be carried out by dry etching process with a chlorine gas. This costs high not only in terms of materials but also in terms of production equipment. Recently, however, a new chemical for etching Ti is provided by Mitsubishi Chemical Corporation, and this will probably reduce the cost of the production equipment. In a case where the heat resistant metal layer 34 and the buffer metal layer 36 are made of Mo instead of Ti, it is commonly carried out to etch a three-layer structure of Mo/Al/Mo by a single chemical treatment with a phosphoric acid solution containing an appropriate amount of nitric acid. It is easily understood that this will reduce investment in production equipment. Further, needless to say, efforts have been made to simplify the source and drain wires as much as possible, in order to reduce the production cost.

The channel forming step employed in the four-mask process concurrently removes (i) a part of the material of the source wire and the drain wire and (ii) a part of the semiconductor layer containing an impurity, both of the parts being located between the source wire 12 and the drain wire 21. Therefore, this channel forming step determines a channel length (4 μm through 6 μm in current mass-produced products), which greatly affects characteristics of the insulated gate transistor during on. Since a variation in the channel length significantly changes an electric current value of the insulated gate transistor during on, strict manufacturing control is typically requested therefor.

However, the channel length, i.e., the pattern size of the halftone exposure region is affected by a lot of parameters such as: an amount of exposure (a strength of a light source and patterning accuracy of a photo mask, particularly, sizes of lines and spaces); a thickness of a photosensitive resin applied; a development process condition of the photosensitive resin; and/or how much a film thickness of the photosensitive resin is reduced in the etching step. Furthermore, since it is also necessary to consider uniformity of these parameters in the surface, a display panel substrate having a target channel length cannot be always produced with a high yield and in a stable manner.

On this account, in a case of using the above-described channel forming step employed in the four-mask process, more strict manufacturing control than conventional manufacturing control is necessary. Thus, the four-mask process has not been completed at a high level. Particularly in a case where the channel length is 5 μm or less, as the thicknesses of the photosensitive resin patterns 80A(12) and 80A(21) reduce, an effect of the pattern size becomes greater. Thus, in this case, the above tendency is significant.

It is relatively easy to prepare a photo mask so as to have a large size in advance, in order to prevent a reduction of the pattern size, which occurs along with a reduction of the film thickness of the photosensitive resin pattern. However, the pattern size of the photosensitive resin 80B, which is for the channel region, cannot be made smaller than a resolution limit (approximately 3 μm at minimum) of the exposure device. Therefore, after all, the channel length is longer twice an amount of a reduction of the photosensitive resin pattern which reduction is observed along a horizontal direction. Furthermore, a variation in the amount of the reduction of the photosensitive resin pattern also becomes greater in the surface of the glass substrate. This is considered to be one of the reasons why the four-mask process is slow to be introduced in existing production lines for a glass substrate of 1 m or more.

Citation List

[Patent Literatures]

Patent Literature 1
Japanese Patent Application Publication, Tokukai, No. 2000-206571 A (Publication Date: Jul. 28, 2000)
Patent Literature 2
Japanese Patent Application Publication, Tokukai, No. 2005-181984 A (Publication Date: Jul. 7, 2005)
Patent Literature 3
Japanese Patent Application Publication, Tokukai, No. 2006-301560 A (Publication Date: Nov. 2, 2006)
Patent Literature 4
Japanese Patent Application Publication, Tokukai, No. 2005-010806 A (Publication Date: Jan. 13, 2005)
Patent Literature 5
Japanese Patent Application Publication, Tokukai, No. 2005-049667 A (Publication Date: Feb. 24, 2005)
Patent Literature 6
Japanese Patent Application Publication, Tokukai, No. 2005-017669 A (Publication Date: Jan. 20, 2005)
Patent Literature 7
Japanese Patent No. 2987045 (Publication Date: Jul. 28, 1995)

SUMMARY OF INVENTION

Technical Problem

As described above, the invention described in Patent Literature 1 proposes the four-mask process in order to reduce the production cost. However, in order to further reduce the production cost, it is desired to further reduce the number of steps in the process for manufacturing an active matrix substrate for a display panel.

According to the above-described conventional manufacturing process, a scanning signal line is firstly patterned on a substrate, and thereafter a semiconductor layer is patterned thereon. Namely, separate patterning steps are carried out for patterning the scanning signal line and the semiconductor layer. Thus, according to the conventional manufacturing process, at least two photo masks are necessary until the semiconductor layer is formed. This has been an obstacle against a further reduction in the number of steps.

In view of this, an object of the present invention is to provide an active matrix substrate manufacturing process in which a step of forming a scanning signal line and a semiconductor layer are carried out by a single-mask process, in order to further reduce the number of steps.

Solution to Problem

In order to attain the foregoing object, a method of the present invention for manufacturing an active matrix substrate is a method for manufacturing an active matrix substrate, the active matrix substrate including a data signal line, a scanning signal line, a transistor connected with the data signal line and the scanning signal line, and a pixel electrode connected with the data signal line via the transistor, said method including the steps of: (i) selectively forming a pattern of a laminated structure, by forming the laminated structure on a substrate, by forming a first photosensitive resin pattern on the laminated structure, and by selectively forming the pattern of the laminated structure by use of the first photosensitive resin pattern, the laminated structure including (a) a metal layer, which is a material of the scanning signal line, (b) a gate insulative layer, and (c) a semiconductor layer, which is a material of the transistor; (ii) fluorinating a surface of the first photosensitive resin pattern by dry etching with a fluorine gas; (iii) applying a transparent insulative resin of coating type onto the substrate so that the transparent insulative resin fills a space in the pattern of the laminated structure; and (iv) removing the first photosensitive resin pattern which has been fluorinated.

According to the above method, by use of the first photosensitive resin pattern, the pattern of the laminated structure is formed, the laminated structure including (i) the metal layer (first metal layer) for the scanning signal line, (ii) the gate insulative layer, and (iii) the semiconductor layer. Further, by utilizing water repellency of the first photosensitive resin pattern having been fluorinated, the transparent insulative resin is selectively formed in the space in the pattern of the laminated structure, so that the space in the pattern of the laminated structure is filled with the transparent insulative resin. Consequently, a side surface of the scanning signal line is made insulative. In this manner, the scanning signal line and the semiconductor layer are formed concurrently (concurrent patterning).

Thus, according to the above method, it is possible to form the scanning signal line and the semiconductor layer by use of only a single photosensitive resin pattern (photo mask). Consequently, according to the above method, it is possible to reduce the number of steps, as compared with the conventional manufacturing methods which require at least two photo masks until the semiconductor layer is formed.

Also, according to the above method, even in the case where the pattern of the laminated structure including the metal layer, the gate insulative layer, and the semiconductor layer is formed by use of a single photo mask (first photosensitive resin pattern), it is possible to provide the active matrix substrate with (i) the pattern of the laminate structure and (ii) another electrically conductive pattern intersecting with each other, since the insulative layer is formed so as to cover a side surface of the metal layer and accordingly the metal layer is made insulative.

Advantageous Effects of Invention

A method of the present invention for manufacturing a liquid crystal display device includes the steps of: (i) selectively forming a pattern of a laminated structure, by forming the laminated structure on a substrate, by forming a first photosensitive resin pattern on the laminated structure, and by selectively forming the pattern of the laminated structure by use of the first photosensitive resin pattern, the laminated structure including (a) a metal layer, which is a material of the scanning signal line, (b) a gate insulative layer, and (c) a semiconductor layer, which is a material of the transistor; (ii) fluorinating a surface of the first photosensitive resin pattern by dry etching with a fluorine gas; (iii) applying a transparent insulative resin of coating type onto the substrate so that the transparent insulative resin fills a space in the pattern of the laminated structure; and (iv) removing the first photosensitive resin pattern which has been fluorinated.

According to the above method, it is possible to form the scanning signal line and the semiconductor layer by use of only a single photosensitive resin pattern (photo mask). Consequently, according to the above method, it is possible to reduce the number of steps, as compared with the conventional manufacturing methods which require at least two photo masks until the semiconductor layer is formed. Thus, according to the present invention, it is possible to reduce the manufacturing cost of an active matrix substrate, and the manufacturing cost of a liquid crystal display device including the active matrix substrate.

BRIEF DESCRIPTION OF DRAWINGS

FIG. 17 shows cross-sectional views illustrating the process shown in FIG. 15 for manufacturing the active matrix substrate. (a) through (c) of FIG. 17 correspond to (a) through (c) of FIG. 15, respectively.

FIG. 18 shows cross-sectional views illustrating the process shown in FIG. 16 for manufacturing the active matrix substrate. (a) through (c) of FIG. 18 correspond to (a) through (c) of FIG. 16, respectively.

FIG. 19 shows plan views illustrating a process for manufacturing an active matrix substrate of a modification of Embodiment 3.

FIG. 20 shows cross-sectional views illustrating the process shown in FIG. 19 for manufacturing the active matrix substrate. (a) through (c) of FIG. 20 correspond to (a) through (c) of FIG. 19, respectively.

FIG. 21 shows cross-sectional views illustrating a process for manufacturing an active matrix substrate of Embodiment 4.

FIG. 22 shows plan views illustrating a process for manufacturing the active matrix substrate of Embodiment 4. The process shown in FIG. 22 is carried out following the manufacturing process shown in FIG. 21.

FIG. 23 shows cross-sectional views illustrating the process shown in FIG. 21 for manufacturing the active matrix substrate. (a) through (d) of FIG. 23 correspond to (a) through (d) of FIG. 21, respectively.

FIG. 24 shows cross-sectional views illustrating the process shown in FIG. 22 for manufacturing the active matrix substrate. (a) through (c) of FIG. 24 correspond to (a) through (c) of FIG. 22, respectively.

FIG. 25 shows plan views illustrating a process for manufacturing an active matrix substrate of a modification of Embodiment 4.

FIG. 26 shows cross-sectional views illustrating the process shown in FIG. 25 for manufacturing the active matrix substrate. (a) through (c) of FIG. 26 correspond to (a) through (c) of FIG. 26, respectively.

FIG. 27 shows plan views illustrating a process for manufacturing an active matrix substrate of Embodiment 5.

FIG. 28 shows plan views illustrating a process for manufacturing the active matrix substrate of Embodiment 5. The process shown in FIG. 28 is carried out following the manufacturing process shown in FIG. 27.

FIG. 29 shows cross-sectional views illustrating the process shown in FIG. 27 for manufacturing the active matrix substrate. (a) through (d) of FIG. 29 correspond to (a) through (d) of FIG. 27, respectively.

FIG. 30 shows cross-sectional views illustrating the process shown in FIG. 28 for manufacturing the active matrix substrate. (a) through (c) of FIG. 30 correspond to (a) through (c) of FIG. 28, respectively.

FIG. 31 shows plan views illustrating a process for manufacturing an active matrix substrate of a modification of Embodiment 5.

FIG. 32 shows cross-sectional views illustrating the process shown in FIG. 31 for manufacturing the active matrix substrate. (a) through (c) of FIG. 32 correspond to (a) through (c) of FIG. 31, respectively.

FIG. 33 is a perspective view illustrating a state where a conventional liquid crystal panel is mounted.

FIG. 34 is an equivalent circuit diagram of a conventional liquid crystal panel.

FIG. 35 is a cross-sectional view of a conventional liquid crystal panel.

FIG. 36 shows plan views illustrating a process for manufacturing a conventional active matrix substrate.

FIG. 37 shows plan views illustrating a process for manufacturing the conventional active matrix substrate. The process shown in FIG. 37 is carried out following the manufacturing process shown in FIG. 36.

FIG. 38 shows cross-sectional views illustrating the process shown in FIG. 36 for manufacturing the active matrix substrate. (a) through (c) of FIG. 38 correspond to (a) through (c) of FIG. 36, respectively.

FIG. 39 shows cross-sectional views illustrating the process shown in FIG. 37 for manufacturing the active matrix substrate. (a) and (b) of FIG. 39 correspond to (a) and (b) of FIG. 37, respectively.

DESCRIPTION OF EMBODIMENTS

According to the present invention, in order to carry out a step of forming a scanning signal line and a semiconductor layer by use of a single photo mask (photosensitive resin pattern), a coating type insulative resin is used as means for making an exposed side surface of the scanning signal line insulative. Here, by a method disclosed in Patent Literature 7 for selectively applying a resin (alignment film), i.e., by carrying out a plasma process with a fluorine gas with respect to a photosensitive resin pattern having been used to form a scanning signal line so that the photosensitive resin pattern attains water repellency, it is possible to selectively form an insulative layer made of an insulative resin so that the insulative layer fills a space between the scanning signal lines. Consequently, it is possible to arrange, in multiple layers, the scanning signal lines and data signal lines which are orthogonal to the scanning signal lines, thereby providing an active matrix substrate for a display device.

In addition, in order to streamline a step of forming a pixel electrode, as disclosed in Patent Literature 2, such a data signal line can be employed that is made of a lamination of (i) a transparent electrically conductive layer and (ii) a metal layer for a source wire and a drain wire. This makes it possible to manufacture an active matrix substrate by use of three photo masks.

Further, as already disclosed by the inventor of the present invention in Patent Literature 3, the following technique for streamlining the step of forming the pixel electrode can be employed: In a step of forming an opening through which a pixel electrode is connected with a drain electrode, an unnecessary part of a thin film layer (e.g., a gate insulative layer) which part corresponds to a region where a pixel electrode is to be formed is removed so as to expose the insulative layer, and the pixel electrode is formed on the insulative layer by lift-off so that the pixel electrode includes a drain electrode exposed.

By combining (i) the basic technique for carrying out, with a single photo mask, the step of forming the scanning signal line and the semiconductor layer with (ii) any of the above techniques for streamlining the step of forming the pixel electrode, it is possible to reduce the number of steps in a different manner from that of Patent Literature 3. Namely, this makes it possible to manufacture an active matrix substrate by use of three photo masks.

The following will describe embodiments of the present invention with reference to FIGS. 1 through 32. However, the present invention is not limited to the embodiments.

Figure 3:
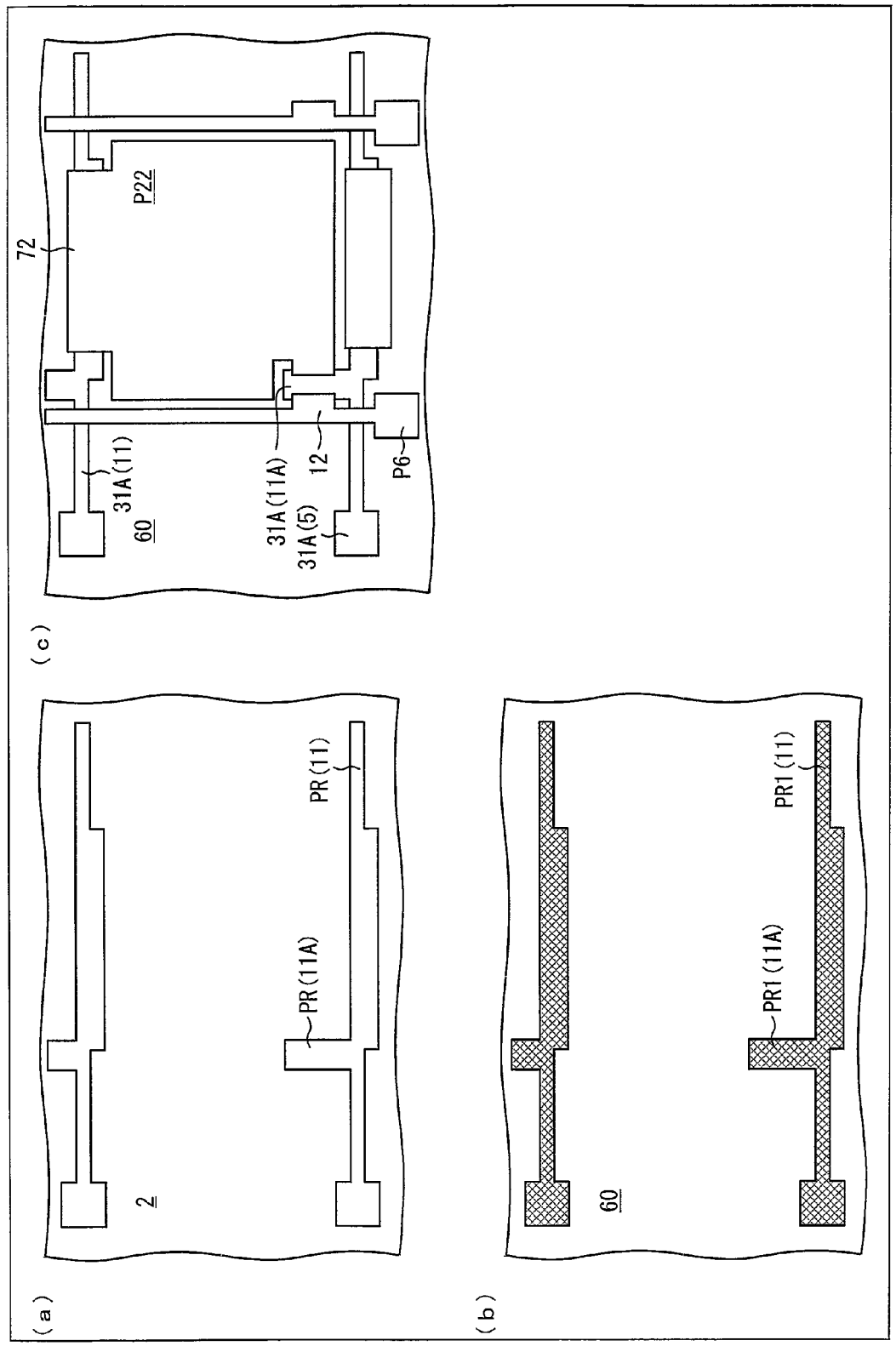
FIG. 3
FIG. 3 shows plan views illustrating a process for manufacturing an active matrix substrate of Embodiment 1.
Figure 4:
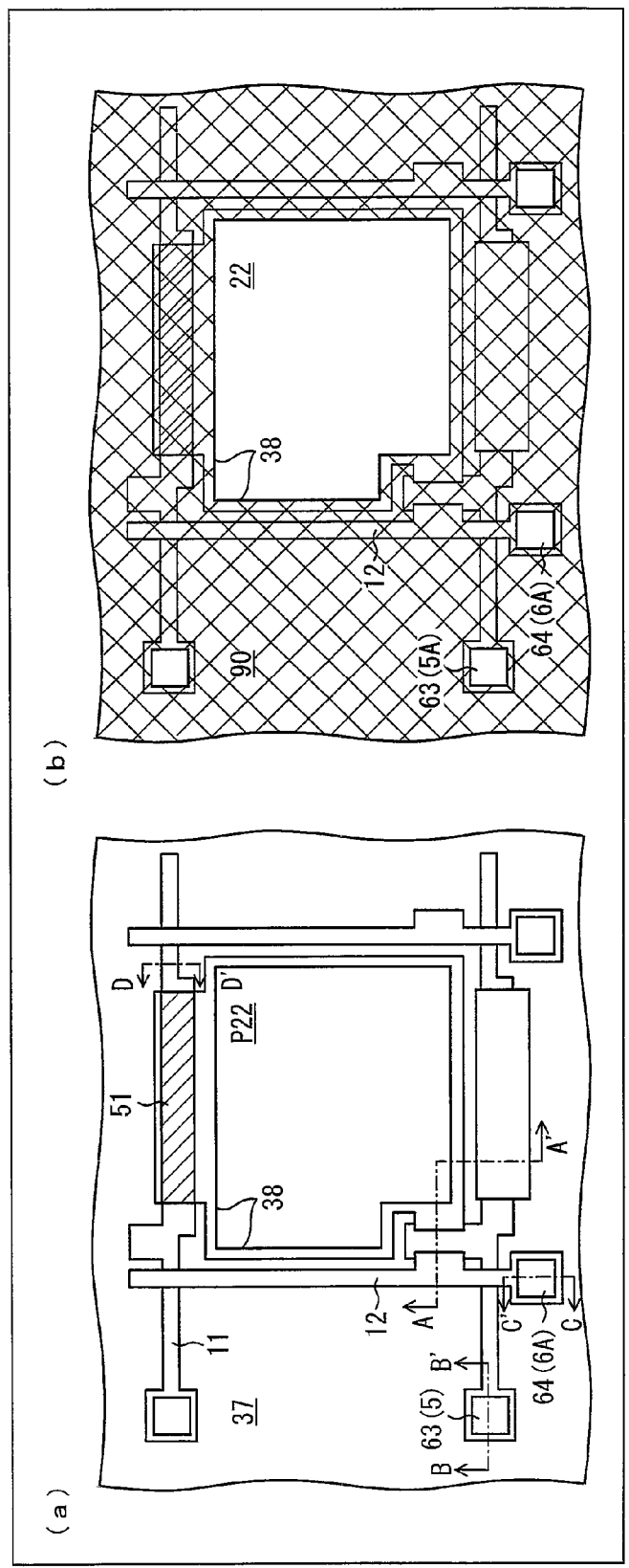
FIG. 4
FIG. 4 shows plan views illustrating a process for manufacturing the active matrix substrate of Embodiment 1. The process shown in FIG. 4 is carried out following the manufacturing process shown in FIG. 3.
Figure 5:
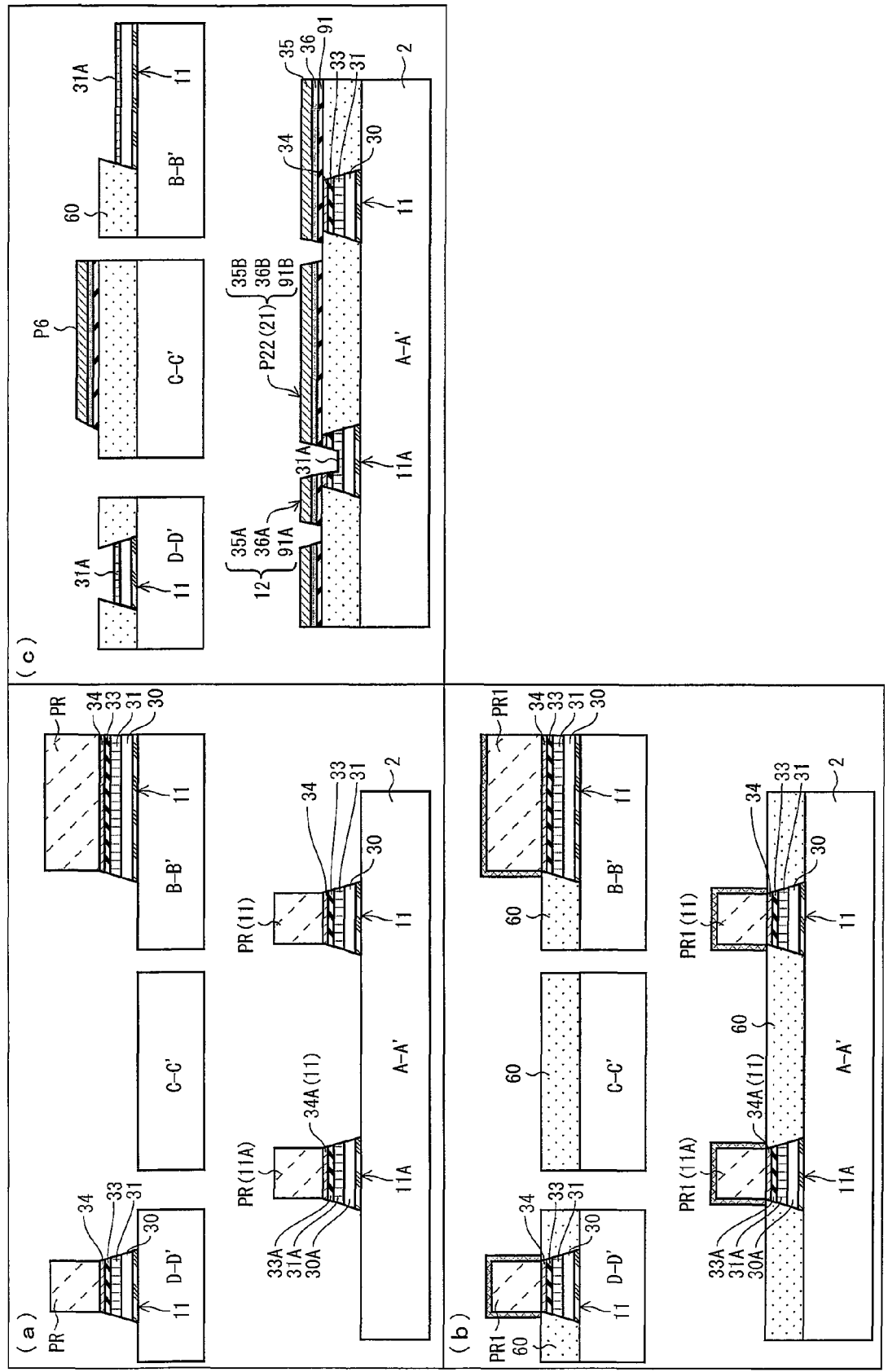
FIG. 5
FIG. 5 shows cross-sectional views illustrating the process shown in FIG. 3 for manufacturing the active matrix substrate. (a) through (c) of FIG. 5 correspond to (a) through (c) of FIG. 3, respectively.
Figure 6:
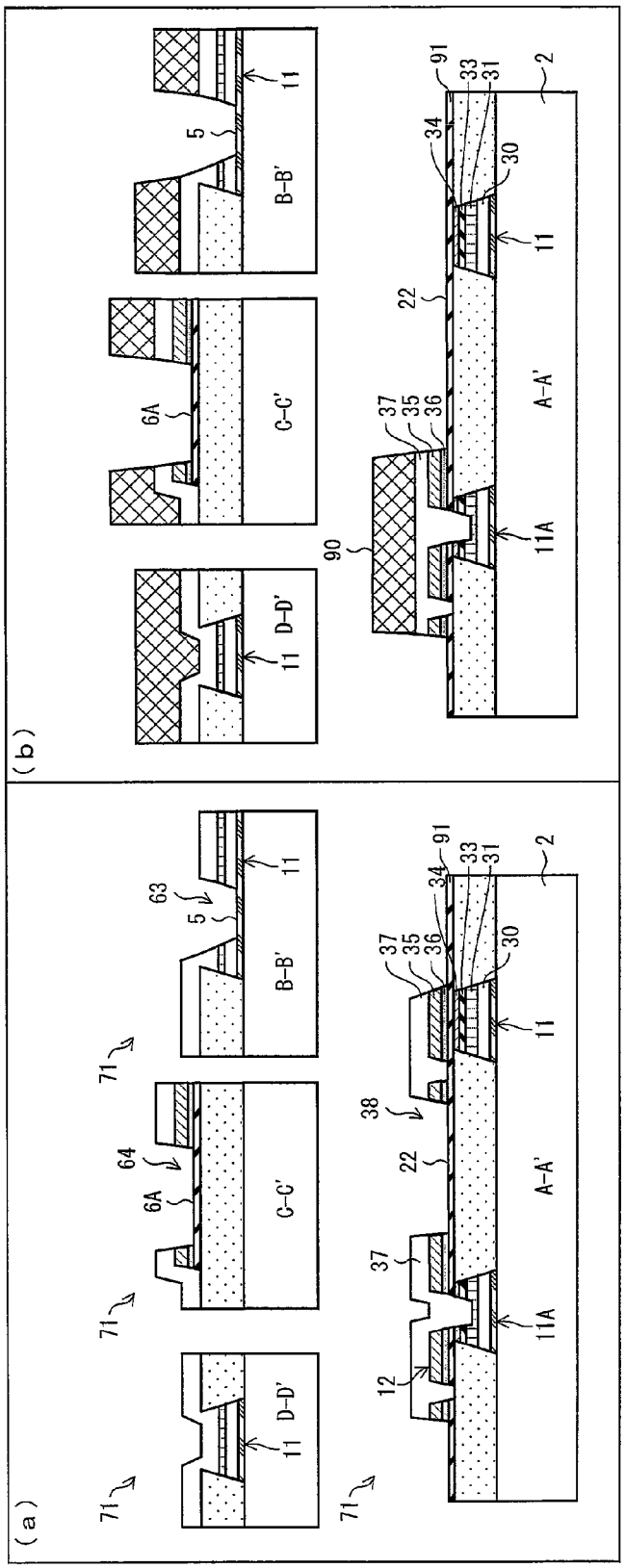
FIG. 6
FIG. 6 shows cross-sectional views illustrating the process shown in FIG. 4 for manufacturing the active matrix substrate. (a) and (b) of FIG. 6 correspond to (a) and (b) of FIG. 4, respectively.

Each of FIGS. 3 and 4 shows plan views of an active matrix substrate 71 (i.e., a semiconductor device for a display device) of Embodiment 1 of the present invention. Each of FIGS. 5 and 6 shows cross-sectional views illustrating respective manufacturing steps, viewed in an A-A' line (i.e., a region of an insulated gate transistor), a B-B' line (i.e., a region of an electrode terminal of a scanning signal line), a C-C' line (i.e., a region of an electrode terminal of a data signal line), and a D-D' line (i.e., a scanning signal line), each of which lines is shown in (a) of FIG. 4. The plan views shown in (a) through (c) of FIG. 3 correspond to the cross-sectional views shown in (a) through (c) of FIG. 5, respectively. The plan views shown in (a) and (b) of FIG. 4 correspond to the cross-sectional views shown in (a) and (b) of FIG. 6, respectively.

Figure 7:
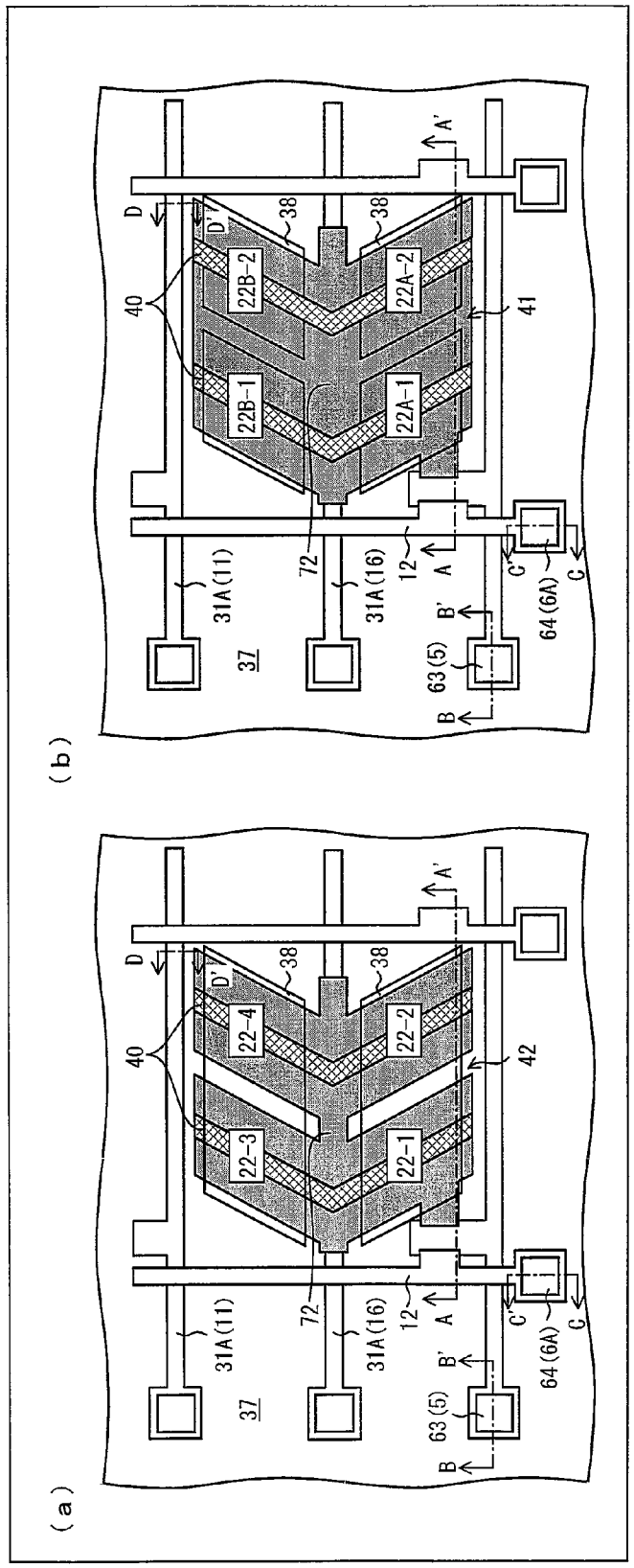
FIG. 7
FIG. 7 shows plan views illustrating a process for manufacturing an active matrix substrate of a modification of Embodiment 1.
Figure 8:
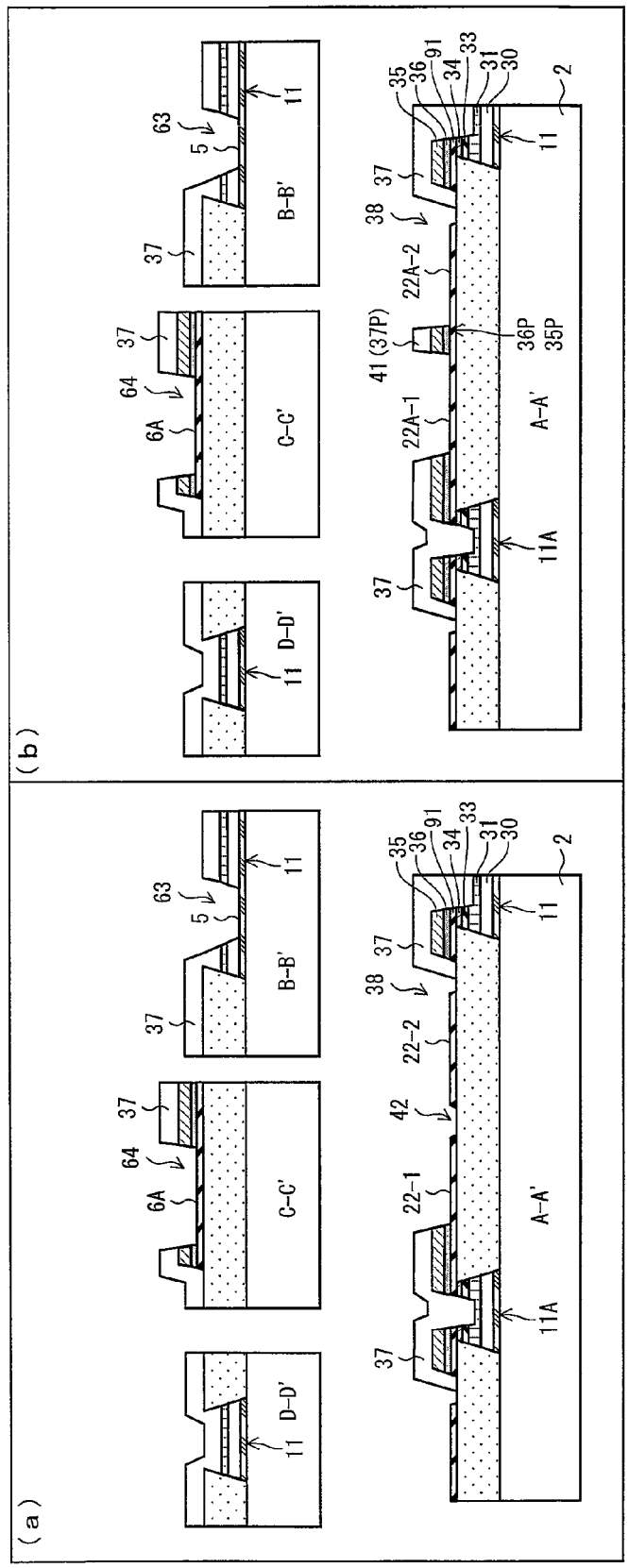
FIG. 8
FIG. 8 shows cross-sectional views illustrating the process shown in FIG. 7 for manufacturing the active matrix substrate. (a) and (b) of FIG. 8 correspond to (a) and (b) of FIG. 7, respectively.
Figure 13:
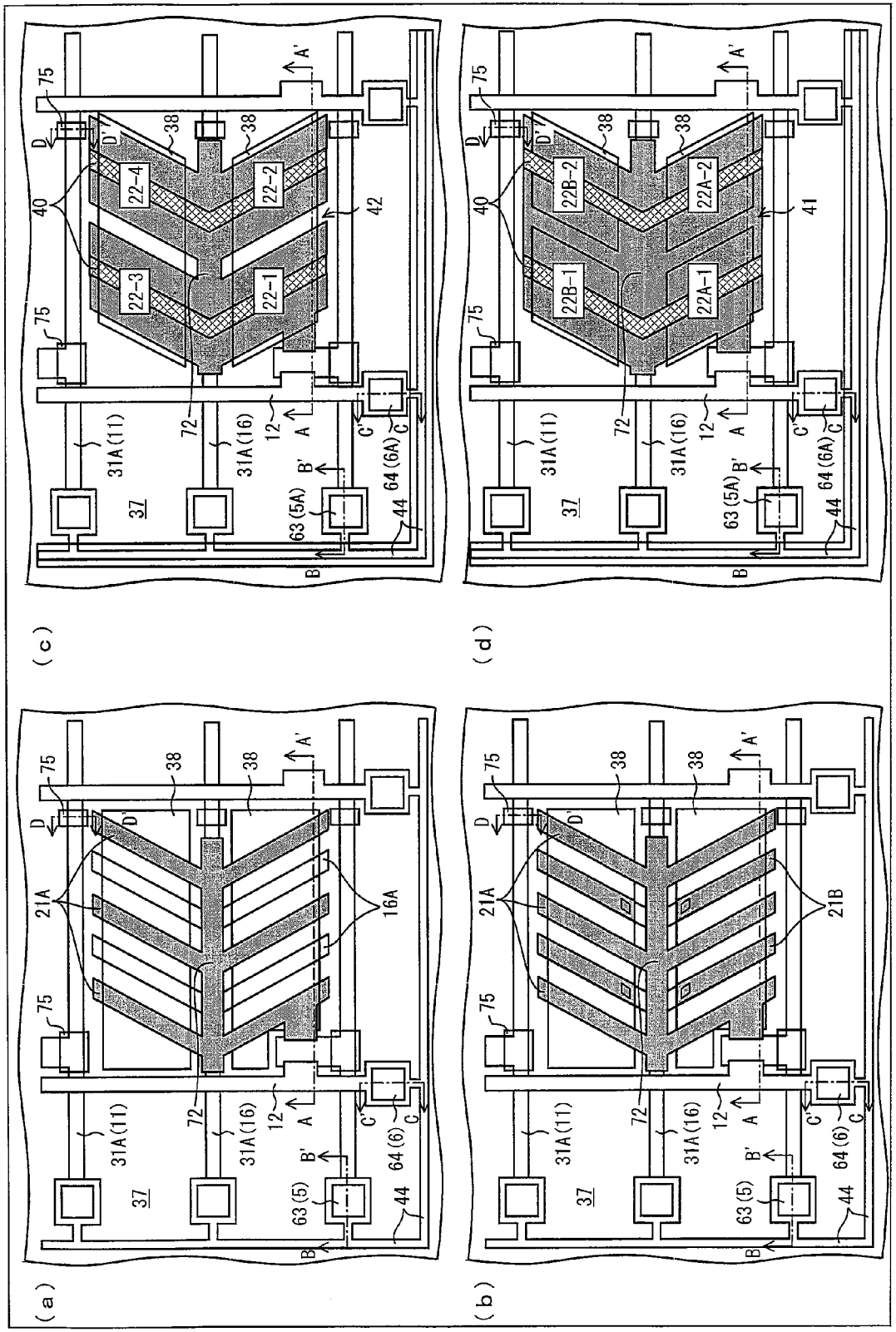
FIG. 13
FIG. 13 shows plan views illustrating a process for manufacturing an active matrix substrate of a modification of Embodiment 2.
Figure 14:
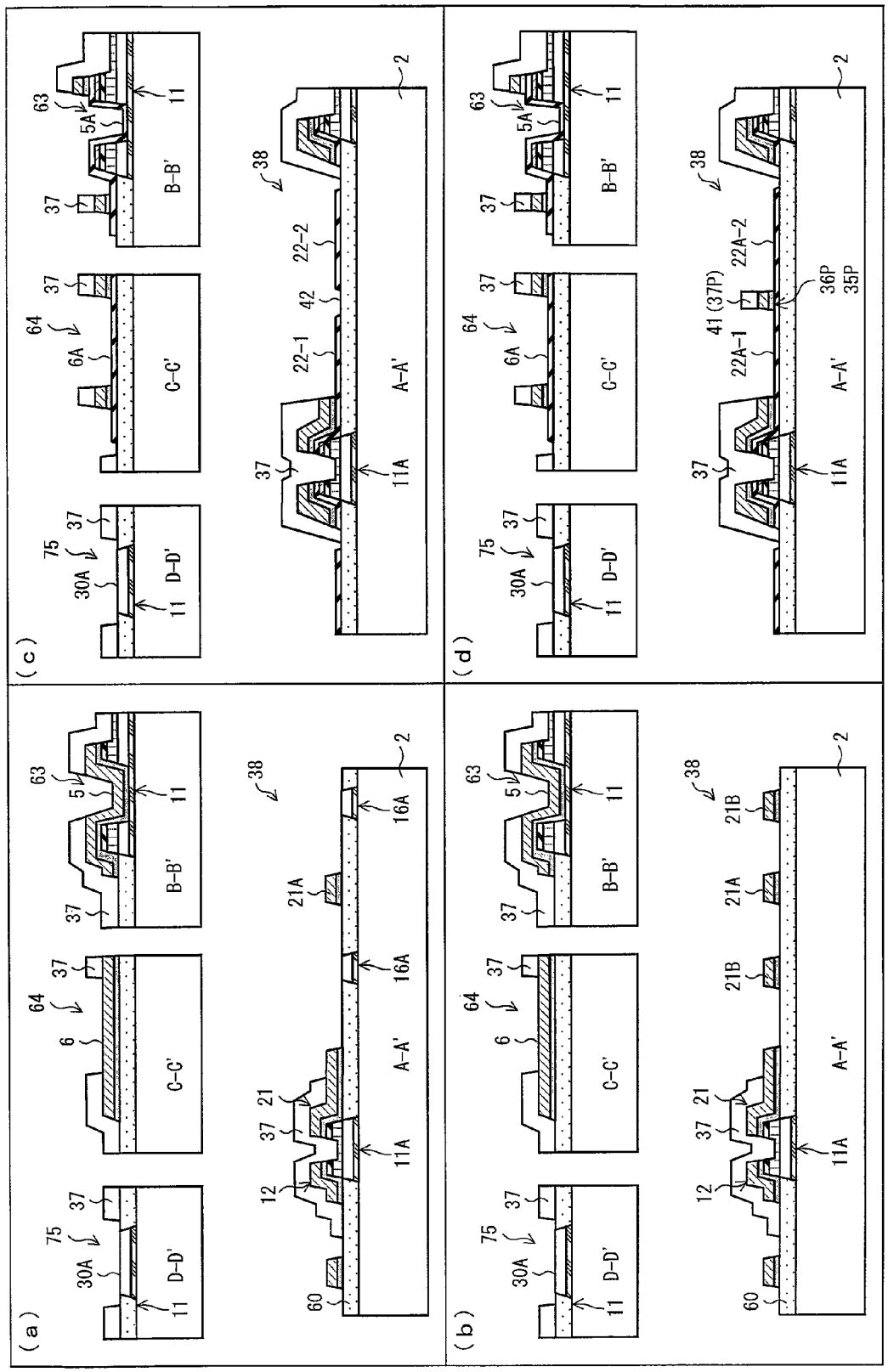
FIG. 14
FIG. 14 shows cross-sectional views illustrating the process shown in FIG. 13 for manufacturing the active matrix substrate. (a) through (d) of FIG. 14 correspond to (a) through (d) of FIG. 13, respectively.
Figure 19:
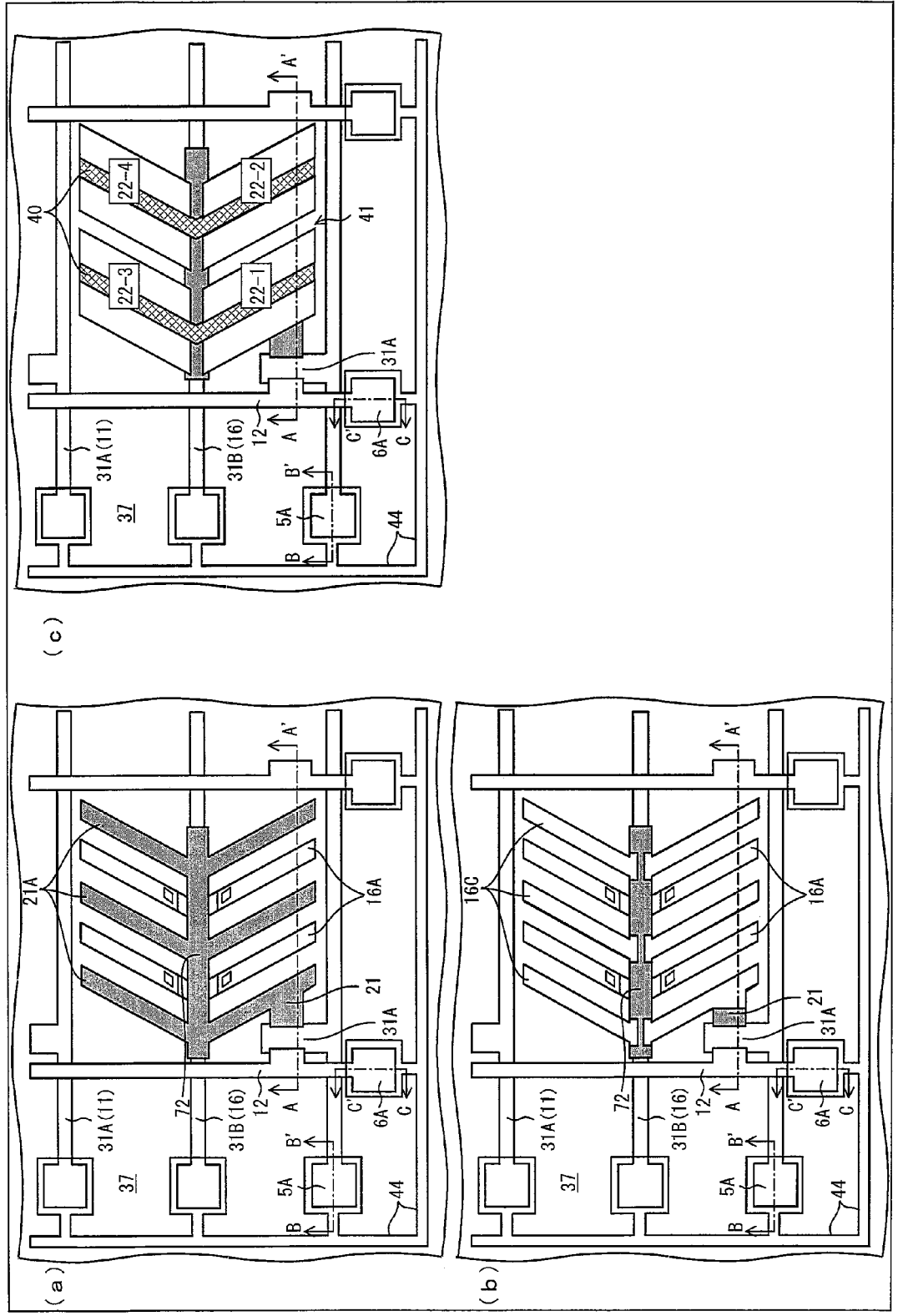
FIG. 19
Figure 20:
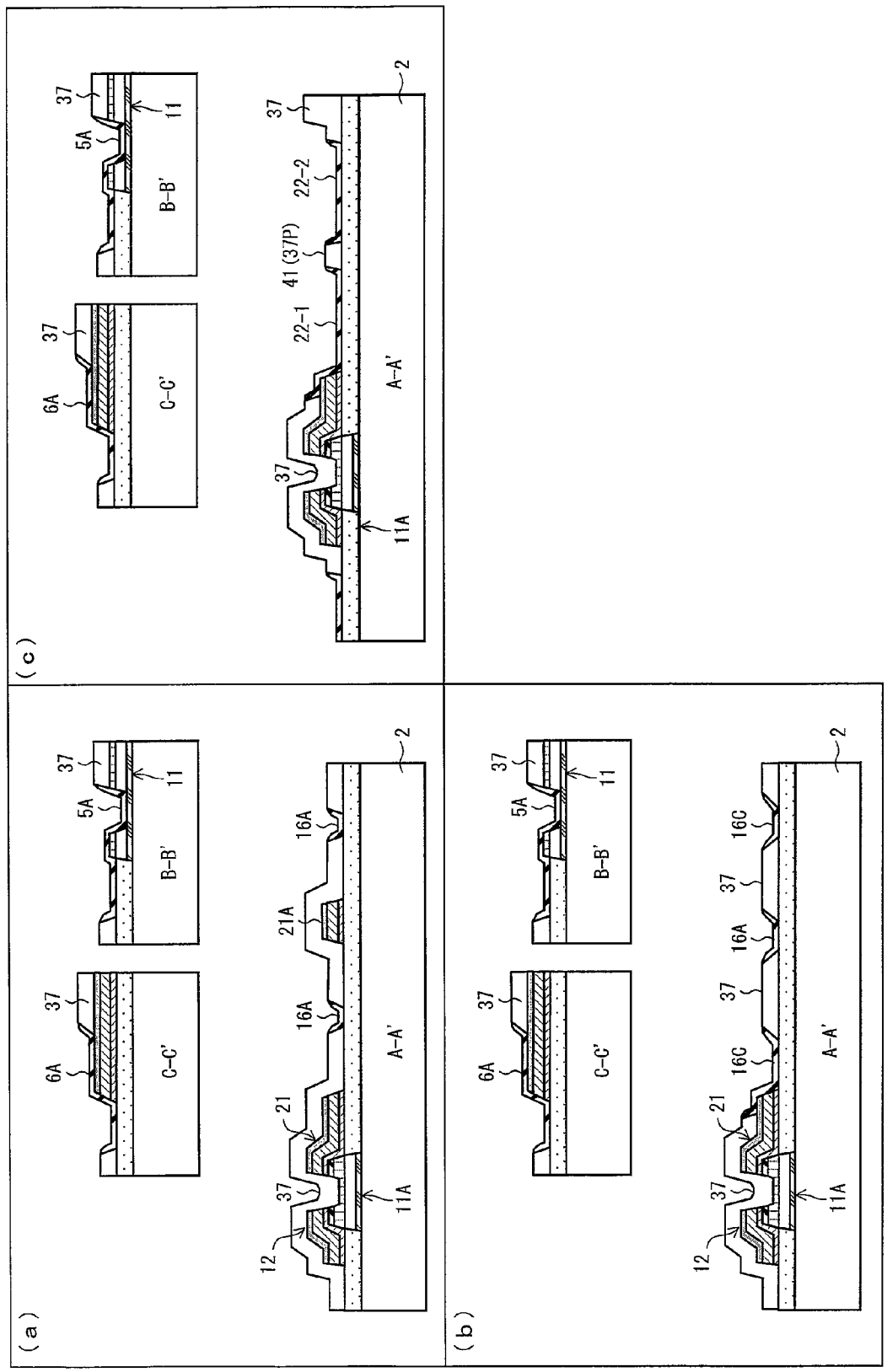
FIG. 20
Figure 24:
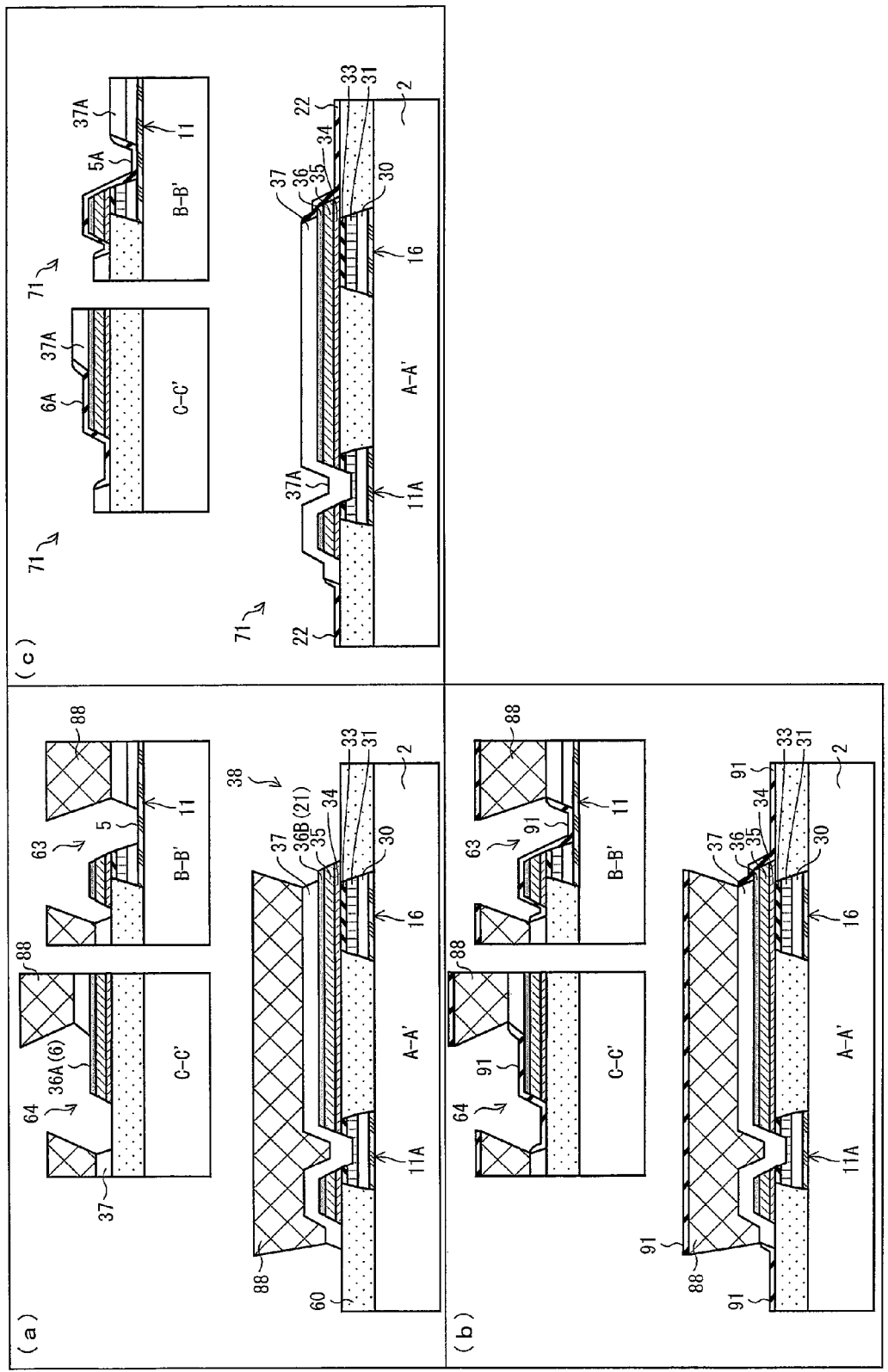
FIG. 24
Figure 25:
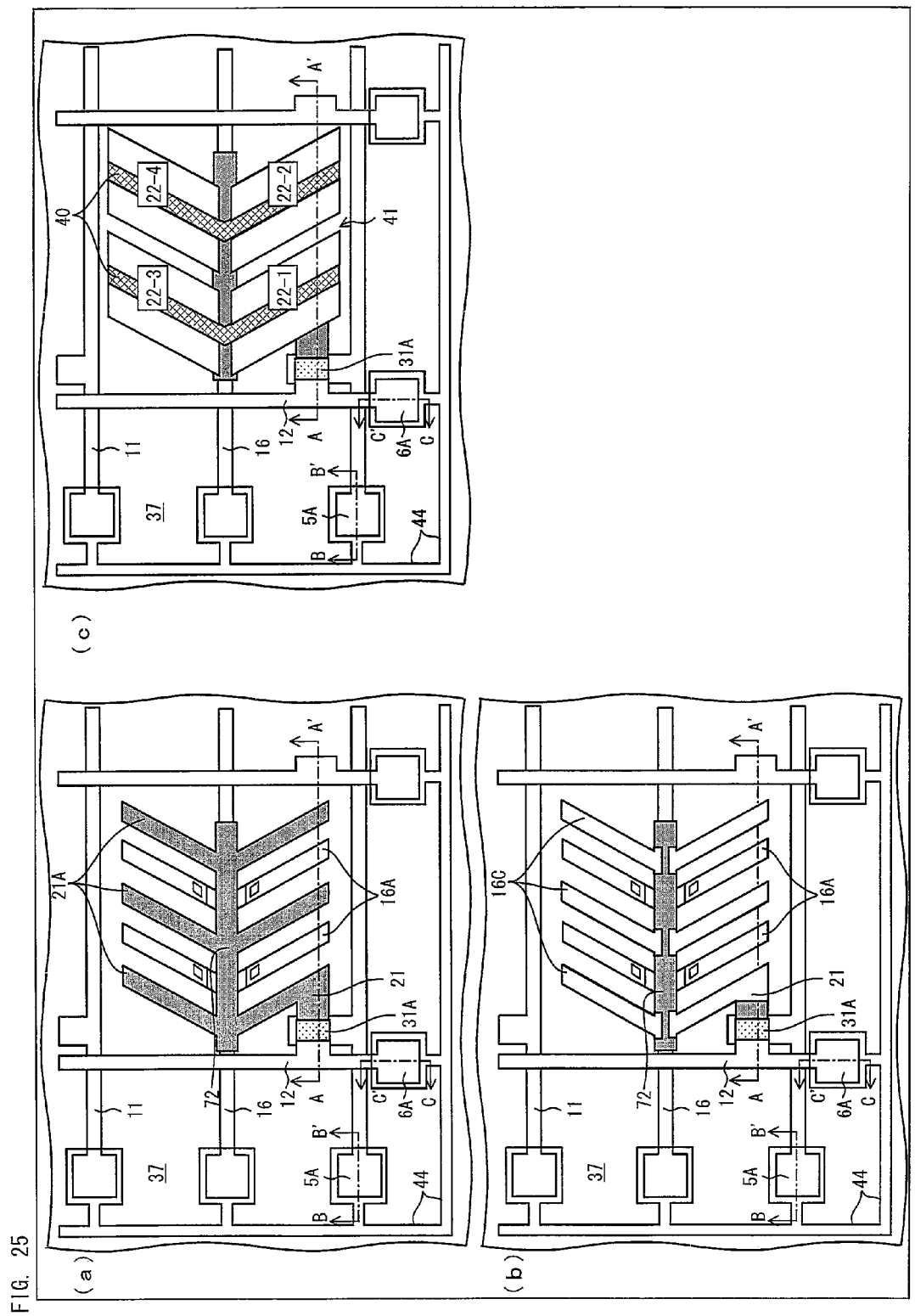
FIG. 25
Figure 26:
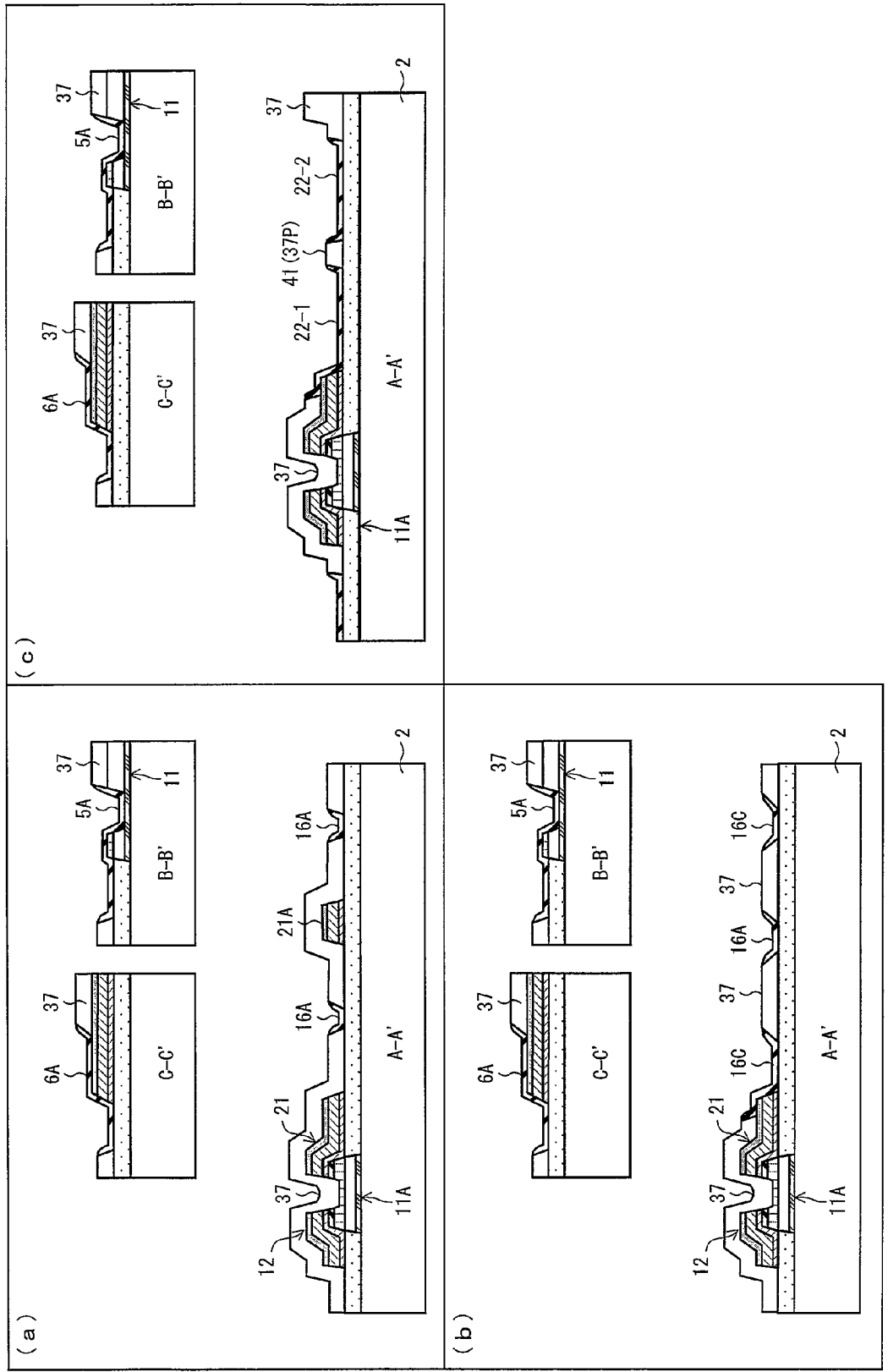
FIG. 26
Figure 30:
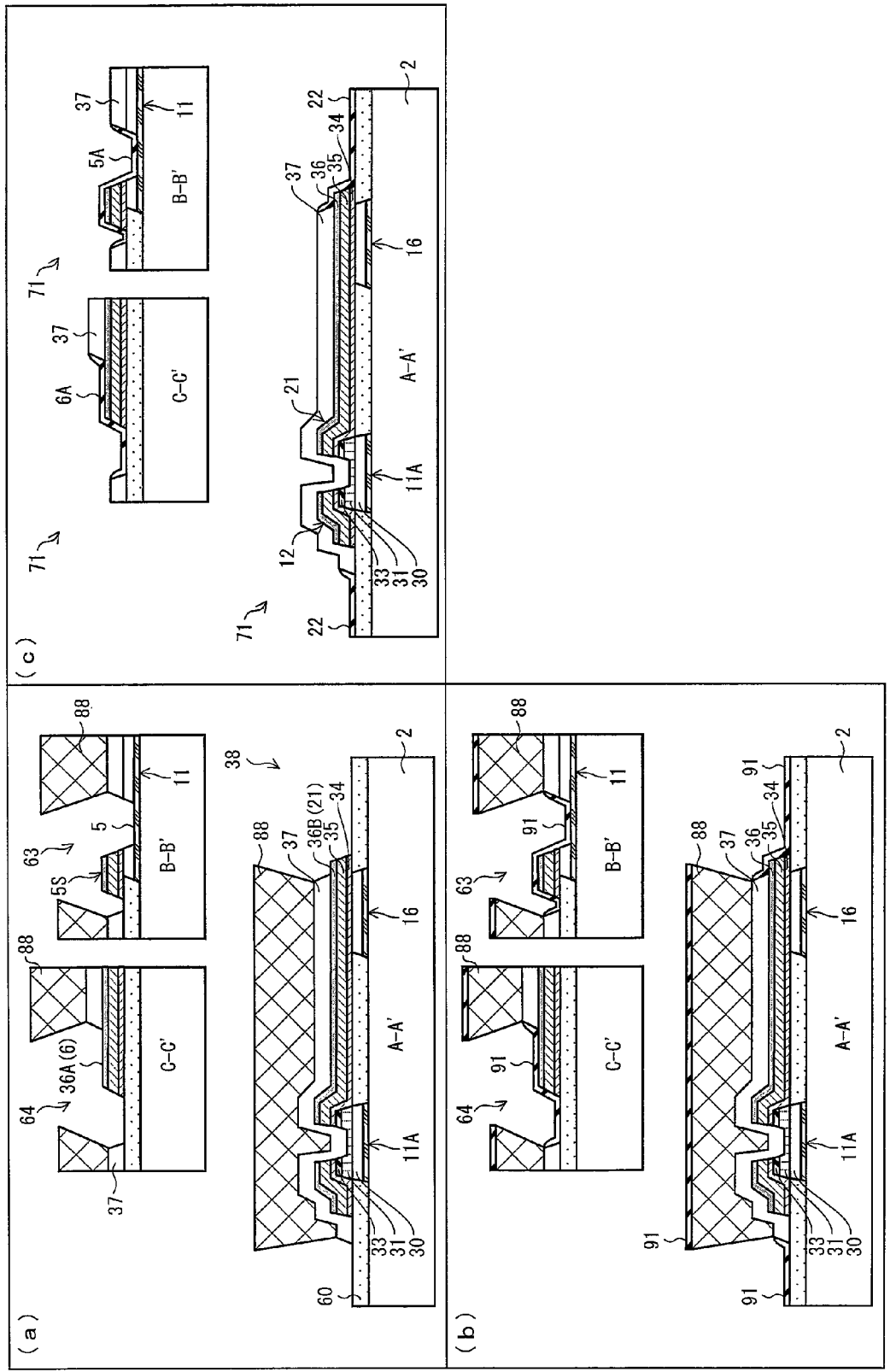
FIG. 30
Figure 31:
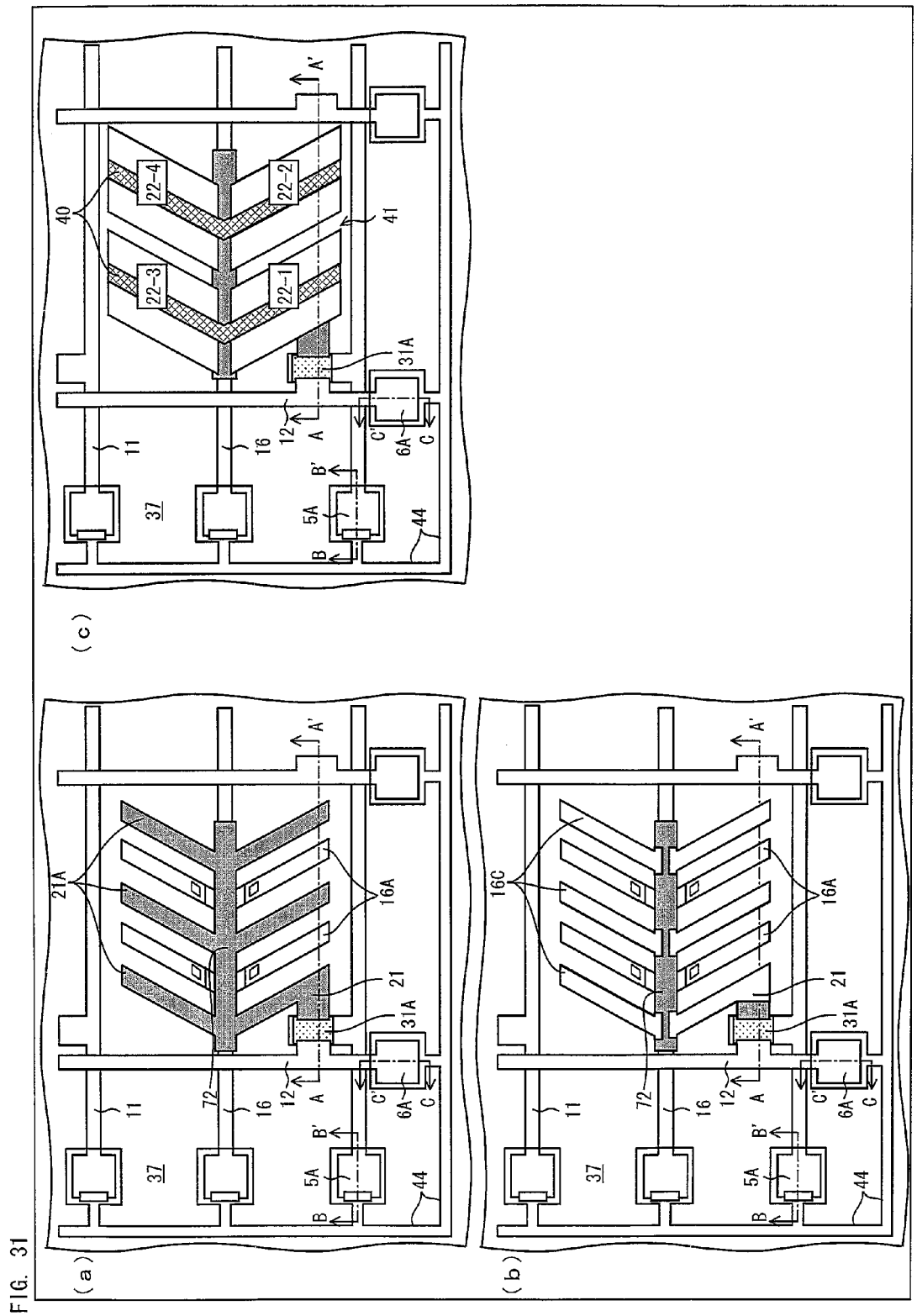
FIG. 31
Figure 32:
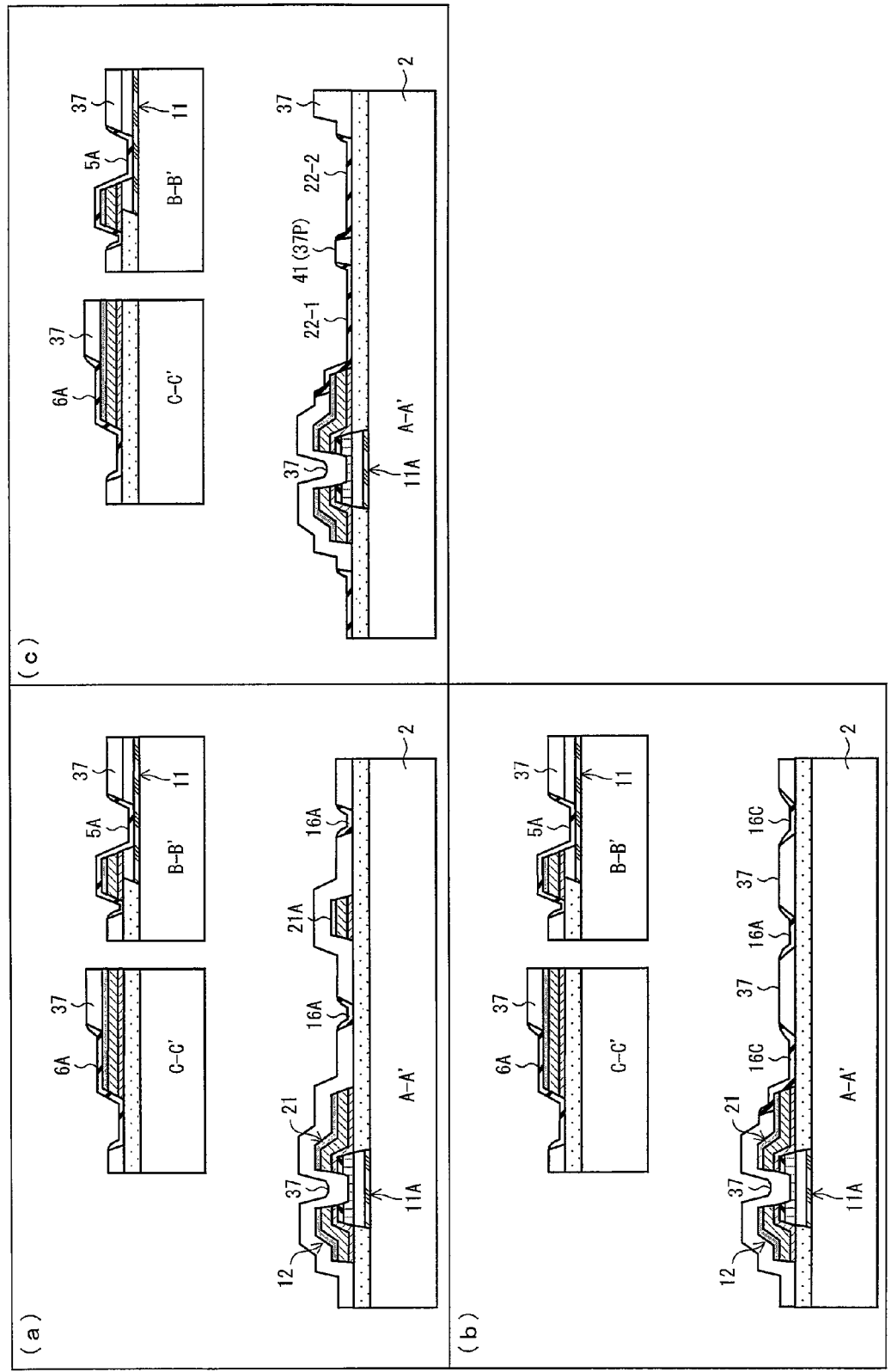
FIG. 32
Figure 33:
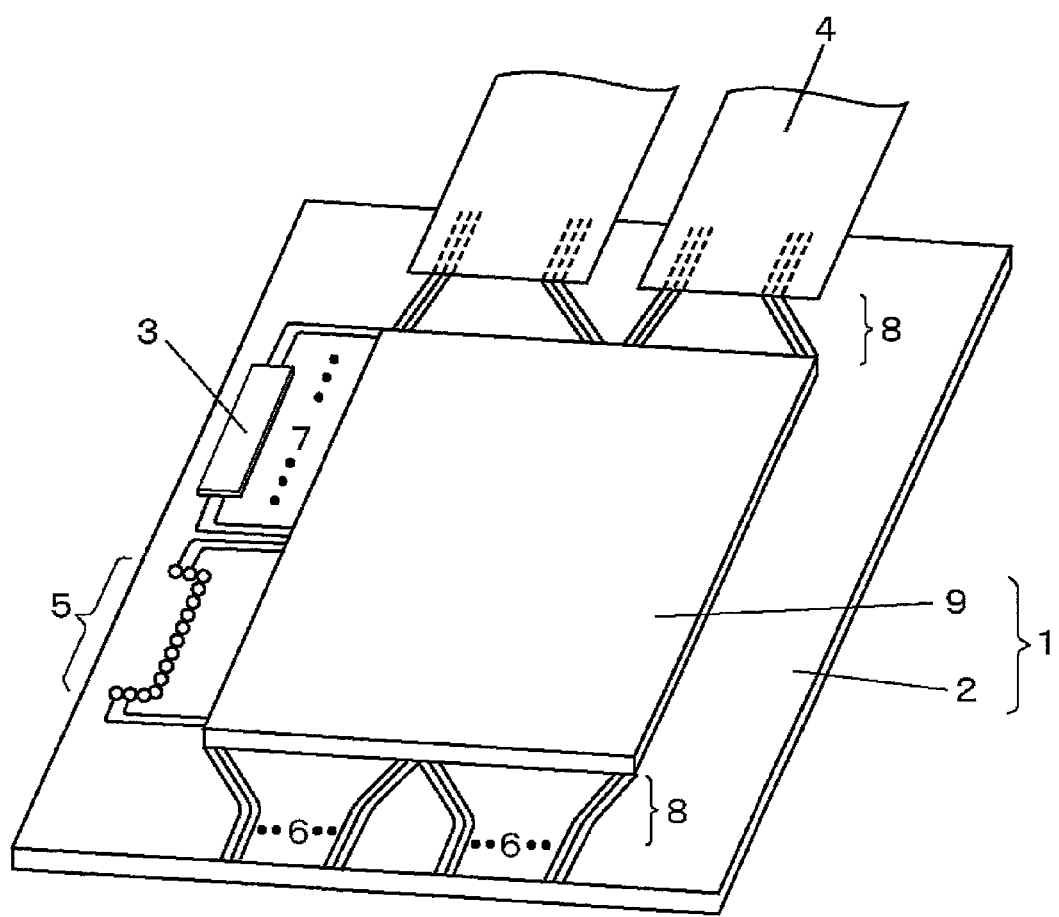
FIG. 33
Figure 34:
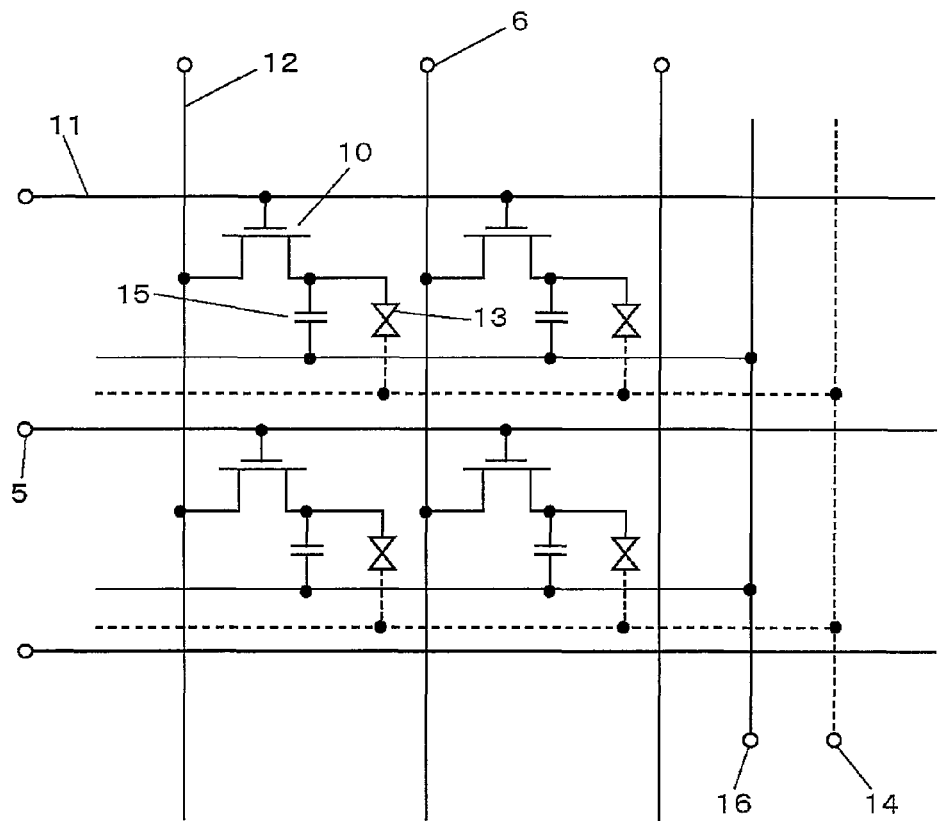
FIG. 34
Figure 35:
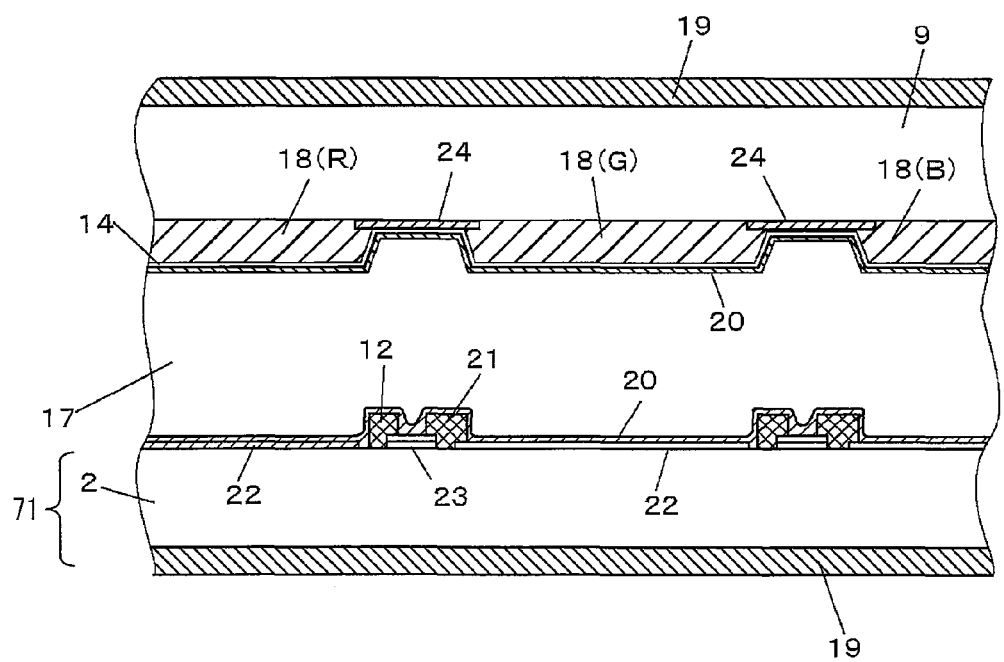
FIG. 35
Figure 36:
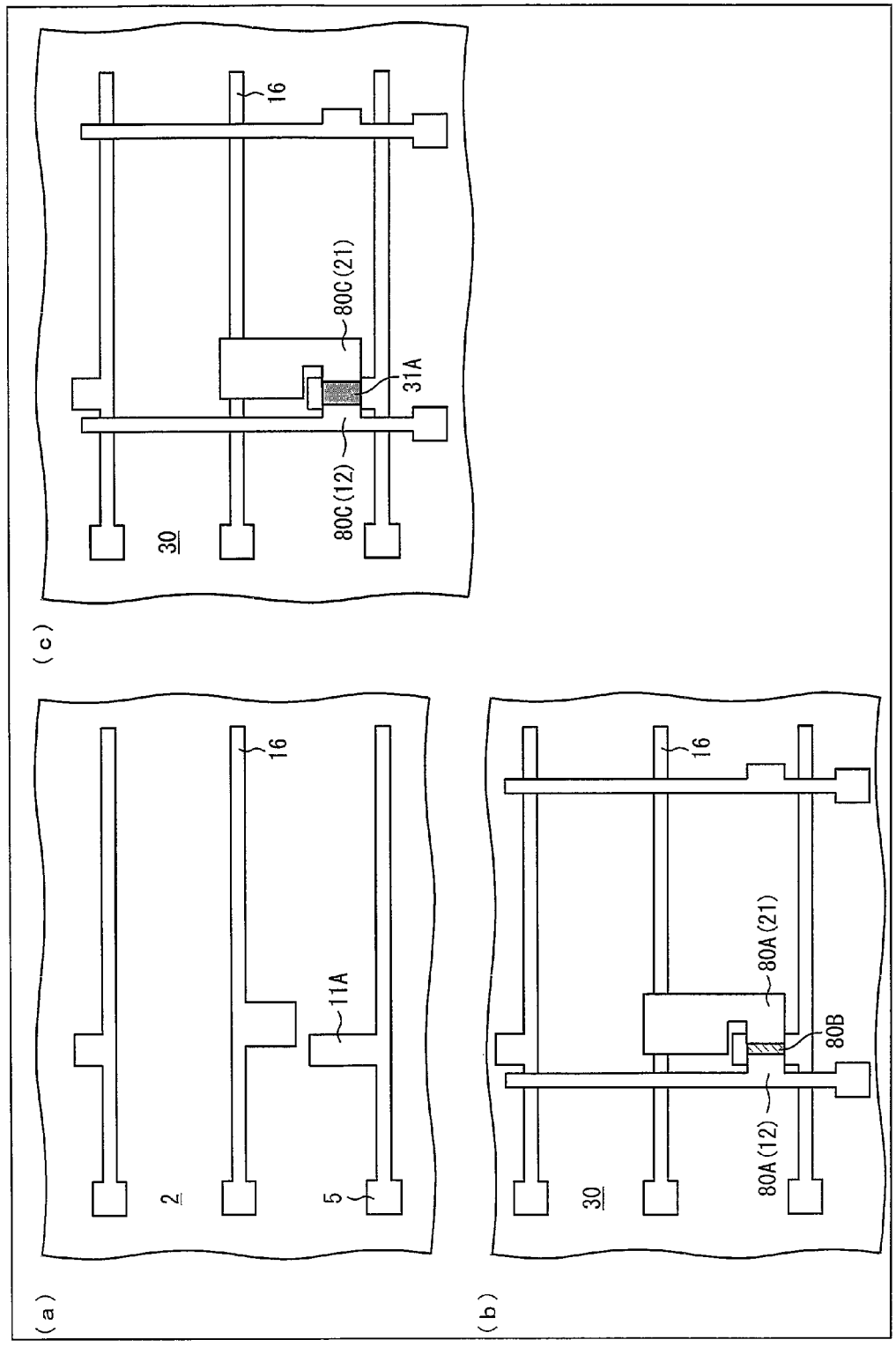
FIG. 36
Figure 37:
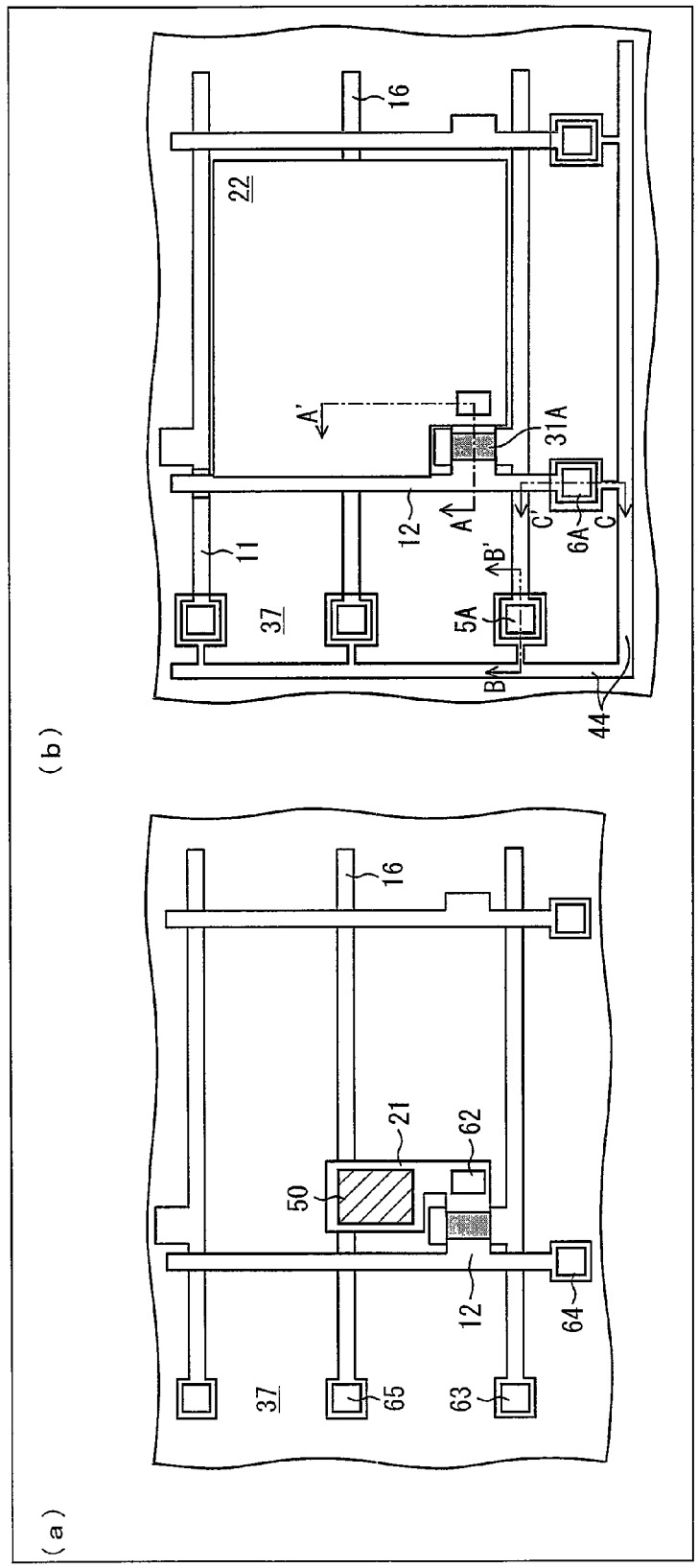
FIG. 37
Figure 38:
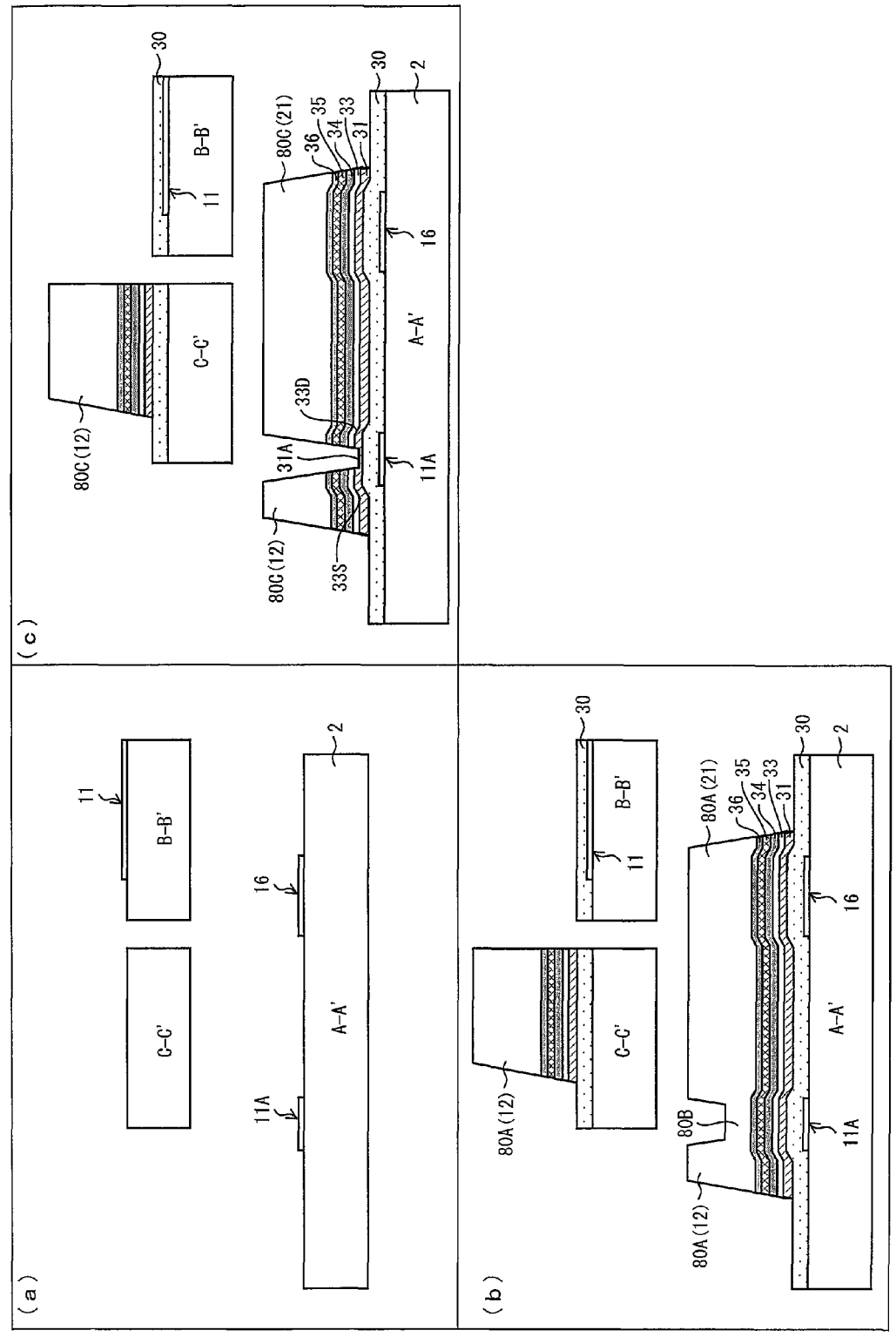
FIG. 38
Figure 39:
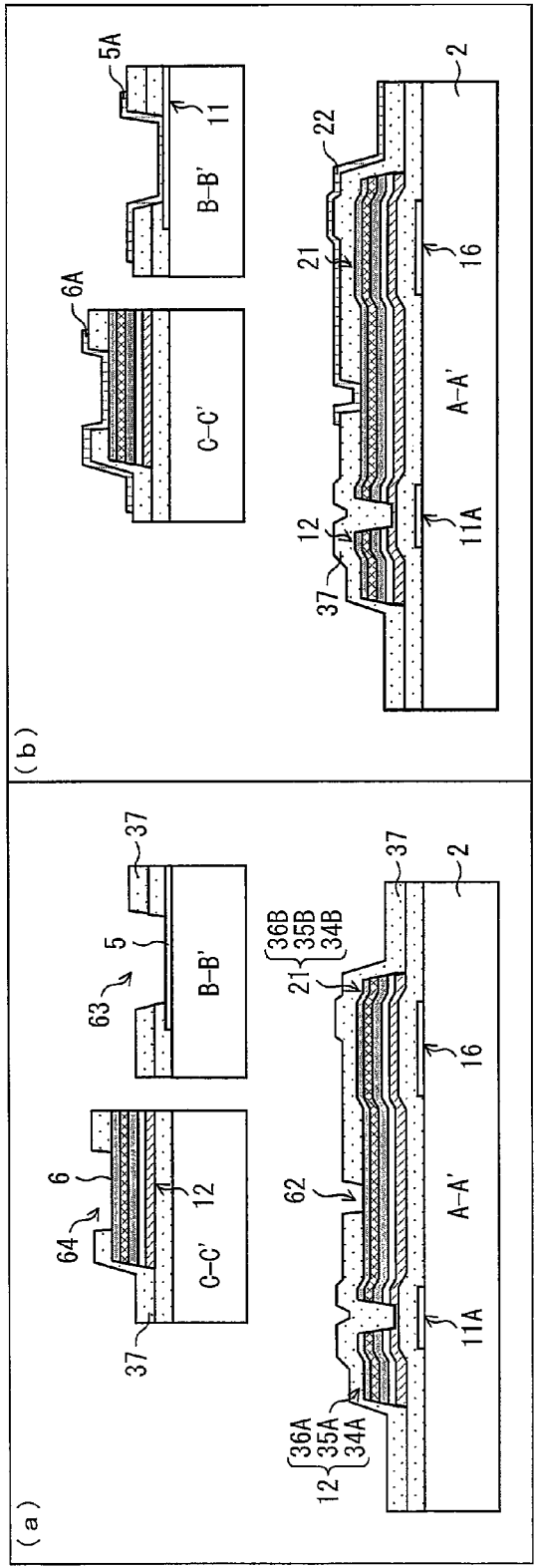
FIG. 39

Similarly, FIGS. 9 through 12 show (i) plan views of an active matrix substrate of Embodiment 2 and (ii) cross-sectional views (illustrating manufacturing steps) thereof; FIGS. 15 through 18 show (i) plan views of an active matrix substrate of Embodiment 3 and (ii) cross-sectional views (illustrating manufacturing steps) thereof; FIGS. 21 through 24 show (i) plan views of an active matrix substrate of Embodiment 4 and (ii) cross-sectional views (illustrating manufacturing steps) thereof; and FIGS. 27 through 30 show (i) plan views of an active matrix substrate of Embodiment 5 and (ii) cross-sectional views (illustrating manufacturing steps) thereof. Further, FIGS. 7 and 8 show (i) plan views of an active matrix substrate of a modification of Embodiment 1 and (ii) cross-sectional views (illustrating manufacturing steps) thereof; FIGS. 13 and 14 show (i) plan views of an active matrix substrate of a modification of Embodiment 2 and (ii) cross-sectional views (illustrating manufacturing steps) thereof; FIGS. 19 and 20 show (i) plan views of an active matrix substrate of a modification of Embodiment 3 and (ii) cross-sectional views (illustrating manufacturing steps) thereof; FIGS. 25 and 26 show (i) plan views of an active matrix substrate of a modification of Embodiment 4 and (ii) cross-sectional views (illustrating manufacturing steps) thereof; and FIGS. 31 and 32 show (i) plan views of an active matrix substrate of a modification of Embodiment 5 and (ii) cross-sectional views (illustrating manufacturing steps) thereof. In the above drawings, the same members as those in the conventional technique shown in FIGS. 33 through 39 are given the same reference numbers, and detailed explanations thereof are omitted here.

The present specification describes streamlining a step of manufacturing a pixel electrode, by (i) an active matrix substrate including a data signal line made of a lamination of a transparent electrically conductive layer and a second metal layer (i.e., a metal layer for a source wire and a drain wire) (Embodiments 1 and 2) and (ii) an active matrix substrate manufactured by forming a pixel electrode by lift-off when forming an opening in a passivation insulative layer (Embodiments 3 through 5).

[Embodiment 1]

The following will describe Embodiment 1 of the present invention with reference to FIGS. 1 through 8.

Figure 1:
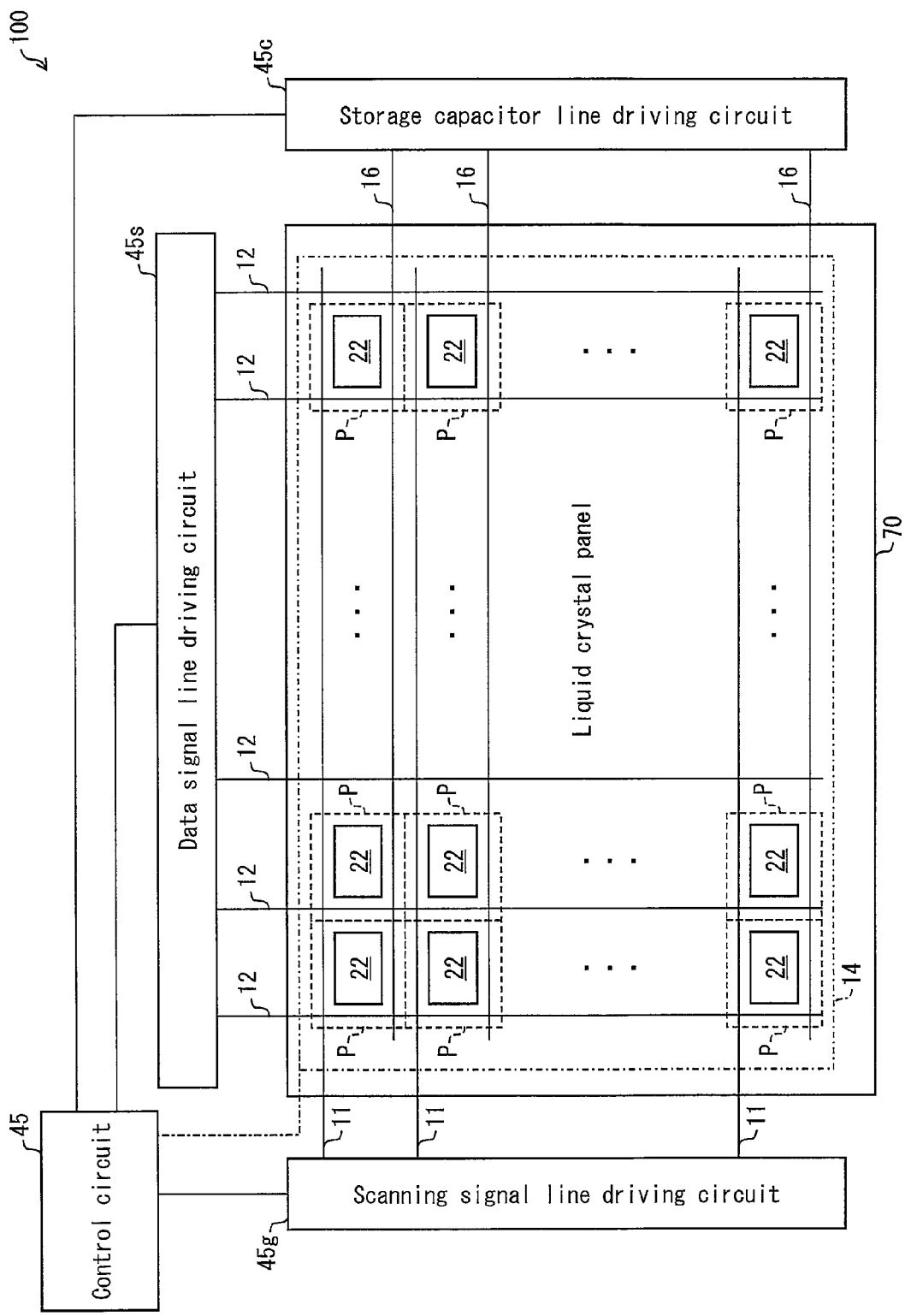
FIG. 1
FIG. 1 is a plan view illustrating an entire configuration of a liquid crystal display device of the present invention.
Figure 2:
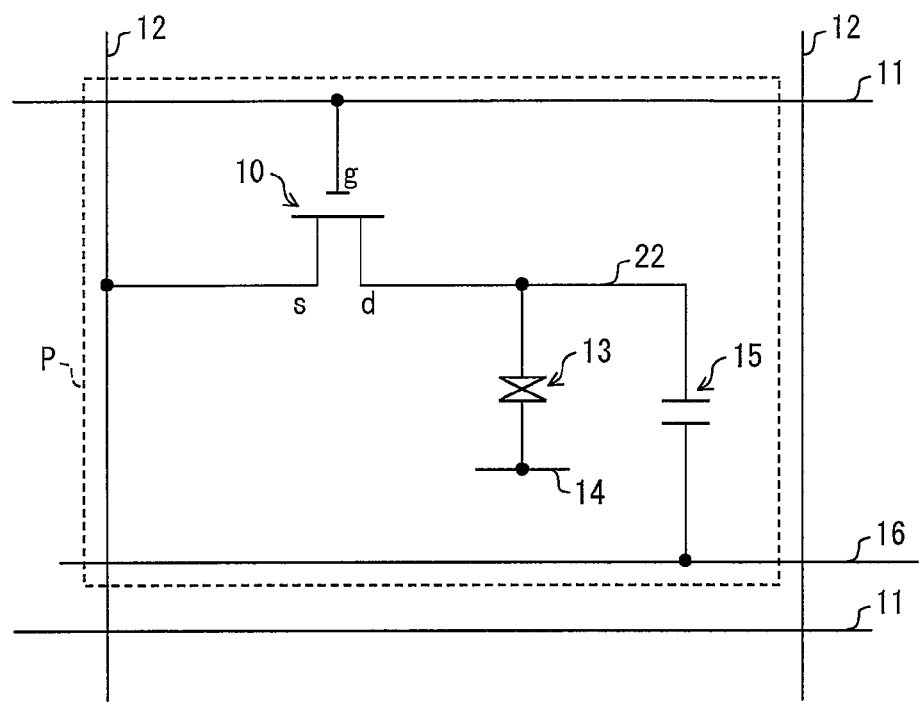
FIG. 2
FIG. 2 is an equivalent circuit diagram illustrating an electrical structure of a pixel included in the liquid crystal display device.

First, with reference to FIGS. 1 and 2, an entire configuration of a liquid crystal display device 100 of the present embodiment will be described. FIG. 1 is a plan view illustrating the entire configuration of the liquid crystal display device 100, whereas FIG. 2 is an equivalent circuit diagram illustrating an electrical configuration of a pixel in the liquid crystal display device 100.

The liquid crystal display device 100 includes an active matrix type liquid crystal panel 70, a data signal line driving circuit 45s, a scanning signal line driving circuit 45g, a storage capacitor line driving circuit 45c, and a control circuit 45.

The liquid crystal panel 70 includes an active matrix substrate 71 (described later), a counter substrate (color filter substrate) 9, and liquid crystal provided between the active matrix substrate 71 and the counter substrate 9. Further, the liquid crystal panel 70 includes a number of pixels P arranged in a matrix.

Further, the liquid crystal panel 70 includes, on the active matrix substrate 71, a data signal line (source wire) 11, a scanning signal line (gate wire) 12, a channel etch type insulated gate transistor (hereinafter, referred to as "transistor") 10, a pixel electrode 22, and a storage capacitor line 16. Furthermore, the liquid crystal panel 70 includes, on the color filter substrate, a common electrode 14. Note that the transistor 10 is illustrated only in FIG. 2, and is not illustrated in FIG. 1.

The data signal lines 12 are arranged in parallel with each other along a column direction (vertical direction), and one data signal line 12 is provided for each respective column. The scanning signal lines 11 are arranged in parallel with each other along a row direction (horizontal direction), and one scanning signal line 11 is provided for each respective row. The transistor 10 and the pixel electrode 22 are provided for an intersection of one of the data signal lines 12 and a corresponding one of the scanning signal lines 11. The transistor 10 has a source electrode s connected with the data signal line 12, a gate electrode g connected with the scanning signal line 11, and a drain electrode d connected with the pixel electrode 22. Further, there provided a liquid crystal capacitor 13 between the pixel electrode 22 and the counter electrode 14 via the liquid crystal.

With the above configuration, a gate signal (scanning signal) supplied to the scanning signal line 11 turns on the gate of the transistor 10, and a source signal (data signal) from the data signal line 12 is written into the pixel electrode 22, so that the pixel electrode 22 is set to have an electric potential according to the source signal. Then, a voltage according to the source signal is applied to the liquid crystal provided between the pixel electrode 22 and the counter electrode 14. This makes it possible to provide a tone display according to the source signal.

The storage capacitor lines 16 are arranged so as to be in parallel with each other along the row direction (horizontal direction), and one storage capacitor line 16 is provided for each respective row and makes a pair with a corresponding one of the scanning signal lines 11. Each of the storage capacitor lines 16 is coupled via a capacitor with a corresponding one of the pixel electrodes 22, which are arranged in the respective rows. A storage capacitor (auxiliary capacitor) 15 is formed between the storage capacitor line 16 and the pixel electrode 22.

The liquid crystal panel 70 configured as above is driven by the data signal line driving circuit 45s, the scanning signal line driving circuit 45g, the storage capacitor line driving circuit 45c, and the control circuit 45. The control circuit 45 controls the data signal line driving circuit 45s, the scanning signal line driving circuit 45g, and the storage capacitor line driving circuit 45c.

In the present embodiment, horizontal scanning periods of the respective rows are one by one sequentially allocated to an active period (effective scanning period) of a vertical scanning period which appears periodically. Thus, the rows are scanned sequentially.

For this purpose, the scanning signal line driving circuit 45g sequentially outputs, to the scanning signal lines 11 of the respective rows, gate signals for turning the transistors 10 on, in such a manner that the gate signals are synchronized with the horizontal scanning periods of the respective rows.

Further, the data signal line driving circuit 45s outputs source signals to the data signal lines 12. The source signals are obtained in the following manner: A video signal is supplied from the outside of the liquid crystal display device 1 to the data signal line driving circuit 45s via the control circuit 45. Then, the video signal is allocated to the columns by the data signal line driving circuit 45s, and is subjected to a process such as boosting.

The storage capacitor line driving circuit 45c outputs CS signals to the storage capacitor lines 16. For example, the CS signal has an electric potential which is switched between two values (i.e., the electric potential which rises or falls), and causes an electric potential of the storage capacitor line 16 of its corresponding row to be switched from one value to the other value, in sync with a timing at which the horizontal scanning period (1H) of the row ends, i.e., at a time point when the transistor of the row is switched from on to off.

The control circuit 45 controls the scanning signal line driving circuit 45g, the data signal line driving circuit 45s, and the storage capacitor line driving circuit 45c so that the scanning signal line driving circuit 45g, the data signal line driving circuit 45s, and the storage capacitor line driving circuit 45c output the gate signal, the source signal, and the CS signal.

Next, with reference to FIGS. 3 through 6, the following will describe a method for manufacturing the above-described liquid crystal panel 70. Particularly, the following will concretely describe a method for manufacturing the active matrix substrate 71 included in the liquid crystal panel 70.

(First Step: Step of Forming Scanning Signal Line and Semiconductor Layer)

In Embodiment 1, first, a first metal layer (i.e., a metal layer for a scanning signal line) having a film thickness of approximately 0.1 μm through approximately 0.3 μm is deposited on one main surface of a glass substrate 2 by use of a vacuum film forming device such as SPT. The first metal layer may be, e.g., a single layer of a metal such as Ti, Ta, Cr, or Mo. In order to reduce a resistance, the first metal layer is desirably formed of Al or a heat resistant Al alloy. Further, in order to prevent Al or the heat resistant Al alloy from working as a battery in an alkaline fluid together with a transparent electrically conductive layer, it is desirable to make the first metal layer of a laminate of Ti/Al/Ti, Mo/Al/Mo, Al(Nd)/Mo, or the like. Here, "Al(Nd)" indicates an Al alloy containing Nd at several percents or less and having high heat resistance. Alternatively, Al(Nd) may be an Al alloy containing Ni, Ta, Hf, or the like, instead of Nd. Further alternatively, in order to reduce a resistance, Cu or a Cu alloy can be used instead of Al.

Next, a PCVD device is used to sequentially deposit, on the entire surface of the glass substrate 2, three types of thin film layers, i.e., (i) a first SiNx layer 30, which becomes a gate insulative layer, (ii) a first amorphous silicon layer (semiconductor layer) 31, which hardly contains an impurity and which becomes a channel of an insulated gate transistor, and (iii) a second amorphous silicon layer (semiconductor layer) 33, which contains an impurity and becomes a source and a drain of the insulated gate transistor, so that the first SiNx layer 30, the first amorphous silicon layer 31, and the second amorphous silicon layer 33 have thicknesses of, e.g., approximately 0.3 μm, approximately 0.2 μm, and approximately 0.05 μm, respectively. Further, a vacuum film forming device such as SPT is used to deposit, e.g., a thin film layer 34 made of Mo, Ti, or the like as a heat resistant metal layer having a film thickness of approximately 0.1 μm.

Then, as shown in (a) of FIG. 3 and (a) of FIG. 5, the heat resistant metal layer 34, the second amorphous silicon layer 33, the first amorphous silicon layer 31, the gate insulative layer 30, and also the first metal layer are selectively removed by a photo-etching technique (photolithography) using, as a photo mask, a photosensitive resin pattern PR (i.e., a first photosensitive resin pattern) which corresponds to a scanning signal line 11. Consequently, the glass substrate 2 is exposed.

This selective removal is carried out as follows: In a case where the heat resistant metal layer 34 is made of Mo (Ti), the heat resistant metal layer 34 is removed by dry etching using a fluorine (chlorine) gas, and the second amorphous silicon layer 33, the first amorphous silicon layer 31, and the gate insulative layer 30 are removed by dry etching using a fluorine gas. In a case where the first metal layer is made of Mo, Ti, or Ta, the first metal layer is also removed by dry etching. Alternatively, in a case where the first metal layer is made of Cr, the first metal layer is removed by use of a dedicated etching solution. Further alternatively, in a case where the first metal layer is made of a lamination of Mo/Al/Mo, Al(Nd)/Mo, or the like, the first metal layer is removed by wet etching using a mixed acid containing phosphoric acid and several percents of nitric acid.

Thus, a multiple-layer film pattern (a pattern of a laminated structure) including a heat resistant metal layer 34A, a second amorphous silicon layer 33A, a first amorphous silicon layer 31A, a gate insulative layer 30A, and the scanning signal line 11 is obtained. Thereafter, the entire surface of the glass substrate 2 is subjected to a plasma process with a Freon gas, e.g., CF$_4$. Since the glass substrate 2 is inorganic, the surface of the glass substrate 2 is hardly fluorinated. On the other hand, since the photosensitive resin pattern PR is an organic resin, a surface of the photosensitive resin pattern PR is easily fluorinated and consequently becomes a photosensitive resin pattern PR1 (see (b) of FIG. 5). Fluorination of the surface is possible as long as the surface has a depth of 100 Å or more.

Next, as shown in (b) of FIG. 3 and (b) of FIG. 5, a coating type transparent insulative resin is applied onto the glass substrate 2. Here, applied as the coating type transparent insulative resin is (i) a transparent resin (transparent inorganic insulative resin) which is inorganic and is prepared by dissolving oxide silicon fine powder and a binder in a solvent or (ii) a transparent resin having high heat resistance and high transparency (e.g., acrylic resin). Since the photosensitive resin pattern PR1, which has been fluorinated, has water repellency, the transparent insulative resin is repelled by the photosensitive resin pattern PR1, so that the transparent insulative resin is applied in a self-aligned manner onto a region excluding the photosensitive resin pattern PR1. If a photosensitive resin without water repellency is used, it is impossible to selectively fill the transparent insulative resin. In this embodiment, the transparent insulative resin is applied so as to have substantially the same film thickness as that of the multiple-layer film pattern.

After filling a space in the multiple-layer film pattern with the transparent insulative resin 60, a solvent contained in the transparent insulative resin 60 is heated and evaporated, in order to prevent the solvent from hindering removal using a resist removing solution. Thereafter, a polymer is removed from the fluorinated surface by ashing means such as oxygen plasma, and the photosensitive resin pattern PR1 is removed by use of the resist removing solution. In a case where the transparent insulative resin 60 is an acrylic resin, a film thickness of the transparent insulative resin 60 is reduced by 100 Å or more by the oxygen plasma process. However, since the film thickness of the transparent insulative resin 60 is typically greater than 0.5 μm, the reduction of film thickness hardly gives an effect. Further, a heating process is carried out at a temperature as high as possible (typically, at approximately 250° C.) in a range in which film qualities of the amorphous silicon layers 31A and 33A are not deteriorated. Consequently, the transparent insulative layer 60 attains improved film quality and higher drug resistance.

(Second Step: Step of Forming Source Wire and Drain Wire)

Subsequently, a step of forming a source wire and a drain wire is carried out. In this step, on the entire surface of the glass substrate 2, a transparent electrically conductive layer 91 having a film thickness of approximately 0.1 μm and a second metal layer (i.e., a metal layer for a source wire and a drain wire) 35 are deposited by use of a vacuum film forming device such as SPT. Thereafter, by a microfabrication technology using a photosensitive resin pattern (i.e., a second photosensitive resin pattern), the second metal layer 35, the transparent electrically conductive layer 91, the heat resistant metal layer 34A, and the second amorphous silicon layer 33A are etched and partially removed, and the first amorphous silicon layer 31A is left to have a thickness of approximately 0.05 μm through 0.1 μm. This selectively forms, as shown in (c) of FIG. 3 and (c) of FIG. 5, a data signal line 12, a pseudo electrode terminal P6, and a drain electrode 21 of an insulated gate transistor. The data signal line 12, which serves also as a source wire, is made of the lamination of the transparent electrically conductive layer 91A and the second metal layer 35A formed so as to partially overlap the gate electrode 11. The pseudo electrode terminal P6 is a part of the data signal line 12. The drain electrode 21, which serves also as a pseudo pixel electrode P22, is made of the lamination of the transparent electrically conductive layer 91B and the second metal layer 35B similarly formed so as to partially overlap the gate electrode 11.

In order to reduce a resistance of the data signal line, typically used as the second metal layer 35 is Al. However, a laminated structure of Al and a transparent electrically conductive layer results in a battery reaction in an alkaline developer or an alkaline resist removing solution, so that the transparent electrically conductive layer disappears. In order to avoid this, Mo, serving as a buffer metal layer, should be provided between Al and the transparent electrically conductive layer. In a case where a resistance of the data signal line may not be strictly limited, it is desirable to use a heat resistant metal such as Ti, Cr, or Mo as the second metal layer, in order to simplify the configuration of the data signal line.

Use of Al can prevent an increase in a resistance of wiring of a liquid crystal display device having a large screen. Also for this reason, Al is often used for the second metal layer 35. Therefore, selected as the second metal layer is, for example, a laminated structure of (i) Mo having a film thickness of approximately 0.1 μm, serving as a buffer metal layer 36 having a film thickness of approximately 0.1 μm, and (ii) an Al thin film layer 35, serving as a low resistance metal layer having a film thickness of approximately 0.3 μm. However, a recent Al alloy (e.g., the one to which Ni, La, or the like is added) increases the possibility of forming the second metal layer of a single layer.

From the viewpoints of (i) causing an etched part to have a tapered-shape cross section and (ii) reducing the number of manufacturing steps, it is desirable to etch, by use of the mixed acid, the transparent electrically conductive layer 91 following the second metal layer 35 (and the buffer metal layer 36). However, in this case, in order to prevent the transparent electrically conductive layer 91 from disappearing in a step of exposing a pixel electrode (described later), the transparent electrically conductive layer 91 must have resistance against the mixed acid so that the transparent electrically conductive layer 91 is not etched by the mixed acid. This problem can be avoided by use of a transparent electrically conductive layer having a film state which is changed by a heating process at approximately 250° C. This heating process is carried out in a step of depositing a passivation insulative layer, which step follows the step of forming the source wire and the drain wire.

One of the examples of the transparent electrically conductive layer 91 having such the properties is ITZO (Indium-Tin-Zinc-Oxide), whose crystallization temperature is as low as 200° C. Now, an ITZO film which is formed by using a sputtering target having an ITZ composition ratio of 85:10:5 is taken as an example. Such the ITZO film has a film state that changes from amorphous to microcrystalline when the ITZO film is subjected to a heating process at 250° C., at which a SiNx film, serving as the passivation insulative layer, is formed. Thus, the ITZO film is such an extremely unique material that has resistance against the mixed acid used in the step of exposing the pixel electrode.

Accordingly, in a case of using the ITZO film formed by using the sputtering target having an ITZ composition ratio of 85:10:5, etching the second metal layer 35 (and the buffer metal layer 36) with the mixed acid results in etching of the transparent electrically conductive layer 91, which is carried out concurrently with the etching of the second metal layer 35 (and the buffer metal layer 36). Thus, it is possible to reduce the number of manufacturing steps.

(Third Step: Step of Forming Opening in Passivation Insulative Layer)

After the source wire 12 and the drain wire 21 are formed, a second SiNx layer having a film thickness of approximately 0.3 μm is deposited on the entire surface of the glass substrate 2 as a transparent insulative layer by a PCVD device. Thus, a passivation insulative layer 37 is formed. Thereafter, as shown in (a) of FIG. 4 and (a) of FIG. 6, by use of a photosensitive resin pattern (i.e., a third photosensitive resin pattern), (i) an opening 38 (i.e., a first opening) is formed above the pseudo pixel electrode P22, (ii) an opening 63 (i.e., a second opening) is formed above the electrode terminal 5 of the scanning signal line, and (iii) an opening 64 (i.e., a third opening) is formed above the pseudo electrode terminal P6. First, parts of the passivation insulative layer 37 which parts correspond to the openings are removed, so that the pseudo pixel electrode P22, the first amorphous silicon layer 31A, and the pseudo electrode terminal P6 are exposed. Subsequently, parts of the second metal layer 35 (and the buffer metal layer 36) which parts correspond to the openings 38 and 64 are selectively removed, so as to expose a most part of the transparent electrically conductive pixel electrode 22 and a most part of the electrode terminal 6A, which is transparent and electrically conductive.

As described above, the ITZO film having an ITZ composition ratio of 85:10:5 obtains crystalline properties when subjected to the heating process in the step of forming the passivation insulative layer. Therefore, the pixel electrode 22 and the electrode terminal 6A would not be thinned or disappear, even if the second metal layer 35 (and the buffer metal layer 36) is removed by use of the mixed acid. Lastly, parts of the first amorphous silicon layer 31A and the gate insulative layer 30A which parts correspond to the opening 63 are removed, so as to expose a most part of the electrode terminal 5 of the scanning signal line. Here, the parts of the first amorphous silicon layer 31A and the gate insulative layer 30A are removed by dry etching with a fluorine gas. However, the pixel electrode 22 and the electrode terminal 6A, each of which is made of the ITZO film, also have resistance thereagainst, and therefore would not be thinned or disappear.

The active matrix substrate 71 obtained in this manner and a color filter substrate 9 (counter substrate) are bonded to each other, so that a liquid crystal panel is obtained. Thus, the manufacturing process of Embodiment 1 is completed. As for a configuration of a storage capacitor 15, the following pattern design is shown as an example: As shown in (a) of FIG. 4 and (a) of FIG. 6, the storage capacitor 15 is configured by a region 51 (a region hatched with lines sloping from left to right) where a part 72 of the pseudo pixel electrode P22 and a former scanning signal line 11 overlap each other via the heat resistant metal layer 34A, the second amorphous silicon layer 33A, the first amorphous silicon layer 31A, and the gate insulative layer 30A, when seen in a plan view.

As described above, Embodiment 1 involves (i) the step of forming the scanning signal line and the semiconductor layer, (ii) the step of forming the source wire, the drain wire, and the pseudo pixel electrode, and (iii) the step of forming the openings in the passivation insulative layer, thereby making it possible to provide the active matrix substrate 71 by use of three photo masks, without use of a halftone exposure technique. However, since the final photo-etching step is the step of forming the openings in the passivation insulative layer, there is no means for connecting (i) the electrode terminal 5 of the scanning signal line with (ii) the electrode terminal 6A of the data signal line by a suitable electrically conductive material. Therefore, it is impossible to provide any measure against static electricity. Accordingly, careful handling is necessary in a panel assembling step and a test step, which are carried out after the active matrix substrate is completed.

Further, in forming the openings in the passivation insulative layer, a black pigment-dispersed photosensitive resin 90 may be used instead of a generally-used photosensitive resin. In this case, as shown in (b) of FIG. 4 and (b) of FIG. 6, after the pixel electrode P22, the electrode terminal 5 of the scanning signal line, and the electrode terminal 6A of the data signal line are respectively exposed in the openings 38, 63, and 64, the active matrix substrate 71 may be completed without removing the black pigment photosensitive resin 90. This allows the black pigment photosensitive resin 90 to serve as BM (black matrix), thereby making it possible to further reduce the manufacturing cost of the liquid crystal panel.

(Modification of Embodiment 1)

The active matrix substrate of Embodiment 1, which is manufactured in the streamlined manner, employs TN liquid crystal. By modifying the shape of the pixel electrode, the present invention is also effective in vertical alignment liquid crystal, which provides a wide viewing angle. This will be described below as a part of Embodiment 1.

Alignment regulation means which can be formed in an active matrix substrate 71 included in a vertical alignment liquid crystal panel is a slit provided in a pixel electrode or a projection provided on the pixel electrode. Now, this basic configuration is applied to the active matrix substrate 71 of Embodiment 1. Then, as shown in (a) of FIG. 7 and (a) of FIG. 8, pixel electrodes 22-1 though 22-4, which are transparent and electrically conductive and are shaped in a plurality of stripes, are connected with a drain electrode 21 via a storage electrode 72. Further, in order to provide multi domain, the pixel electrode 22-1 and the pixel electrode 22-3 are formed so that they are substantially orthogonal to each other, and the pixel electrode 22-2 and the pixel electrode 22-4 are formed so that they are substantially orthogonal to each other. There exist (i) a space 42 between the pixel electrode 22-1 and the pixel electrode 22-2 and (ii) a space 42 between the pixel electrode 22-3 and the pixel electrode 22-4, the spaces 42 each serving as a slit (cut line).

Also in this modification, 72 denotes the storage electrode, which is formed concurrently with formation of a source wire 12 and a drain wire 21. The storage electrode 72 and a storage capacitor line 16 overlap each other via an insulative layer including a gate insulative layer 30B, so as to form a storage capacitor 15. In many cases, projections 40, each of which has a cross section shaped in a half-barrel and is made of a photosensitive resin, are provided on corresponding regions of a counter electrode 14, which is transparent and electrically conductive. The regions of the counter electrode 14 on which the projections 40 are provided correspond to substantially center regions of the respective pixel electrodes 22-1 through 22-4, which are divided into stripes. The counter electrode 14 is formed on one main surface of a color filter substrate 9, which main surface faces the active matrix substrate 71. As a result, when a voltage is applied to liquid crystal cells, liquid crystal molecules are oriented in four directions, so that multi domain is provided. Consequently, a viewing angle is increased. Instead of the projection 40, the slit (cut line) may be provided by partially removing the counter electrode 14, although this involves a reduced alignment regulation force.

In (i) the slit 42 formed in the space between the pixel electrode 22-1 and the pixel electrode 22-2 and (ii) the slit 42 formed in the space between the pixel electrode 22-3 and the pixel electrode 22-4, more horizontal components in a line of electric force are generated than in the pixel electrodes 22-1 through 22-4. The horizontal components determine an alignment direction of the vertical alignment liquid crystal molecules. However, if no voltage is applied to the liquid crystal, no line of electric force would be generated. Therefore, an alignment regulation force of the slit is smaller than that of the projection.

It is also possible to provide a vertical alignment liquid crystal panel having a different configuration, i.e., a vertical alignment liquid crystal panel including a projection as alignment regulation means instead of a slit. In this case, as shown in (b) of FIG. 7 and (b) of FIG. 8, two pixel electrodes 22A and 22B, which are transparent and electrically conductive, are connected with a drain electrode 21 via a storage electrode 72 so that the pixel electrodes 22A and 22B are substantially orthogonal to each other. Further, on a substantially center region of each of the pixel electrodes 22A and 22B, there provided a laminated pattern, which is made of a lamination of a passivation insulative layer 37P and a second metal layer (i.e., a buffer metal layer 36P and a low resistant metal layer 35P). This laminated pattern serves as a projection 41.

Also in this modification, 72 denotes a storage electrode, which is formed concurrently with formation of a source wire 12 and a drain wire 21. The storage electrode 72 and a storage capacitor line 16 overlap each other via an insulative layer including a gate insulative layer 30B, so as to form a storage capacitor 15. In many cases, projections 40, each of which has a cross section shaped in a half-barrel and is made of a photosensitive resin, are provided on corresponding regions of a counter electrode 14, which is transparent and electrically conductive. The regions of the counter electrode 14 on which the projections are provided correspond to substantially center regions of the respective two pixel electrodes 22A and 22b. The counter electrode 14 is formed on a color filter substrate 9, which faces the active matrix substrate 71. Further, in order to provide multi domain, pixel electrodes 22A-1 and 22B-1, which are divided by a respective projection 41 on the pixel electrode, are substantially orthogonal to each other, and pixel electrodes 22A-2 and 22B-2, which are divided by a respective projection 41 on the pixel electrode, are substantially orthogonal to each other. As a result, when a voltage is applied to liquid crystal cells, liquid crystal molecules are oriented in four directions, so that multi domain is provided. Consequently, a wider viewing angle is achieved.

With the projections 41 each made of the lamination of the passivation insulative layer 37P and the second metal layer (i.e., the buffer metal layer 36P and the low resistant metal layer 35P), vertical alignment liquid crystal molecules are aligned vertically along side surfaces of the projections 41. Therefore, as the side surface becomes longer, i.e., as the bank-like structure becomes higher, or as the slope of the bank-like structure becomes gentler, the regulation force of the liquid crystal molecules becomes greater. Since the passivation insulative layer 37P typically has a film thickness of 0.3 μm, a high regulating force cannot be expected. However, as compared with the vertical alignment liquid crystal panel including the pixel electrode provided with the slits, the vertical alignment liquid crystal panel with the above projections 41 has a slightly improved liquid crystal response speed, and accordingly has an increased liquid crystal response speed.

[Embodiment 2]

The above-described active matrix substrate of Embodiment 1 cannot include a measure against static electricity. Not only this, the active matrix substrate of Embodiment 1 cannot completely prevent a crosstalk between the data signal lines, since the first amorphous silicon layer 31A, having a reduced film thickness, exists on the scanning signal line 11 via the gate insulative layer 30A. On this account, with the active matrix substrate of Embodiment 1, improvement of the quality of a display image has a limit. In view of this, Embodiment 2 employs a halftone exposure technique in order to solve these problems. This will be described as follows:

A liquid crystal display device 100 of Embodiment 2 has the same configuration as that of the liquid crystal display device 100 of Embodiment 1, which has been described with reference to FIGS. 1 and 2. Therefore, explanations of the liquid crystal display device 100 of Embodiment 2 are omitted here.

The following will describe, with reference to FIGS. 9 through 12, a method for manufacturing a liquid crystal panel 70 of Embodiment 2. Particularly, the following will concretely describe a method for manufacturing an active matrix substrate 71 included in the liquid crystal panel 70.

(First Step: Step of Forming Scanning Signal Line and Semiconductor Layer)

In Embodiment 2, as well as in Embodiment 1, first, a first metal layer (i.e., a metal layer for a scanning signal line) having a film thickness of approximately 0.1 μm through approximately 0.3 μm is deposited on one main surface of a glass substrate 2. Subsequently, three types of thin film layers, i.e., (i) a first SiNx layer 30, which becomes a gate insulative layer, (ii) a first amorphous silicon layer 31, which hardly contains an impurity and which becomes a channel of an insulated gate transistor, and (iii) a second amorphous silicon layer 33, which contains an impurity and becomes a source and a drain of the insulated gate transistor, are sequentially deposited thereon so that the first SiNx layer 30, the first amorphous silicon layer 31, and the second amorphous silicon layer 33 have film thicknesses of, e.g., approximately 0.3 μm, approximately 0.2 μm, and approximately 0.05 μm, respectively. Further, a vacuum film forming device such as SPT is used to deposit, e.g., a thin film layer 34 made of Mo, Ti, or the like as a heat resistant metal layer having a film thickness of approximately 0.1 μm.

Then, as indicated in Patent Literature 5, by means of a halftone exposure technique, photosensitive resin patterns 83A and 83B (i.e., a first photosensitive resin pattern) are formed on the heat resistant metal layer 34 such that (i) the pattern 83A, corresponding to a scanning signal line 11, has a film thickness of, e.g., 2 μm and (ii) the pattern 83B, corresponding to a connection region 5 of the scanning signal line which region 5 is located outside an image display section (i.e., a region of the scanning signal line in which region the scanning signal line and another wire provided outside the image display section are connected with each other), has a film thickness of, e.g., 1 μm. Thereafter, as shown in (a) of FIG. 9 and (a) of FIG. 11, by use of the photosensitive resin patterns 83A and 83B as a photo mask, the heat resistant metal layer 34, the second amorphous silicon layer 33, the first amorphous silicon layer 31, the gate insulative layer 30, and also the first metal layer are selectively removed, so that the glass substrate 2 is exposed.

Thus, a multiple-layer film pattern (a pattern of a laminated structure) including a heat resistant metal layer 34A, a second amorphous silicon layer 33A, a first amorphous silicon layer 31A, a gate insulative layer 30A, and the scanning signal line 11 is obtained. Thereafter, the entire surface of the glass substrate 2 is subjected to a plasma process with a Freon gas, e.g., $CF_4$. Since the glass substrate 2 is inorganic, the surface of the glass substrate 2 is hardly fluorinated. On the other hand, since the photosensitive resin patterns 83A and 83B are organic resins, surfaces of the photosensitive resin patterns 83A and 83B are easily fluorinated and consequently become photosensitive resin pattern 83A1 and 83B1, respectively. Fluorination of the surface is possible as long as the surface has a depth of 100 Å or more.

Next, a coating type transparent insulative resin is applied onto the glass substrate 2. Here, applied as the coating type transparent insulative resin is a transparent resin (transparent inorganic insulative resin) which is inorganic and is prepared by dissolving oxide silicon fine powder and a binder in a solvent. Since the photosensitive resin patterns 83A1 and 83B1, which have been fluorinated, have water repellency, the transparent insulative resin is repelled by the photosensitive resin patterns 83A1 and 83B1, so that the transparent insulative resin is applied in a self-aligned manner onto a region excluding the photosensitive resin patterns 83A1 and 83B1, as shown in (b) of FIG. 9 and (b) of FIG. 11. In this embodiment, the transparent insulative resin is applied so as to have substantially the same film thickness as that of the multiple-layer film pattern.

After filling a space in the multiple-layer film pattern with the transparent insulative resin 60, a solvent contained in the transparent insulative resin 60 is heated and evaporated, in order to prevent the solvent from hindering removal using a resist removing solution. Thereafter, a polymer is removed from the fluorinated surface by ashing means such as oxygen plasma, and a film thickness of each of the photosensitive resin patterns 83A1 and 83B1 is reduced by 1 μm or more. Consequently, the photosensitive resin pattern 83B1 disappears, so that an opening 63A is formed. This allows the heat resistant metal layer 34A to be exposed in the opening 63A, and enables to selectively form a photosensitive resin pattern 83C only in a scanning signal line formed region. However, in a case where the transparent insulative resin 60 is an acrylic resin, the transparent insulative resin 60 loses its thickness and disappears when subjected to the oxygen plasma process. Therefore, unlike in Embodiment 1, an acrylic resin cannot be used as the coating-type transparent insulative resin.

Figure 9:
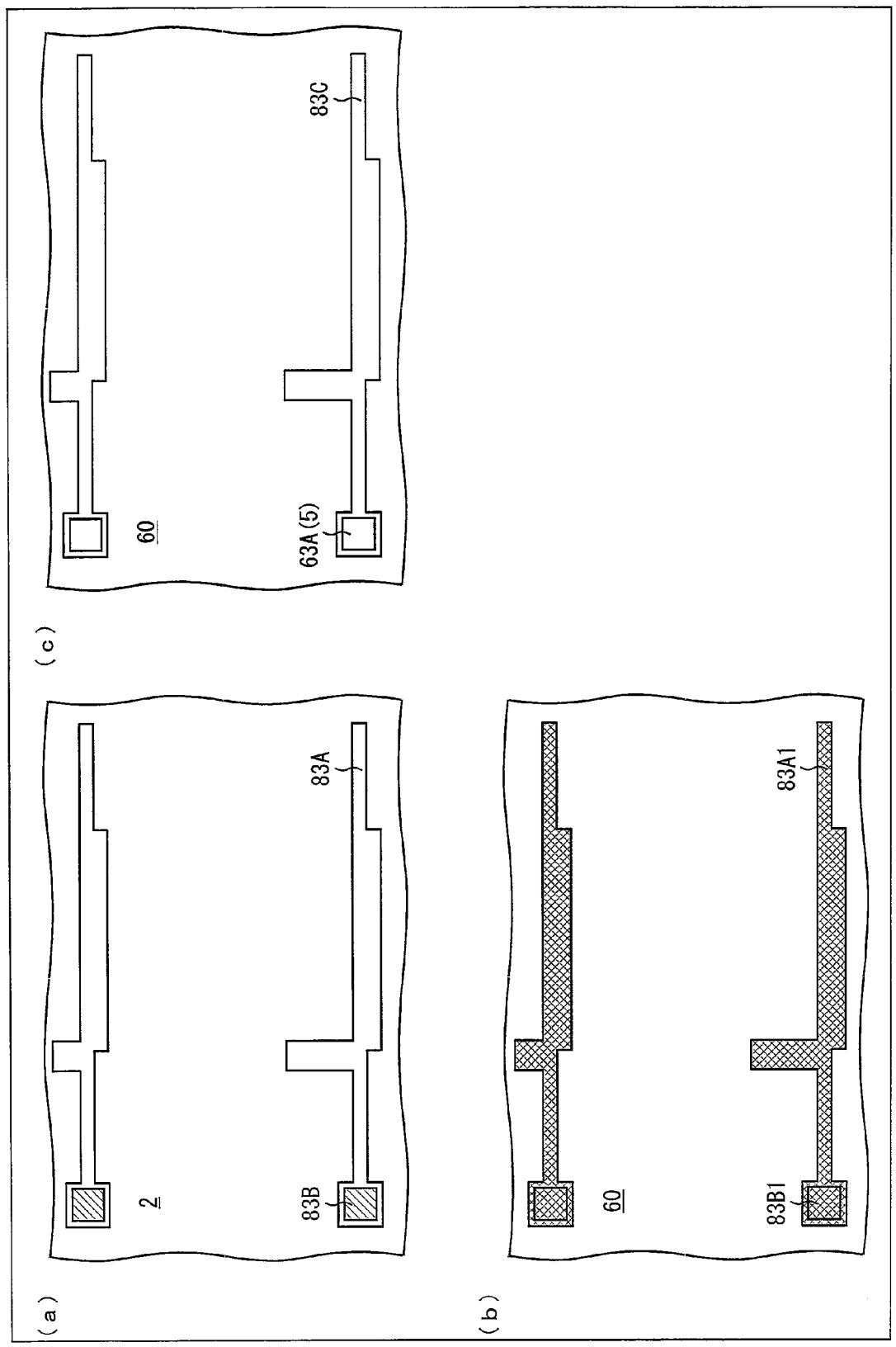
FIG. 9
FIG. 9 shows plan views illustrating a process for manufacturing an active matrix substrate of Embodiment 2.
Figure 10:
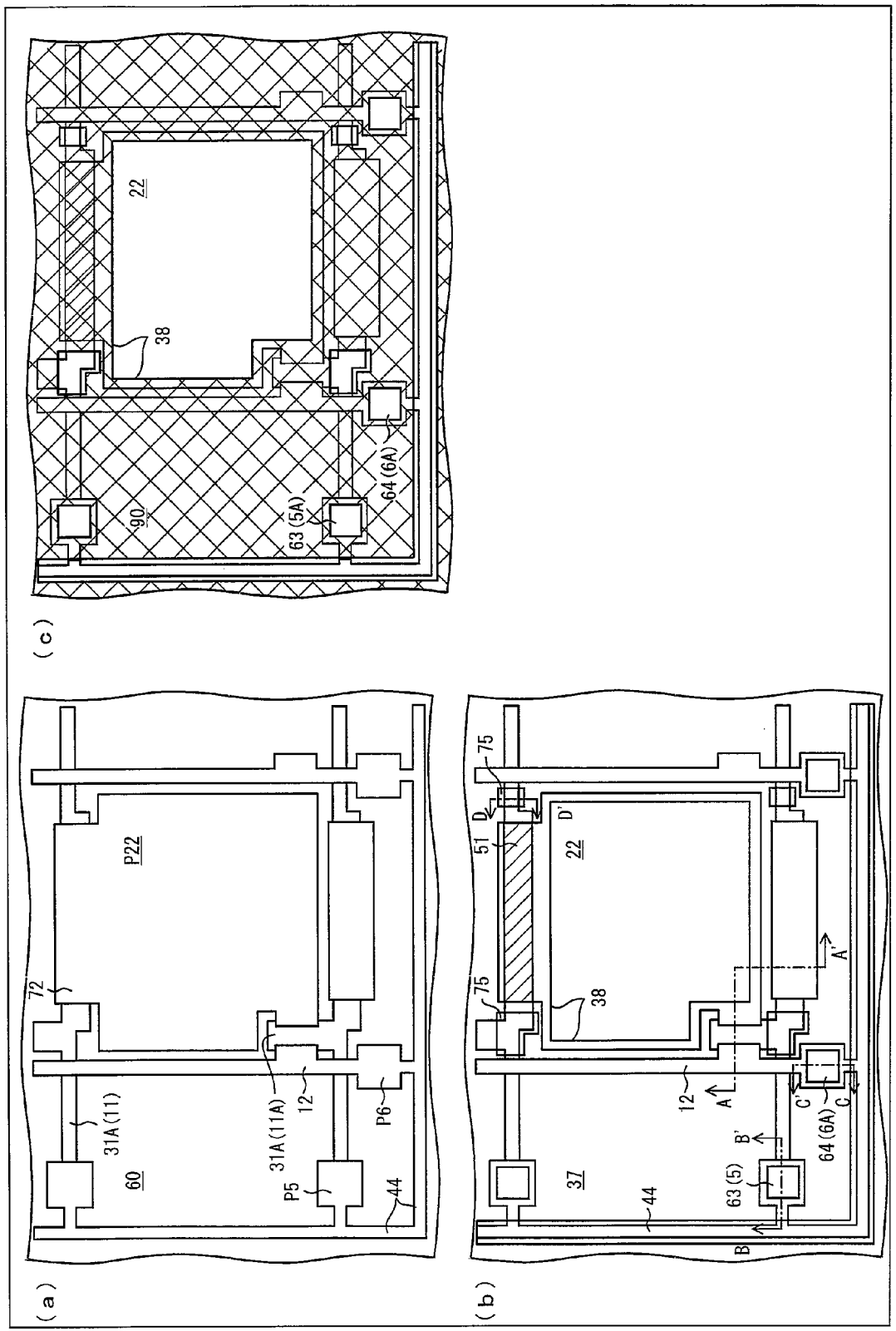
FIG. 10
FIG. 10 shows plan views illustrating a process for manufacturing the active matrix substrate of Embodiment 2. The process shown in FIG. 10 is carried out following the manufacturing process shown in FIG. 9.
Figure 11:
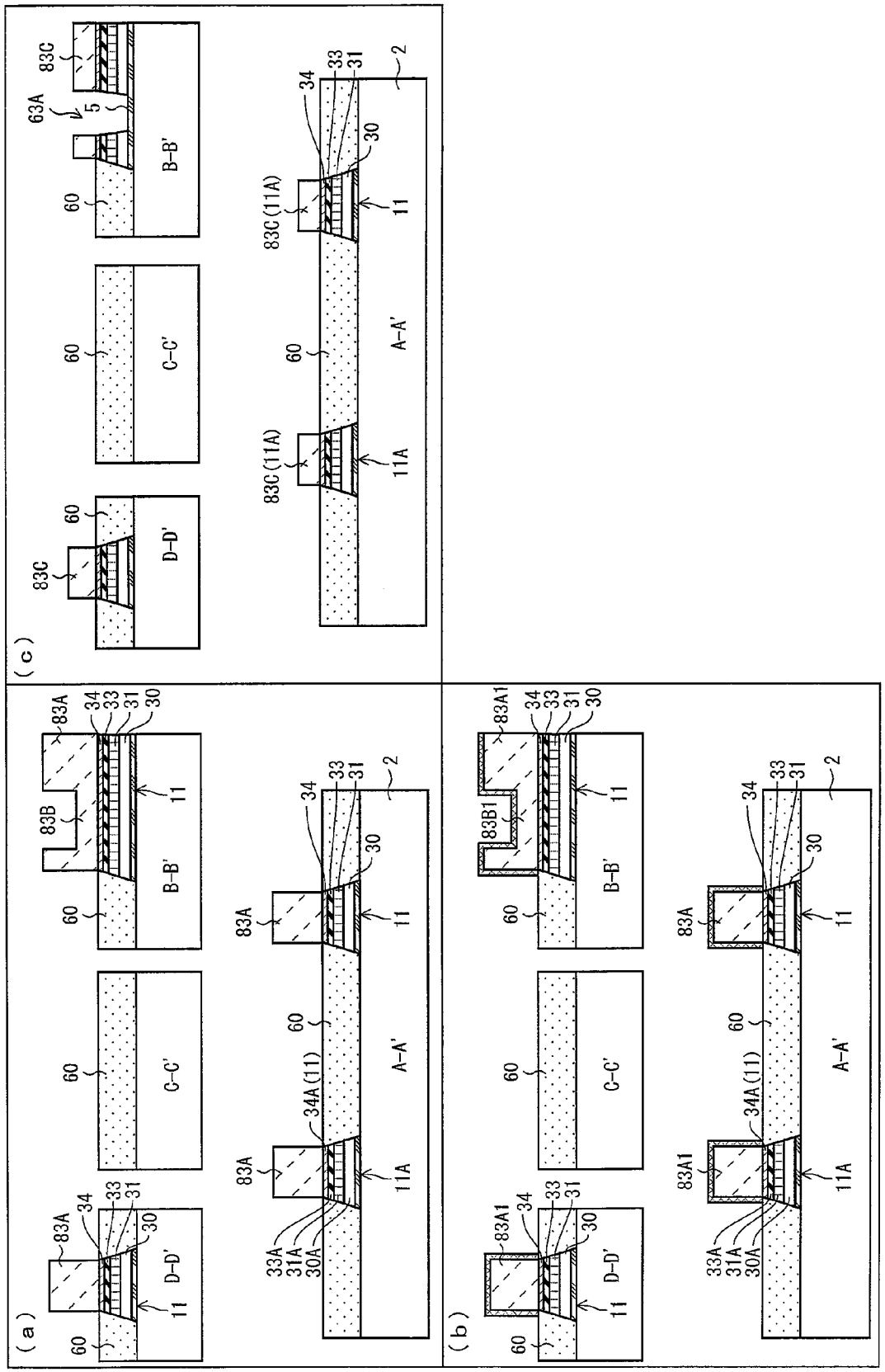
FIG. 11
FIG. 11 shows cross-sectional views illustrating the process shown in FIG. 9 for manufacturing the active matrix substrate. (a) through (c) of FIG. 11 correspond to (a) through (c) of FIG. 9, respectively.
Figure 12:
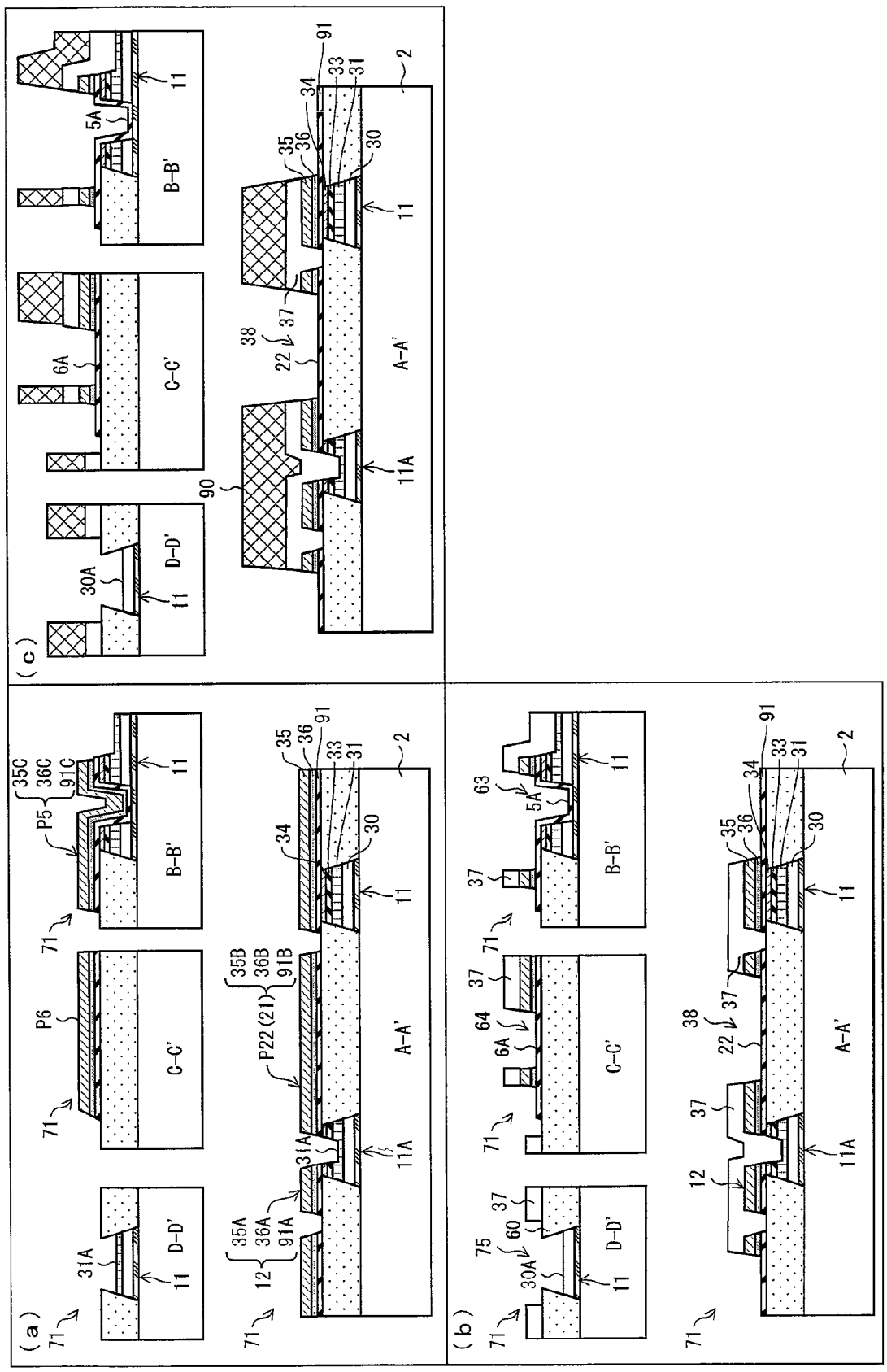
FIG. 12
FIG. 12 shows cross-sectional views illustrating the process shown in FIG. 10 for manufacturing the active matrix substrate. (a) through (c) of FIG. 12 correspond to (a) through (c) of FIG. 10, respectively.

In view of this, as shown in (c) of FIG. 9 and (c) of FIG. 11, the photosensitive resin pattern 83C is used as a mask so as to selectively remove a part of the heat resistant metal layer 34A, a part of the second amorphous silicon layer 33A, a part of the first amorphous silicon layer 31A, and a part of the gate insulative layer 30A which parts correspond to the opening 63A. Consequently, the connection region 5 of the scanning signal line is exposed (a B-B' cross-sectional view in (c) of FIG. 11).

Thereafter, the photosensitive resin pattern 83C is removed by use of the resist removing solution. Further, a heating process is carried out at a temperature as high as possible (typically, at approximately 250° C.) in a range in which film qualities of the amorphous silicon layers 31A and 33A are not deteriorated. Consequently, the transparent insulative layer 60 attains improved film quality.

(Second Step: Step of Forming Source Wire and Drain Wire)

Subsequently, a step of forming a source wire and a drain wire is carried out. In this step, on the entire surface of the glass substrate 2, a transparent electrically conductive layer 91 having a film thickness of approximately 0.1 μm and a second metal layer (i.e., a metal layer for a source wire and a drain wire) 35 are deposited by a vacuum film forming device such as SPT. Thereafter, by a microfabrication technology using a photosensitive resin pattern (i.e., a second photosensitive resin pattern), the second metal layer 35, the transparent electrically conductive layer 91, the heat resistant metal layer 34A, and the second amorphous silicon layer 33A are etched and partially removed, and the first amorphous silicon layer 31A is left to have a thickness of approximately 0.05 μm through 0.1 μm. This selectively forms, as shown in (a) of FIG. 10 and (a) of FIG. 12, a data signal line 12 and a drain electrode 21 of an insulated gate transistor. The data signal line 12, which serves also as a source wire, is made of a lamination of a transparent electrically conductive layer 91A and a second metal layer 35A, which lamination is formed so as to partially overlap a gate electrode 11. The drain electrode 21, which serves also as a pseudo pixel electrode P22, is made of a lamination of a transparent electrically conductive layer 91B and a second metal layer 35B, which lamination is formed so as to partially overlap the gate electrode 11 similarly.

Concurrently with the formation of the source wire 12 and the drain wire 21, a pseudo electrode terminal P5 of the scanning signal line and a pseudo electrode terminal P6 are formed. The pseudo electrode terminal P5 includes the connection region 5 of the scanning signal line, which connection region 5 is exposed in a region outside the image display section. Further, the pseudo electrode terminal P5 is made of a lamination of a transparent electrically conductive layer 91C and a second metal layer 35C. The pseudo electrode terminal P6 is a part of the data signal line 12, and is similarly made of the lamination of the transparent electrically conductive layer 91A and the second metal layer 35A. Also in this embodiment, for convenience of explanation, a laminated structure of a buffer metal layer 36 and an Al thin film layer 35 is referred to as a second metal layer.

(Third Step: Step of Forming Opening in Passivation Insulative Layer)

After the source wire 12 and the drain wire 21 are formed, a second SiNx layer having a film thickness of approximately 0.3 μm is deposited on the entire surface of the glass substrate 2 as a transparent insulative layer by a PCVD device. Thus, a passivation insulative layer 37 is formed. Then, as shown in (b) of FIG. 10 and (b) of FIG. 12, by use of a photosensitive resin pattern (i.e., a third photosensitive resin pattern), (i) an opening 75 (i.e., a fourth opening) is formed above the scanning signal line 11, (ii) an opening 38 is formed above the pseudo pixel electrode P22, (iii) an opening 63 is formed above a pseudo electrode terminal 5 of the scanning signal line, and (iv) an opening 64 is formed above the pseudo electrode terminal P6 of the data signal line.

Here, first, parts of the passivation insulative layer which parts correspond to the openings 75, 38, 63, and 64 are removed by dry etching with a fluorine gas. Next, either by another gas or overetching, a part of the first amorphous silicon layer 31A which part corresponds to the opening 75 is removed Thus, in the openings 75, 38, 63, and 64, the gate insulative layer 30A, the transparent insulative layer 60, the pseudo pixel electrode 22, the pseudo electrode terminal 5A, and a pseudo electrode terminal 6A are exposed. Then, parts of the second metal layer 35 which parts correspond to the openings 38, 63, and 64 are removed by wet etching with a mixed acid. This exposes (i) a most part of the pixel electrode 22, (ii) a most part of the electrode terminal 5A of the scanning signal line, and (iii) a most part of the electrode terminal 6A of the data signal line. Note that each of the pixel electrode 2, the electrode terminal 5A, and the electrode terminal 6A is made of the transparent electrically conductive layer.

The active matrix substrate 71 obtained in this manner and a color filter substrate 9 are bonded to each other, so that a liquid crystal panel is obtained. Thus, the manufacturing process of Embodiment 2 is completed. A configuration of a storage capacitor 15 of Embodiment 2 is identical to that of Embodiment 1. In Embodiment 2, the connection region 5 of the scanning signal line is exposed before the source wire 12 and the drain wire 21 are formed. Therefore, Embodiment 2 can employ, as a measure against static electricity, a short-circuit wire 44 by which (i) the electrode terminal 5A of the scanning signal line and (ii) the electrode terminal 6A of the data signal line are connected with each other, the short-circuit wire 44 being made of the transparent electrically conductive layer.

Furthermore, Embodiment 2 employs an array arrangement obtained in such a manner that, in the step of forming the openings in the passivation insulative layer 37, the opening 75 is formed above the scanning signal line 11 by removing the part of the first amorphous silicon layer 31A which part corresponds to the opening. This prevents formation of a parasitic transistor, thereby eliminating the possibility of occurrence of a crosstalk.

As described above, Embodiment 2 involves (i) the step of forming the scanning signal line and the semiconductor layer by the halftone exposure technique and forming a contact to the scanning signal line, (ii) the step of forming the source wire, the drain wire, and the pseudo pixel electrode, and (iii) the step of forming the openings in the passivation insulative layer, thereby making it possible to provide the active matrix substrate 71 by use of three photo masks.

In the present embodiment, the final photo-etching step is the step of forming the openings in the passivation insulative layer. Therefore, in forming the openings in the passivation insulative layer, a black pigment-dispersed photosensitive resin 90 may be used instead of a generally-used photosensitive resin. In this case, as shown in (c) of FIG. 10 and (c) of FIG. 12, after the gate insulative layer 30A, the transparent insulative layer 60, the pixel electrode 22, the electrode terminal 5A of the scanning signal line, and the electrode terminal 6A of the data signal line are exposed in the openings 75, 38, 63, and 64, the active matrix substrate 71 may be completed without removing the black pigment photosensitive resin 90. This allows the black pigment photosensitive resin 90 to serve as BM, as with Embodiment 1.

(Modification of Embodiment 2)

The active matrix substrate of Embodiment 2, which is manufactured in the streamlined manner, employs TN liquid crystal. By modifying the shape of the pixel electrode, the present invention is also effective in IPS liquid crystal and vertical alignment liquid crystal, each of which provides a wide viewing angle. This will be described below as a part of Embodiment 2.

Here, a basic structure including a pair of (i) a counter electrode formed on an active matrix substrate 71 and (ii) a pixel electrode formed so as to be away from the counter electrode by a predetermined distance is applied to the active matrix substrate 71 of Embodiment 2. Then, as shown in (a) of FIG. 13 and (a) of FIG. 14, a plurality of counter electrodes 16A and a plurality of pixel electrodes 21A are formed so as to be away from each other by a predetermined distance. The counter electrodes 16A, which are shaped in stripes, are branched from a storage capacitor line 16 within a pixel, the storage capacitor line 16 being formed concurrently with formation of a scanning signal line 11. The pixel electrodes 21A, which are shaped in stripes, are connected with a drain electrode 21. Note that the counter electrodes 16A and the pixel electrodes 21A in an upper half region of the pixel are provided at an angle of some degrees with respect to the data signal line 12, and the counter electrodes 16A and the pixel electrodes 21A in a lower half region of the pixel are also provided at an angle of some degrees with respect to the data signal line 12. This arrangement is made in order to divide the pixel for the purpose of attaining a wider viewing angle.

Here, the counter electrode 16A and the pixel electrode 21A need not be transparent or electrically conductive. Further, in an IPS liquid crystal panel, a counter electrode 14 is not necessary on a color filter substrate 9. Note that 72 denotes a storage electrode which is formed concurrently with formation of the source wire 12 and the drain wire 21. The storage electrode 72 and the storage capacitor line 16 overlap each other via an insulative layer including a gate insulative layer 30B (not illustrated), so as to form a storage capacitor 15.

In an IPS liquid crystal panel in which a counter electrode 16A is formed on a glass substrate 2 and a pixel electrode 21A is formed in a layer which is not provided on a transparent insulative layer 60, it is highly possible that unevenness of luminance occurs in a display image unless pattern alignment accuracy for the counter electrode 16A and the pixel electrode 21A is high. In view of this, it is also possible to provide an IPS liquid crystal panel having a different configuration, in which a position of a counter electrode is changed.

In this case, as shown in (b) of FIG. 13 and (b) of FIG. 14, concurrently with formation of a source wire 12 and a drain wire 21, a counter electrode 21B including a second metal layer (not given a reference number) is formed on a transparent insulative layer 60 so that the counter electrode 21B includes an opening formed in a part of a storage capacitor line 16. In this case, since the counter electrode 21B and the pixel electrode 21A are both formed on the transparent insulative layer 60, the possibility of occurrence of a short circuit between these electrodes is high. However, with the distance between these electrodes, there is no possibility of occurrence of unevenness of luminance in a display image due to effects of the pattern alignment accuracy. Further, since no insulative layer exists on the counter electrode 21B or the pixel electrode 21A, each of which is a display electrode, this IPS liquid crystal panel has an advantage of being free from image sticking occurring in a display image, whereas conventional IPS liquid crystal panels do not have this advantage.

Alignment regulation means which can be formed in an active matrix substrate 71 included in a vertical alignment liquid crystal panel is a slit provided in a pixel electrode or a projection provided on the pixel electrode. Now, this basic structure is applied to the active matrix substrate 71 of Embodiment 2. Then, as shown in (c) of FIG. 13 and (c) of FIG. 14, pixel electrodes 22-1 through 22-4, which are transparent and electrically conductive and are shaped in a plurality of stripes, are connected with a drain electrode 21 via a storage electrode 72. Further, in order to provide multi domain, the pixel electrode 22-1 and the pixel electrode 22-3 are formed so that they are substantially orthogonal to each other, and the pixel electrode 22-2 and the pixel electrode 22-4 are formed so that they are substantially orthogonal to each other. There exist (i) a space 42 between the pixel electrode 22-1 and the pixel electrode 22-2 and (ii) a space 42 between the pixel electrode 22-3 and the pixel electrode 22-4, each of the spaces 42 serving as a slit (cut line).

It is also possible to provide a vertical alignment liquid crystal panel having a different configuration, i.e., a vertical alignment liquid crystal panel including a projection as the alignment regulation means instead of the slit. In this case, as shown in (d) of FIG. 13 and (d) of FIG. 14, two pixel electrodes 22A and 22B, which are transparent and electrically conductive, are connected with a drain electrode 21 via a storage electrode 72 so that the pixel electrodes 22A and 22B are substantially orthogonal to each other. Further, on a substantially center part of each of the pixel electrodes 22A and 22B, there provided a laminated pattern, which is made of a lamination of a passivation insulative layer 37P and a second metal layer (i.e., a buffer metal layer 36P and a low resistant metal layer 35P). This laminated pattern serves as a projection 41.

[Embodiment 3]

Next, the following will describe Embodiment 3.

A liquid crystal display device 100 of Embodiment 3 has the same configuration as that of the liquid crystal display device 100 of Embodiment 1, which has been described with reference to FIGS. 1 and 2. Therefore, explanations of the liquid crystal display device 100 of Embodiment 3 are omitted here.

The following will describe, with reference to FIGS. 15 through 18, a method for manufacturing a liquid crystal panel 70 of Embodiment 3. Particularly, the following will concretely describe a method for manufacturing an active matrix substrate 71 included in the liquid crystal panel 70.

(First Step: Step of Forming Scanning Signal Line and Semiconductor Layer)

In Embodiment 3, as well as in Embodiment 1, first, a first metal layer (i.e., a metal layer for a scanning signal line) having a film thickness of approximately 0.1 μm through approximately 0.3 μm is deposited on one main surface of a glass substrate 2 by a vacuum film forming device such as SPT. Subsequently, a PCVD device is used to sequentially deposit, on the entire surface of the glass substrate 2, three types of thin film layers, i.e., (i) a first SiNx layer 30, which becomes a gate insulative layer, (ii) a first amorphous silicon layer 31, which hardly contains an impurity and which becomes a channel of an insulated gate transistor, and (iii) a second amorphous silicon layer 33, which contains an impurity and becomes a source and a drain of the insulated gate transistor so that the first SiNx layer 30, the first amorphous silicon layer 31, and the second amorphous silicon layer 33 have film thicknesses of, e.g., approximately 0.3 μm, approximately 0.2 μm, and approximately 0.05 μm, respectively.

Figure 15:
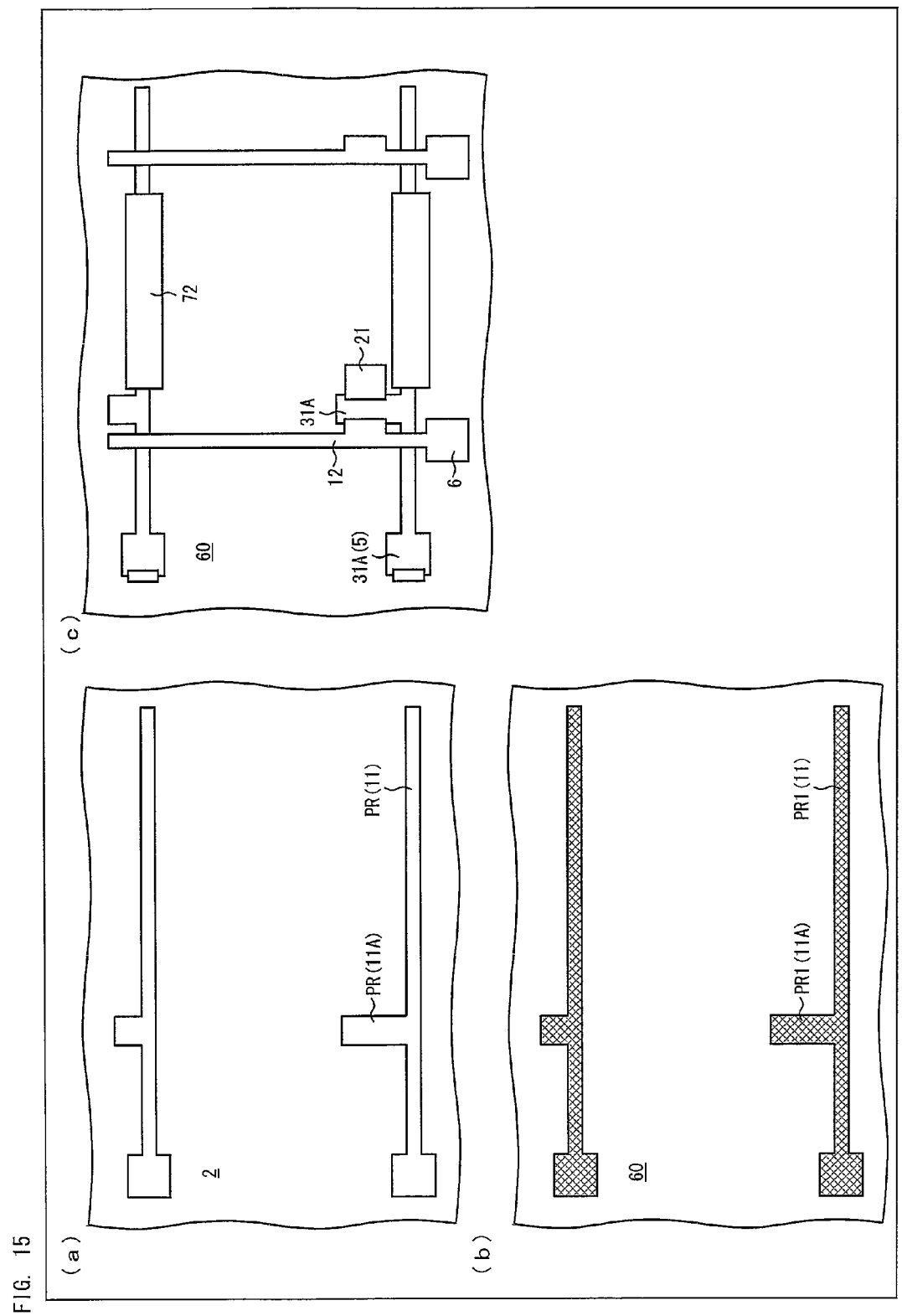
FIG. 15
FIG. 15 shows plan views illustrating a process for manufacturing an active matrix substrate of Embodiment 3.
Figure 17:
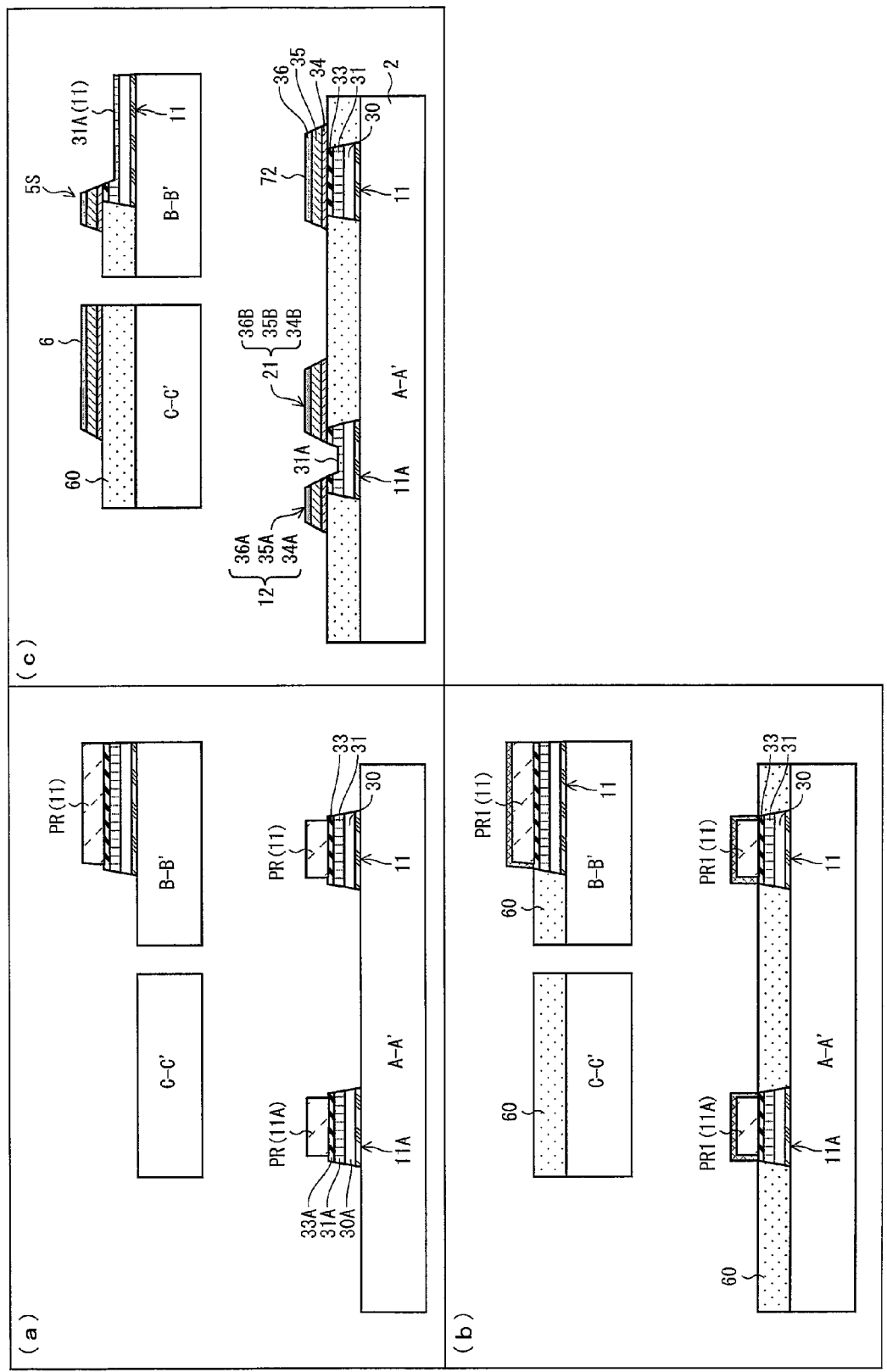
FIG. 17

Then, as shown in (a) of FIG. 15 and (a) of FIG. 17, the second amorphous silicon layer 33, the first amorphous silicon layer 31, the gate insulative layer 30, and also the first metal layer are selectively removed by a photo-etching technique using, as a mask, a photosensitive resin pattern PR (i.e., a first photosensitive resin pattern) which corresponds to a scanning signal line 11. Consequently, the glass substrate 2 is exposed.

This selective removal is carried out in such a manner that the second amorphous silicon layer 33, the first amorphous silicon layer 31, and the gate insulative layer 30 are removed by dry etching using a fluorine gas. In a case where the first metal layer is made of Mo, Ti, or Ta, the first metal layer is also removed by dry etching. Alternatively, in a case where the first metal layer is made of Cr, the first metal layer is removed by use of a dedicated etching solution. Further alternatively, in a case where the first metal layer is made of a lamination of Mo/Al/Mo, Al(Nd)/Mo, or the like, the first metal layer is removed by wet etching using a mixed acid containing phosphoric acid and several percents of nitric acid.

Thus, a multiple-layer film pattern (a pattern of a laminated structure) including a second amorphous silicon layer 33A, a first amorphous silicon layer 31A, a gate insulative layer 30A, and the scanning signal line 11 is obtained. Thereafter, the entire surface of the glass substrate 2 is subjected to a plasma process with a Freon gas, e.g., $CF_4$. Consequently, a surface of the photosensitive resin pattern PR is fluorinated, so that the photosensitive resin pattern PR becomes a photosensitive resin pattern PR1.

Next, as shown in (b) of FIG. 15 and (b) of FIG. 17, a coating type transparent insulative resin is applied onto the glass substrate 2. Here, applied as the coating type transparent insulative resin is (i) a transparent resin (transparent inorganic insulative resin) which is inorganic and is prepared by dissolving oxide silicon fine powder and a binder in a solvent or (ii) a transparent resin having high heat resistance and high transparency (e.g., acrylic resin).

After filling a space in the multiple-layer film pattern with the transparent insulative resin 60, a solvent contained in the transparent insulative resin 60 is heated and evaporated. Thereafter, a polymer is removed from the fluorinated surface by ashing means such as oxygen plasma, and the photosensitive resin pattern PR1 is removed by use of a resist removing solution. Further, a heating process is carried out at a temperature as high as possible (typically, at approximately 250° C.) in a range in which film qualities of the amorphous silicon layers 31A and 33A are not deteriorated. Consequently, the transparent insulative layer 60 attains improved film quality.

(Second Step: Step of Forming Source Wire and Drain Wire)

Subsequently, a step of forming a source wire and a drain wire is carried out. In this step, on the entire surface of the glass substrate 2, a second metal layer (i.e., a metal layer for a source wire and a drain wire) 35 is deposited. Thereafter, as shown in (c) of FIG. 15 and (c) of FIG. 17, by a microfabrication technology using a photosensitive resin pattern (i.e., a second photosensitive resin pattern), the second metal layer 35 is etched. This selectively forms a data signal line 12, a drain electrode 21 of the insulated gate transistor, and a storage electrode 72. The data signal line 12, which serves also as a source wire of the insulated gate transistor, partially overlaps a gate electrode 11A and includes a connection region 6 of the data signal line, the connection region 6 being provided outside an image display section. The drain electrode 21 partially overlaps the gate electrode 11. The storage electrode 72 is provided above the scanning signal line 11. Subsequently, the second amorphous silicon layer 33A and the first amorphous silicon layer 31A are sequentially etched. The first amorphous silicon layer 31A is etched so as to be left to have a thickness of approximately 0.05 μm through approximately 0.1 μm. Concurrently with the formation of the source wire 12 and the drain wire 21, a height difference offsetting electrode 5S is formed so as to cover a boundary between a connection region 5 of the scanning signal line and the transparent insulative layer 60.

As with the other embodiments, used as the second metal layer is a heat resistant metal such as Ti, Cr, Mo, or the like, in a case where the second metal layer is made of a single layer. In order to reduce a resistance of the data signal line, forming the second metal layer of a lamination including Al is effective, as with the case of the scanning signal line. Selected as a heat resistant metal layer having a film thickness of approximately 0.1 μm is, for example, a thin film layer 34 made of Mo, Ti, or the like. Selected as a low resistant metal layer having a film thickness of approximately 0.3 μm is an Al thin film layer 35. Selected as a buffer metal layer having a film thickness of approximately 0.1 μm is, for example, a thin film layer 36 made of Mo, Ti, or the like.

In Embodiment 3, as described later, a pixel electrode made of a transparent electrically conductive layer is formed on the second metal layer. For this reason, such the buffer metal layer 36 is necessary. In a case where the second metal layer is made of a lamination of Mo/Al/Mo, use of the mixed acid (phosphoric acid mixed with nitric acid) allows the second metal layer to be etched by a chemical treatment, as described previously. In a case where the second metal layer is made of a lamination of Ti/Al/Ti, use of a Ti etching solution recently developed by Mitsubishi Chemical Corporation allows the second metal layer to be etched by a chemical treatment. Note that the low resistant metal layer 35 can be made of Cu or a Cu alloy.

(Third Step: Step of Forming Opening in Passivation Insulative Layer)

After the source wire 12 and the drain wire 21 are formed, a second SiNx layer having a film thickness of approximately 0.3 μm is deposited on the entire surface of the glass substrate 2 as a transparent insulative layer. Thus, a passivation insulative layer 37 is formed. Thereafter, as shown in (a) of FIG. 16 and (a) of FIG. 18, a photosensitive resin pattern (i.e., a third photosensitive resin pattern) 88 having an opening 38 (i.e., a first opening), an opening 63 (i.e., a second opening), and an opening 64 (i.e., a third opening) is formed. The opening 38 is provided in a pixel electrode formed region including a part of the drain electrode 21 and a part of the storage electrode 72. The opening 63 is provided in the connection region 5 of the scanning signal line 11, which connection region 5 is outside the image display section and includes the height difference offsetting electrode 5S. The opening 64 is provided in the connection region 6 of the data signal line 12. The photosensitive resin pattern 88 has, in each of the openings, a cross section having an inverse tapered shape.

Preferably used as the photosensitive resin having, in each opening, a cross section having an inverse tapered shape is "TELR-N101PM" (product name), which is manufactured by Tokyo Ohka Kogyo Co., Ltd. A film thickness thereof would be sufficient as long as it is 1 μm or more. This product was developed so as to be used in manufacturing an organic EL display device. Specifically, this product is intended to be used, in a step of forming an electrode (which step follows formation of an organic EL light-emitting layer) for the purpose of allowing an electrically conductive thin film layer (which is to be deposited) for the electrode to be separately formed in openings. This product is a chemically amplified negative photosensitive resin. A difference between the chemically amplified negative photosensitive resin and a generally-used positive photosensitive resin is that the chemically amplified negative photosensitive resin requires a heating process to be carried out after exposure to light (post-exposure-bake), prior to a developing process.

Figure 16:
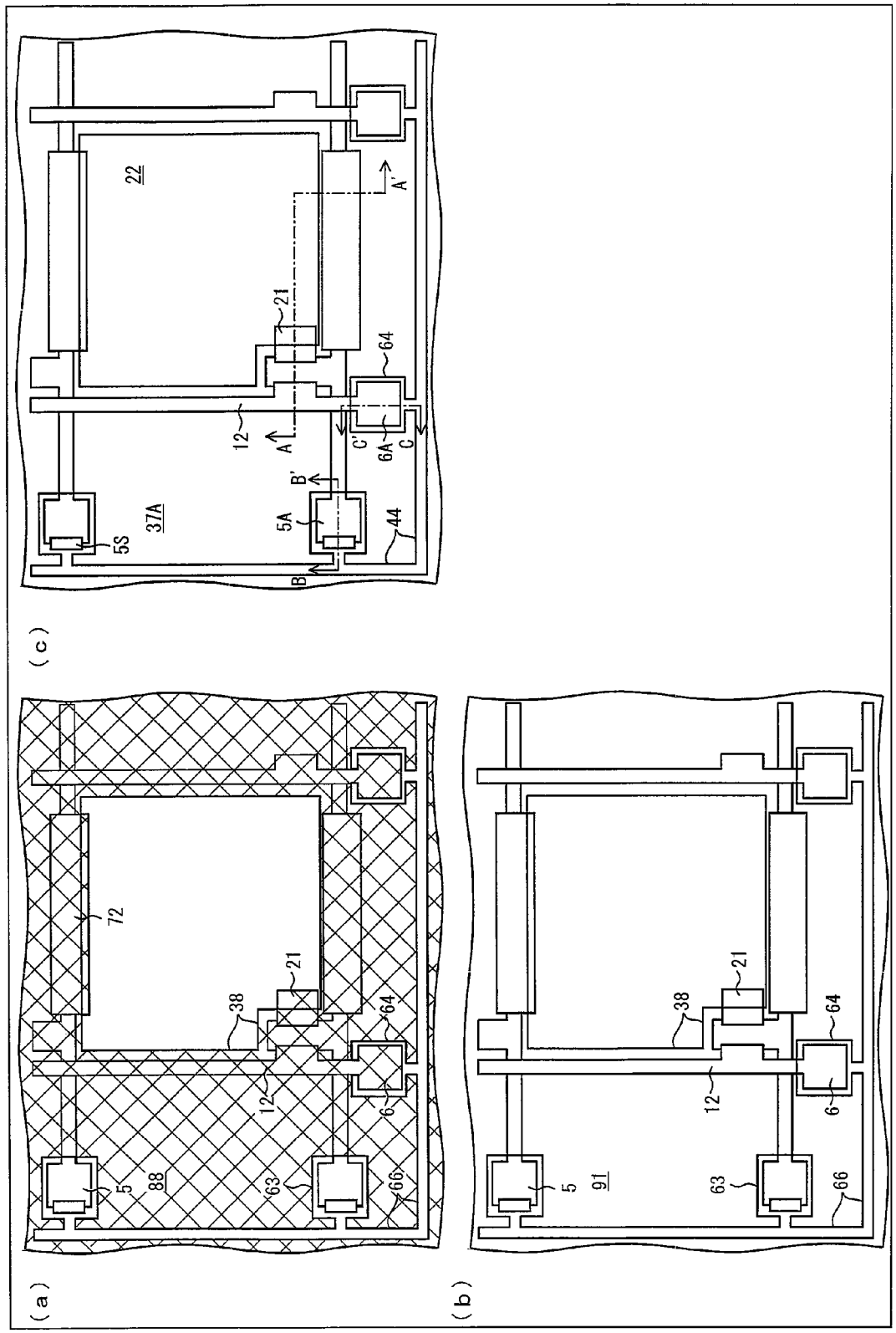
FIG. 16
FIG. 16 shows plan views illustrating a process for manufacturing the active matrix substrate of Embodiment 3. The process shown in FIG. 16 is carried out following the manufacturing process shown in FIG. 15.
Figure 18:
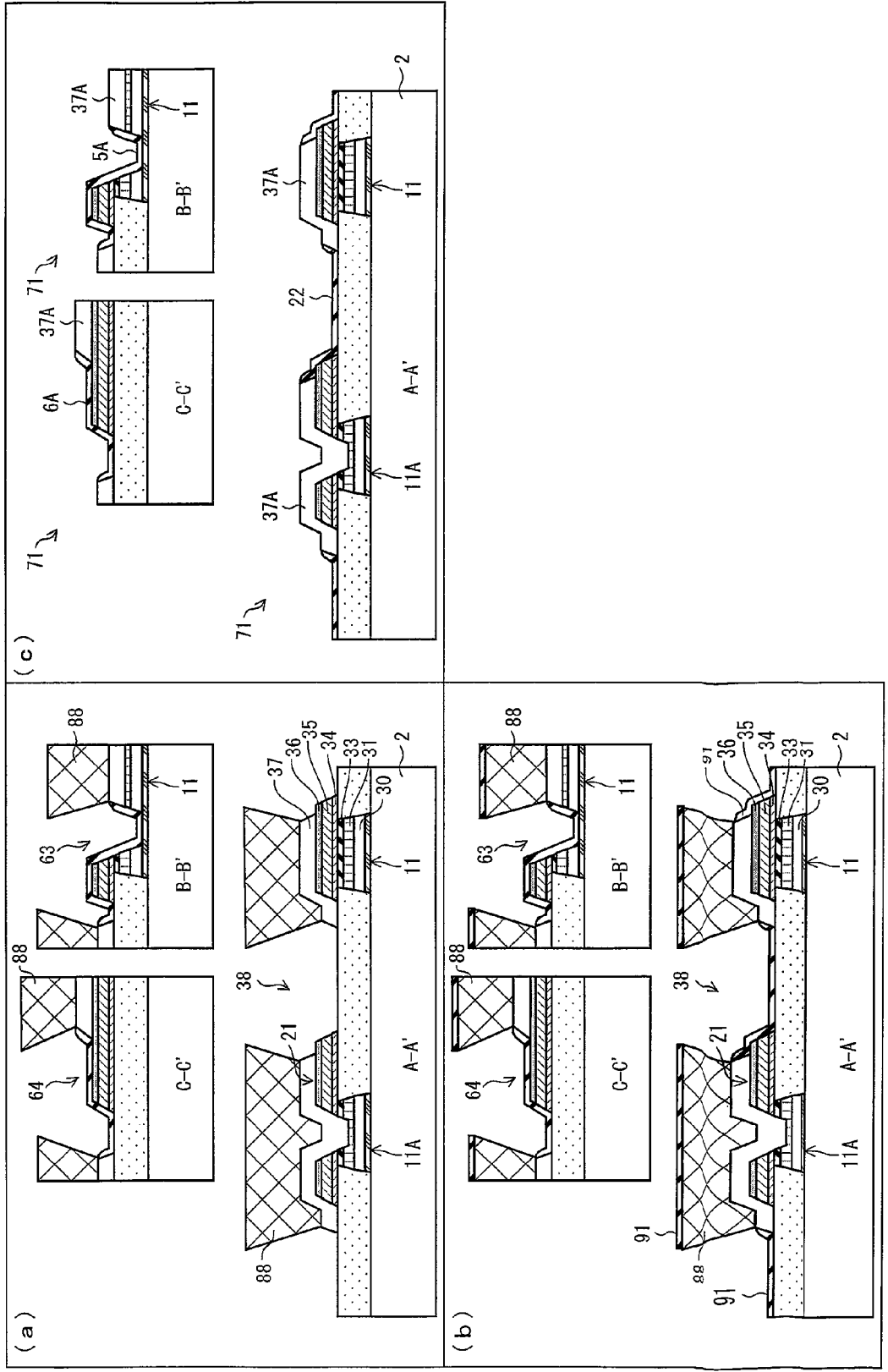
FIG. 18

Then, as shown in (a) of FIG. 16 and (a) of FIG. 18, by use of the photosensitive resin pattern 88 as a mask, parts of the passivation insulative layer 37 which parts correspond to the openings 38 and 64 are removed, so as to expose a part of the transparent insulative layer 60, a part of the drain electrode 21, a part of the storage electrode 72, and the connection region 6 between the data signal line 12 and the transparent insulative layer 60. Further, a part of the passivation insulative layer 37, a part the first amorphous silicon layer 31A, and a part of the gate insulative layer 30A which parts correspond to the opening 63 are removed, so as to expose the transparent insulative layer 60, the height difference offsetting electrode 5S, and the connection region 5, which is a part of the scanning signal line 11.

Subsequently, as shown in (b) of FIG. 16 and (b) of FIG. 18, a transparent electrically conductive layer 91 is deposited on the glass substrate 2 by a vacuum film forming device such as SPT, without removing the photosensitive resin pattern 88. At this time, deposited as the transparent electrically conductive layer 91 is ITO, IZO, or mixed crystal thereof having a film thickness of approximately 0.1 μm. Since (i) the film thickness of the transparent electrically conductive layer 91 is typically as thin as above and (ii) the photosensitive resin pattern 88 has a cross section having an inverse tapered shape, an amount of the transparent electrically conductive layer 91 deposited on a side surface of the photosensitive resin pattern 88 is extremely small.

Accordingly, in removing the photosensitive resin pattern 88 by use of a resist removing solution or a specific organic solvent, the transparent electrically conductive layer 91 on the side surface of the photosensitive resin pattern 88 is molten first. Consequently, the transparent electrically conductive layer 91 on the photosensitive resin pattern 88 is easily peeled off. This is so-called "lift-off". As a result, as shown in (c) of FIG. 16 and (c) of FIG. 18, a pixel electrode 22 is formed in a self-aligned manner on a region of the transparent insulative layer 60, which region is located inside the opening and corresponds to a pixel electrode formed region including a part of the drain electrode 21 and a part of the storage electrode 72. Further, an electrode terminal 5A of the scanning signal line is formed in a self-aligned manner in the opening 63, which includes the part (connection region) 5 of the scanning signal line and the height difference offsetting electrode 5S. Furthermore, an electrode terminal 6A of the data signal line is formed in a self-aligned manner in the opening 64, which includes the connection region 6 of the data signal line 12. In addition, the passivation insulative layer 37 on the glass substrate 2 is exposed, which brings the process for manufacturing an active matrix substrate 71 to the end.

In order to improve the film quality, the substrate may be heated when the transparent electrically conductive layer 91 is deposited. In this case, a temperature for heating the substrate is preferably 150° C. or lower. The reason for this is as follows: If the substrate is heated at too high temperature, the photosensitive resin pattern 88 is deteriorated, which makes it difficult to remove the photosensitive resin pattern 88 in the lift-off step.

The active matrix substrate 71 obtained in this manner and a color filter substrate 9 are bonded to each other, so that a liquid crystal panel is obtained. Thus, the manufacturing process of Embodiment 3 is completed. As for a configuration of a storage capacitor 15, the following example is illustrated: The storage capacitor 15 is made of the storage electrode 72 and a former scanning signal line 11, which overlap each other via the second amorphous silicon layer 33A, the first amorphous silicon layer 31A, and the gate insulative layer 30A, when seen in a plan view. (The storage capacitor 15 is not illustrated here. See the region 51 hatched with lines sloping from left to right in (a) of FIG. 4.) In Embodiment 3, a transparent electrically conductive short-circuit wire 44 is provided by forming an opening 66 in a peripheral region of the active matrix substrate 71, as with conventional examples. Further, in Embodiment 3, a region between (i) the transparent electrically conductive electrode terminals 5A and 6A and (ii) the short-circuit wire 44 is formed to have long and thin stripes, so that a resistance is increased. Thus, a high resistance as a measure for static electricity is achieved.

As described above, Embodiment 3 involves (i) the step of forming the scanning signal line and the semiconductor layer, (ii) the step of forming the source wire and the drain wire, and (iii) the step of forming the openings in the passivation insulative layer and forming the pixel electrode, thereby making it possible to produce the active matrix substrate by use of three photo masks, without use of a halftone exposure technique. This can avoid a variation in the pattern width occurring due to effects of a halftone exposure; therefore, Embodiment 3 can provide an additional effect that dimensional control in each patterning step may be carried out at a general level.

(Modification of Embodiment 3)

The active matrix substrate of Embodiment 3, which is manufactured in the streamlined manner, employs TN liquid crystal. By modifying the shape of the pixel electrode, the present invention is also effective in IPS liquid crystal and vertical alignment liquid crystal, each of which provides a wide viewing angle. This will be described below as a part of Embodiment 3.

Here, a basic structure of an IPS liquid crystal panel is applied to the active matrix substrate 71 of Embodiment 3. Then, as shown in (a) of FIG. 19 and (a) of FIG. 20, a plurality of counter electrodes 16A and a plurality of pixel electrodes 21A are formed so as to be away from each other by a predetermined distance. The counter electrodes 16A, which are shaped in stripes, are made of a transparent electrically conductive layer formed in an opening provided in a passivation insulative layer 37 on a transparent insulative layer 60. The pixel electrodes 21A, which are shaped in stripes, are made of a second metal layer connected with a drain electrode 21.

Alternatively, it is possible to provide an IPS liquid crystal panel having a different configuration, in which a position of a counter electrode is changed.

In this case, as shown in (b) of FIG. 19 and (b) of FIG. 20, a plurality of counter electrodes 16A and pixel electrodes 16C are formed so as to be away from each other by a predetermined distance. The counter electrodes 16A, which are shaped in stripes, are made of a transparent electrically conductive layer formed in an opening provided in a passivation insulative layer 37 on a transparent insulative layer 60. The pixel electrodes 16C are made of the transparent electrically conductive layer formed in an opening provided in the passivation insulative layer 37 on the transparent insulative layer 60. According to this configuration, both of the pixel electrode 16C and the counter electrode 16A, each of which is a display electrode, are made of the transparent electrically conductive layer; therefore, it is easy to utilize and reflect a leaked electric field in the vicinity of the display electrodes to an effort to improve transmittance of the IPS liquid crystal panel.

In the former IPS liquid crystal panel, although the pixel electrode 21A, which is made of the second metal layer, and the counter electrode 16A, which is made of the transparent electrically conductive layer, are both formed on the transparent insulative layer 60, the pixel electrode 21A is covered with the passivation insulative layer 37; therefore, the possibility of occurrence of a short circuit between these electrodes is low. However, it is highly possible that unevenness of luminance occurs in a display image unless pattern alignment accuracy of these electrodes is high. On the contrary, in the latter IPS liquid crystal panel, since the counter electrode 16A and the pixel electrode 16C, each of which is made of the transparent electrically conductive layer, are both formed on the transparent insulative layer 60, the possibility of occurrence of a short circuit between these electrodes is high. However, with the distance between these electrodes, there is no possibility of occurrence of unevenness of luminance in a display image due to effects of the pattern alignment accuracy. Further, the latter IPS liquid crystal panel is configured not to include an insulative layer existing on the counter electrode 16A or the pixel electrode 16C, each of which is a display electrode. Therefore, comparing the former and latter IPS liquid crystal panels, the latter IPS liquid crystal panel has an advantage of causing less image sticking in a display image.

Alignment regulation means which can be formed in an active matrix substrate 71 included in a vertical alignment liquid crystal panel is a slit provided in a pixel electrode or a projection provided on the pixel electrode. In Embodiment 3, the slit and the projection are formed concurrently, due to the specificity in the step of forming the pixel electrode. As a result, as shown in (c) of FIG. 19 and (c) of FIG. 20, pixel electrodes 22-1 through 22-4, which are transparent and electrically conductive and are shaped in a plurality of stripes, are connected with a drain electrode 21 via a storage electrode 72. Further, in order to provide multi domain, the pixel electrode 22-1 and the pixel electrode 22-3 are formed so that they are substantially orthogonal to each other, and the pixel electrode 22-2 and the pixel electrode 22-4 are formed so that they are substantially orthogonal to each other. There exists a passivation insulative layer 37P in (i) a space between the pixel electrode 22-1 and the pixel electrode 22-2 and (ii) a space between the pixel electrode 22-3 and the pixel electrode 22-4, the insulative layer 37P in each space serving as a projection 41.

As with Embodiment 1, the above-referenced active matrix substrate of Embodiment 3 cannot completely prevent a crosstalk between the data signal lines, since the first amorphous silicon layer 31A, having a reduced film thickness, exists on the scanning signal line 11 via the gate insulative layer 30A. On this account, with the active matrix substrate of Embodiment 3, improvement of the quality of a display image has a limit. In view of this, Embodiments 4 and 5 each employs a halftone exposure technique in order to solve these problems. This will be described as follows:

[Embodiment 4]

A liquid crystal display device 100 of Embodiment 4 has the same configuration as that of the liquid crystal display device 100 of Embodiment 1, which has been described with reference to FIGS. 1 and 2. Therefore, explanations of the liquid crystal display device 100 of Embodiment 4 are omitted here.

The following will describe, with reference to FIGS. 21 through 24, a method for manufacturing a liquid crystal panel 70 of Embodiment 4. Particularly, the following will concretely describe a method for manufacturing an active matrix substrate 71 included in the liquid crystal panel 70.

(First Step: Step of Forming Scanning Signal Line and Semiconductor Layer)

Figure 21:
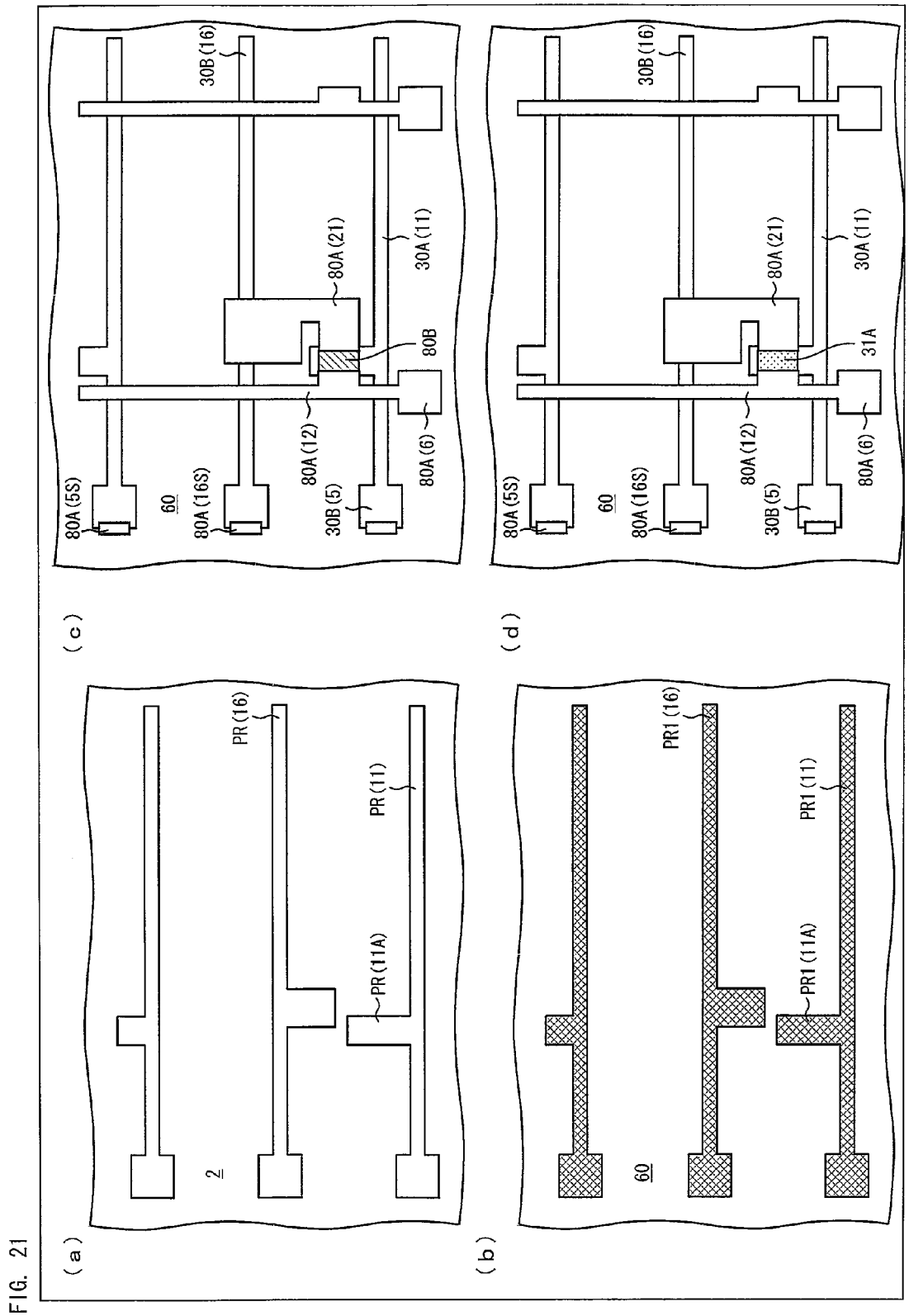
FIG. 21
Figure 23:
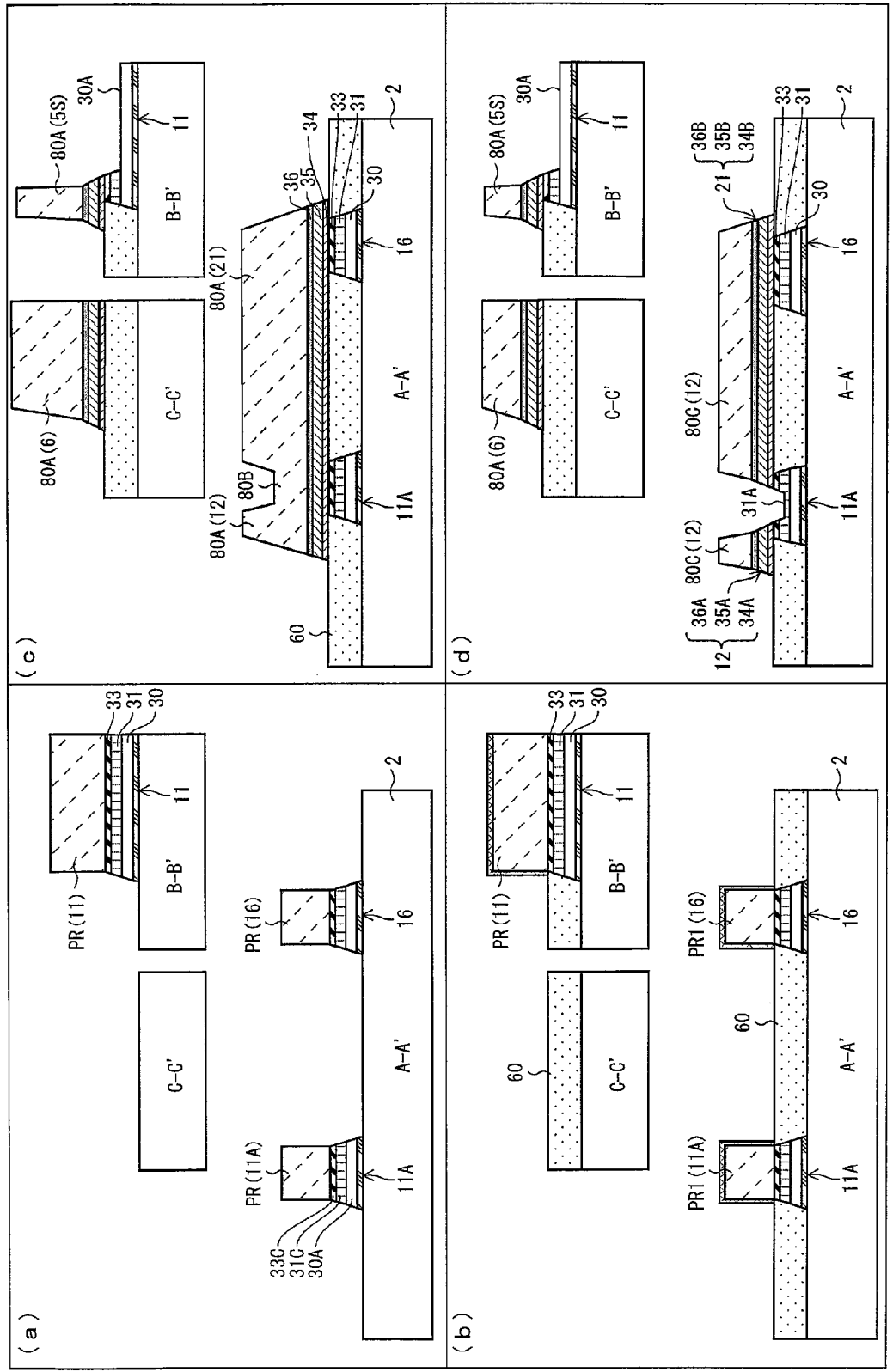
FIG. 23

As shown in (a) and (b) of FIG. 21 and (a) and (b) of FIG. 23, a procedure of Embodiment 4 before deposition of a second metal layer on a glass substrate 2 as a material of a source wire and a drain wire is the same as that of Embodiment 3. Therefore, detailed explanations of the procedure before the deposition of the second metal layer are omitted here.

(Second Step: Step of Forming Source Wire and Drain Wire)

Subsequently, a step of forming a source wire and a drain wire is carried out. In this step, a pattern of the source wire and the drain wire is formed as follows: By the halftone exposure technique described in the conventional example, photosensitive resin patterns 80A and 80B (i.e., a second photosensitive resin pattern) are formed such that, as shown in (c) of FIG. 21 and (c) of FIG. 23, (i) each of a region 80A (12), a region 80A (21), and a region 80A (5S) has a film thickness of, e.g., 3 μm and (ii) a region 80B (hatched region) has a film thickness of, e.g., 1.5 μm. In the region 80A (12), a data signal line 12 is to be formed. The data signal line 12 includes a connection region 6 of the data signal line, partially overlaps a gate electrode 11A, and serves also as a source wire of an insulated gate transistor. In the region 80A (21), a drain electrode 21 of the insulated gate transistor is to be formed. The drain electrode 21 includes a storage electrode 72 partially overlapping a storage capacitor line 16 and forming a storage capacitor 15, and partially overlaps the gate electrode 11A. In the region 80A (5S), a height difference offsetting electrode 5S is to be formed. The height difference offsetting electrode 5S covers a boundary between a connection region 5 of a scanning signal line and a transparent insulative layer 60. In the region 80B, a channel is to be formed. The channel is provided between the source and the drain.

By use of the photosensitive resin patterns 80A and 80B as a mask, a second metal layer (i.e., a lamination of a buffer metal layer 36, a low resistant metal layer 35, and a heat resistant metal layer 34), a second amorphous silicon layer 33A, and a first amorphous silicon layer 31A are sequentially etched. The first amorphous silicon layer 31A is etched so as to be left to have a thickness of approximately 0.05 μm through approximately 0.1 μm. A concrete configuration of the second metal layer is as described in Embodiment 3. Consequently, the transparent insulative layer 60 on the glass substrate 2, the gate insulative layer 30A on the scanning signal line 11, and the gate insulative layer 30B on the storage capacitor line 16 are exposed.

Thereafter, by ashing means such as oxygen plasma, thicknesses of the photosensitive resin patterns 80A and 80B are each reduced by 1.5 μm or more. As a result, the photosensitive resin pattern 80B disappears, so that a part of the second metal layer (buffer metal layer) which part is in the channel formed region is exposed. This allows photosensitive resin patterns 80C (12), 80C (21), and 80 (5S), each of which has a reduced film thickness, to be left only in the source wire formed region, the drain wire formed region, and the height difference offsetting electrode formed region. However, in a case where the transparent insulative resin 60 is an acrylic resin, the transparent insulative resin 60 loses its thickness and disappears when subjected to the oxygen plasma process. Therefore, unlike in Embodiment 3, it is impossible to use an acrylic resin as a coating-type transparent insulative resin.

In view of this, as shown in (d) of FIG. 21 and (d) of FIG. 23, the photosensitive resin patterns 80C (12) and 80C (21) each having a reduced film thickness are used as a mask so as to sequentially etch, in a region between the source wire and the drain wire (i.e., the channel formed region), the second metal layer, the second amorphous silicon layer 33A, and the first amorphous silicon layer 31A again. The first amorphous silicon layer 31A is etched so as to be left to have a thickness of approximately 0.05 μm through approximately 0.1 μm.

(Third Step: Step of Forming Opening in Passivation Insulative Layer)

As with Embodiment 3, after the source wire 12 and the drain wire 21 are formed, a second SiNx layer having a film thickness of approximately 0.3 μm is deposited on the entire surface of the glass substrate 2 as a transparent insulative layer. Thus, a passivation insulative layer 37 is formed. Thereafter, as shown in (a) of FIG. 22 and (a) of FIG. 24, a photosensitive resin pattern 88 (i.e., a third photosensitive resin pattern) having an opening 38 (i.e., a first opening), an opening 63 (i.e., a second opening), an opening 64 (i.e., a third opening), and an opening 75 (i.e., a fourth opening) is formed. The opening 38 is provided so as to correspond to a pixel electrode formed region including a part of the drain electrode 21 and a part of the storage electrode 72. The opening 63 is provided so as to correspond to a connection region 5 of a scanning signal line 11, which connection region 5 is outside an image display section and includes the height difference offsetting electrode 5S. The opening 64 is provided so as to correspond to a connection region 6 of a data signal line 12. The opening 75 is provided above the scanning line 11. The photosensitive resin pattern 88 has, in each of the openings, a cross section having an inverse tapered shape.

By use of the photosensitive resin pattern 88 as a mask, parts of the passivation insulative layer 37 which parts correspond to the openings 38 and 64 are removed, so as to expose a part of the transparent insulative layer 60, a part of the drain electrode 21, a part of the storage electrode 72, and the connection region 6 between the transparent insulative layer 60 and the data signal line 12. Further, a part of the passivation insulative layer 37 and a part of the gate insulative layer 30A which parts correspond to the opening 63 are removed, so as to expose the connection region 5 between the height difference offsetting electrode 5S and the scanning signal line 11. Note that a part of the passivation insulative layer 37 and a part of the gate insulative layer 30B which parts correspond to the opening 65 are also removed, so as to expose a connection region between a height difference offsetting electrode 16S and the storage capacitor line 16. Furthermore, a part of the first amorphous silicon layer 31A which part corresponds to the opening 75 is removed, so as to expose the gate insulative layer 30A.

Figure 22:
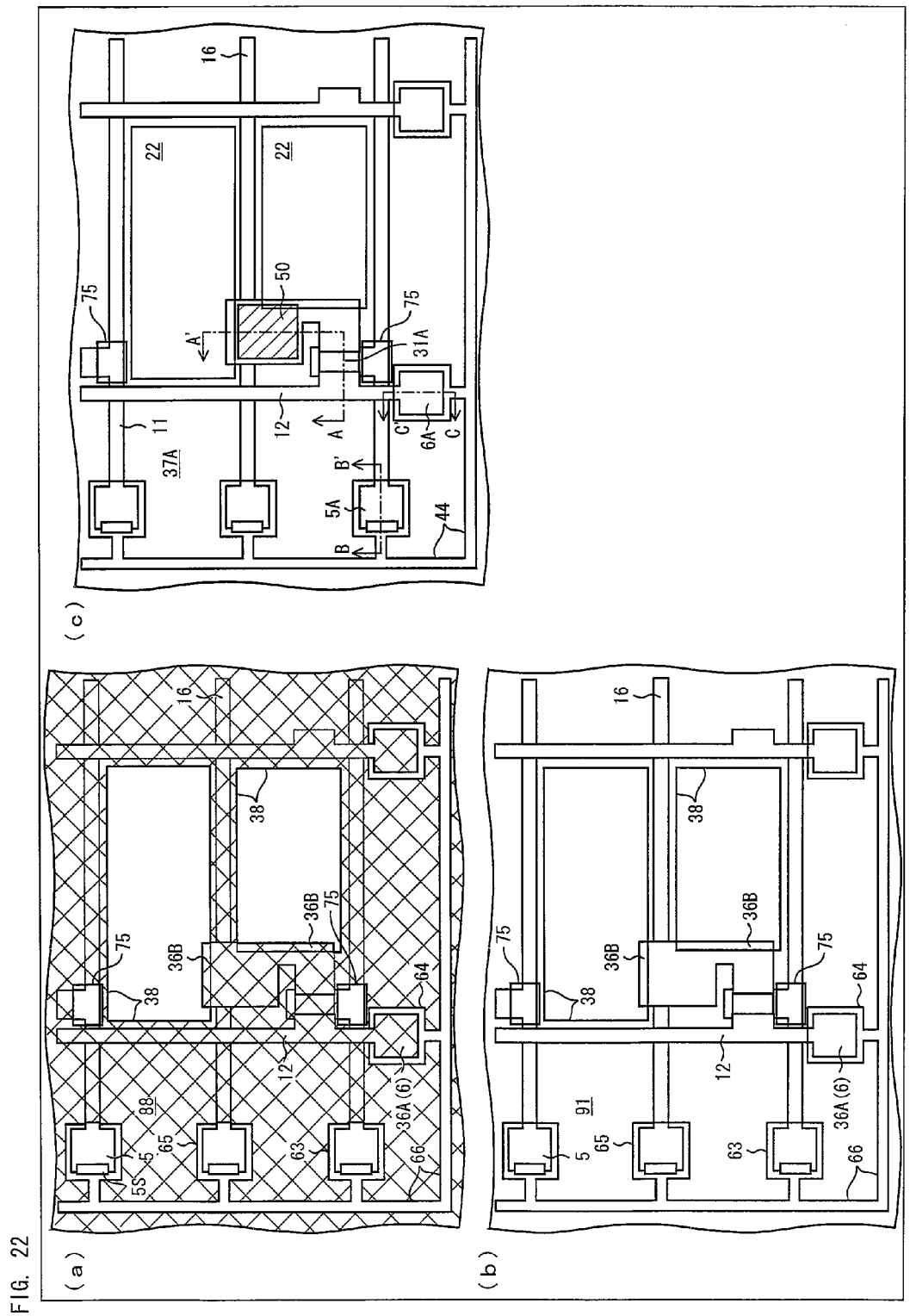
FIG. 22

Subsequently, as shown in (b) of FIG. 22 and (b) of FIG. 24, a transparent electrically conductive layer 91 is deposited on the glass substrate 2 by a vacuum film forming device such as SPT, without removing the photosensitive resin pattern 88. At this time, deposited as the transparent electrically conductive layer 91 is ITO, IZO, or mixed crystal thereof having a film thickness of approximately 0.1 μm. Further, the photosensitive resin pattern 88 is removed by use of a resist removing solution or a specific organic solvent. Then, due to a lift-off effect, the transparent electrically conductive layer 91 on the side surface of the photosensitive resin pattern 88 is molten first. Consequently, the transparent electrically conductive layer 91 on the photosensitive resin pattern 88 is easily peeled off. As a result, as shown in (c) of FIG. 22 and (c) of FIG. 24, a pixel electrode 22 is formed in a self-aligned manner on a region of the transparent insulative layer 60, which region is located inside the opening 38 and corresponds to the pixel electrode formed region including a part of the drain electrode 21 and a part of the storage electrode 72. Further, an electrode terminal 5A of the scanning signal line is formed in a self-aligned manner in the opening 63, which includes the part (the connection region) 5 of the scanning signal line and the height difference offsetting electrode 5S. Furthermore, an electrode terminal 6A of the data signal line is formed in a self-aligned manner in the opening 64, which includes the part (the connection region 6) of the data signal line 12. In addition, the passivation insulative layer 37 on the glass substrate 2 is exposed, which bring the process for manufacturing the active matrix substrate 71 to the end. Note that, also in the opening 65, an electrode terminal (not given a reference number) of the storage capacitor line is formed, the electrode terminal being made of the transparent electrically conductive layer.

The active matrix substrate 71 obtained in this manner and a color filter substrate 9 are bonded to each other, so that a liquid crystal panel is obtained. Thus, the manufacturing process of Embodiment 4 is completed. As for a configuration of a storage capacitor 15, the following example is illustrated: As shown in (c) of FIG. 22, the storage capacitor 15 is made of (i) the storage electrode 72, which serves also as the drain electrode 21, and (ii) the storage capacitor line 16, the storage electrode 72 and the storage capacitor line 16 overlapping each other via the second amorphous silicon layer 33B, the first amorphous silicon layer 31B, and the gate insulative layer 30B, when seen in a plan view (a part of the region 50 hatched with lines sloping from left to right).

As described above, Embodiment 4 involves (i) the step of forming the scanning signal line and the semiconductor layer, (ii) the step of forming the source wire and the drain wire and patterning the semiconductor layer into islands by use of the halftone exposure technique, and (iii) the step of forming the openings in the passivation insulative layer and forming the pixel electrode, thereby making it possible to produce the active matrix substrate by use of three photo masks.

Furthermore, Embodiment 4 employs an array arrangement obtained in such a manner that, in the step of forming the openings in the passivation insulative layer 37, the opening 75 is formed above the scanning signal line 11 by removing the part of the first amorphous silicon layer 31A which part corresponds to the opening. This prevents formation of a parasitic transistor, thereby eliminating the possibility of occurrence of a crosstalk.

(Modification of Embodiment 4)

The active matrix substrate of Embodiment 4, which is manufactured in the streamlined manner, employs TN liquid crystal. By modifying the shape of the pixel electrode, the present invention is also effective in IPS liquid crystal and vertical alignment liquid crystal, each of which provides a wide viewing angle. This will be described below as a part of Embodiment 4.

Here, a basic structure of an IPS liquid crystal panel is applied to the active matrix substrate 71 of Embodiment 4. Then, as shown in (a) of FIG. 25 and (a) of FIG. 26, a plurality of counter electrodes 16A and a plurality of pixel electrodes 21A are formed so as to be away from each other by a predetermined distance. The counter electrodes 16A, which are shaped in stripes, are made of a transparent electrically conductive layer formed in an opening provided in a passivation insulative layer 37 on a transparent insulative layer 60.

The pixel electrodes 21A, which are shaped in stripes, are made of a second metal layer connected with a drain electrode 21.

Alternatively, it is possible to provide an IPS liquid crystal panel having a different configuration, in which a position of a counter electrode is changed.

In this case, as shown in (b) of FIG. 25 and (b) of FIG. 26, a plurality of counter electrodes 16A and pixel electrodes 16C are formed so as to be away from each other by a predetermined distance. The counter electrodes 16A, which are shaped in stripes, are made of a transparent electrically conductive layer formed in an opening provided in a passivation insulative layer 37 on a transparent insulative layer 60. The pixel electrodes 16C are made of the transparent electrically conductive layer in an opening provided in the passivation insulative layer 37 on the transparent insulative layer 60 so as to include a part of a drain electrode 21. According to this configuration, both of the pixel electrode 16C and the counter electrode 16A, each of which is a display electrode, are made of the transparent electrically conductive layer; therefore, it is easy to utilize and reflect a leaked electric field in the vicinity of the display electrodes to an effort to improve transmittance of the IPS liquid crystal panel.

In the former IPS liquid crystal panel, although the pixel electrode 21A, which is made of the second metal layer, and the counter electrode 16A, which is made of the transparent electrically conductive layer, are both formed on the transparent insulative layer 60, the pixel electrode 21A is covered with the passivation insulative layer 37; therefore, the possibility of occurrence of a short circuit between these electrodes is low. However, it is highly possible that unevenness of luminance occurs in a display image unless pattern alignment accuracy of these electrodes is high. On the contrary, in the latter IPS liquid crystal panel, since the counter electrode 16A and the pixel electrode 16C, each of which is made of the transparent electrically conductive layer, are both formed on the transparent insulative layer 60, the possibility of occurrence of a short circuit between these electrodes is high. However, with the distance between these electrodes, there is no possibility of occurrence of unevenness of luminance in a display image due to effects of the pattern alignment accuracy. Further, the latter IPS liquid crystal panel is configured not to include an insulative layer existing on the counter electrode 16A or the pixel electrode 16C, each of which is a display electrode. Therefore, comparing the former and latter IPS liquid crystal panels, the latter IPS liquid crystal panel has an advantage of causing less image sticking in a display image.

Alignment regulation means which can be formed in an active matrix substrate 71 included in a vertical alignment liquid crystal panel is a slit provided in a pixel electrode or a projection provided on the pixel electrode. In Embodiment 4, the slit and the projection are formed concurrently, due to the specificity in the step of forming the pixel electrode. As a result, as shown in (c) of FIG. 25 and (c) of FIG. 26, pixel electrodes 22-1 through 22-4, which are transparent and electrically conductive and are shaped in a plurality of stripes, are connected with a drain electrode 21 via a storage electrode 72. Further, in order to provide multi domain, the pixel electrode 22-1 and the pixel electrode 22-3 are formed so that they are substantially orthogonal to each other, and the pixel electrode 22-2 and the pixel electrode 22-4 are formed so that they are substantially orthogonal to each other. There exists a passivation insulative layer 37P in (i) a space between the pixel electrode 22-1 and the pixel electrode 22-2 and (ii) a space between the pixel electrode 22-3 and the pixel electrode 22-4, the insulative layer 37P in each space serving as a projection 41.

In the above-described Embodiment 4, of the regions above the scanning signal line 11, only a transistor formed region is a region where the first amorphous silicon layer and the second amorphous silicon layer are provided in a self-aligned manner with the source wire and the drain wire; and of the regions above the storage capacitor line 16, only a storage capacitor formed region includes the second amorphous silicon layer and the first amorphous silicon layer, each of which is the semiconductor layer. In terms of these points, Embodiment 4 is different from Embodiment 3. The insulated gate transistor (TFT) of Embodiment 4 has the same performance as that of Embodiment 3.

[Embodiment 5]

Next, the following will describe Embodiment 5.

A liquid crystal display device 100 of Embodiment 5 has the same configuration as that of the liquid crystal display device 100 of Embodiment 1, which has been described with reference to FIGS. 1 and 2. Therefore, explanations of the liquid crystal display device 100 of Embodiment 5 are omitted here.

The following will describe, with reference to FIGS. 27 through 30, a method for manufacturing a liquid crystal panel 70 of Embodiment 5. Particularly, the following will concretely describe a method for manufacturing an active matrix substrate 71 included in the liquid crystal panel 70.

(First Step: Step of Forming Scanning Signal Line and Semiconductor Layer)

In Embodiment 5, as well as in Embodiment 1, first, a first metal layer (i.e., a metal layer for a scanning signal line) having a film thickness of approximately 0.1 µm through approximately 0.3 µm is deposited on one main surface of a glass substrate 2 by a vacuum film forming device such as SPT. Subsequently, a PCVD device is used to sequentially deposit, on the entire surface of the glass substrate 2, three types of thin film layers, i.e., a first SiNx layer 30, a first amorphous silicon layer 31, and a second amorphous silicon layer 33, so that the first SiNx layer 30, the first amorphous silicon layer 31, and the second amorphous silicon layer 33 have film thicknesses of, e.g., approximately 0.3 µm, approximately 0.2 µm, and approximately 0.05 µm, respectively.

Then, as indicated in Patent Literature 6, by means of a halftone exposure technique, photosensitive resin patterns 84A and 84B (i.e., a first photosensitive resin pattern) are formed on the second amorphous silicon layer 33 such that (i) the pattern 84A, corresponding to a scanning signal line 11 and a storage capacitor line 16, has a film thickness of, e.g., 2 µm and (ii) the pattern 84B, corresponding to a transistor formed region on a gate electrode 11A, has a film thickness of, e.g., 1 µm. Thereafter, as shown in (a) of FIG. 27 and (a) of FIG. 29, by use of the photosensitive resin patterns 84A and 84B as a mask, the second amorphous silicon layer 33, the first amorphous silicon layer 31, the gate insulative layer 30, and also the first metal layer are selectively removed, so that the glass substrate 2 is exposed.

Thus, a multiple-layer film pattern (a pattern of a laminated structure) including a second amorphous silicon layer 33A, a first amorphous silicon layer 31A, a gate insulative layer 30A, and the scanning signal line 11 is obtained. Thereafter, the entire surface of the glass substrate 2 is subjected to a plasma process with a Freon gas, e.g., $CF_4$. Since the glass substrate 2 is inorganic, the surface of the glass substrate 2 is hardly fluorinated. On the other hand, since the photosensitive resin patterns 84A and 84B are organic resins, surfaces of the photosensitive resin patterns 84A and 84B are easily fluorinated and consequently become photosensitive resin patterns 84A1 and 84B1. Fluorination of the surface is possible as long as the surface has a depth of 100 Å or more.

Figure 27:
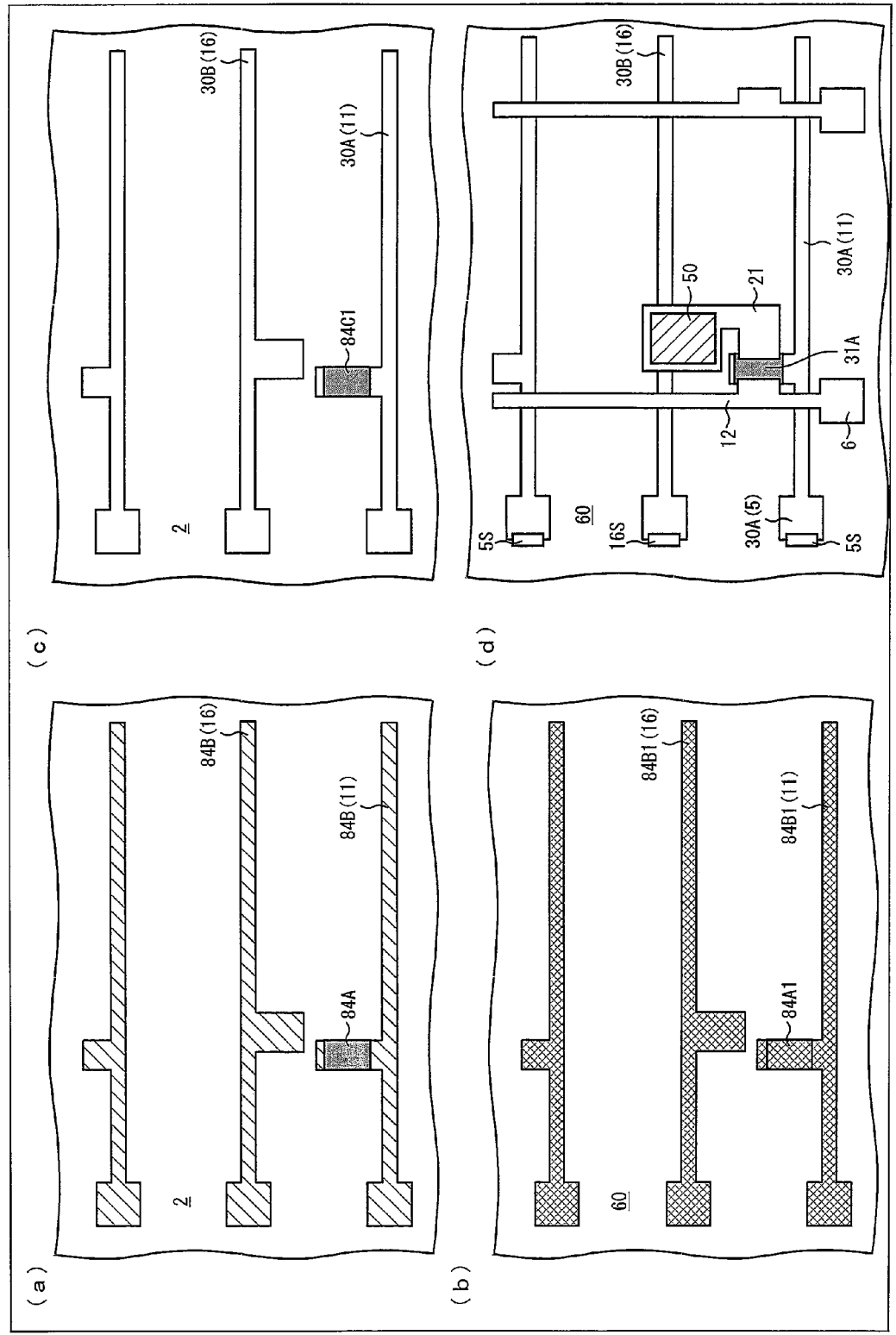
FIG. 27
Figure 29:
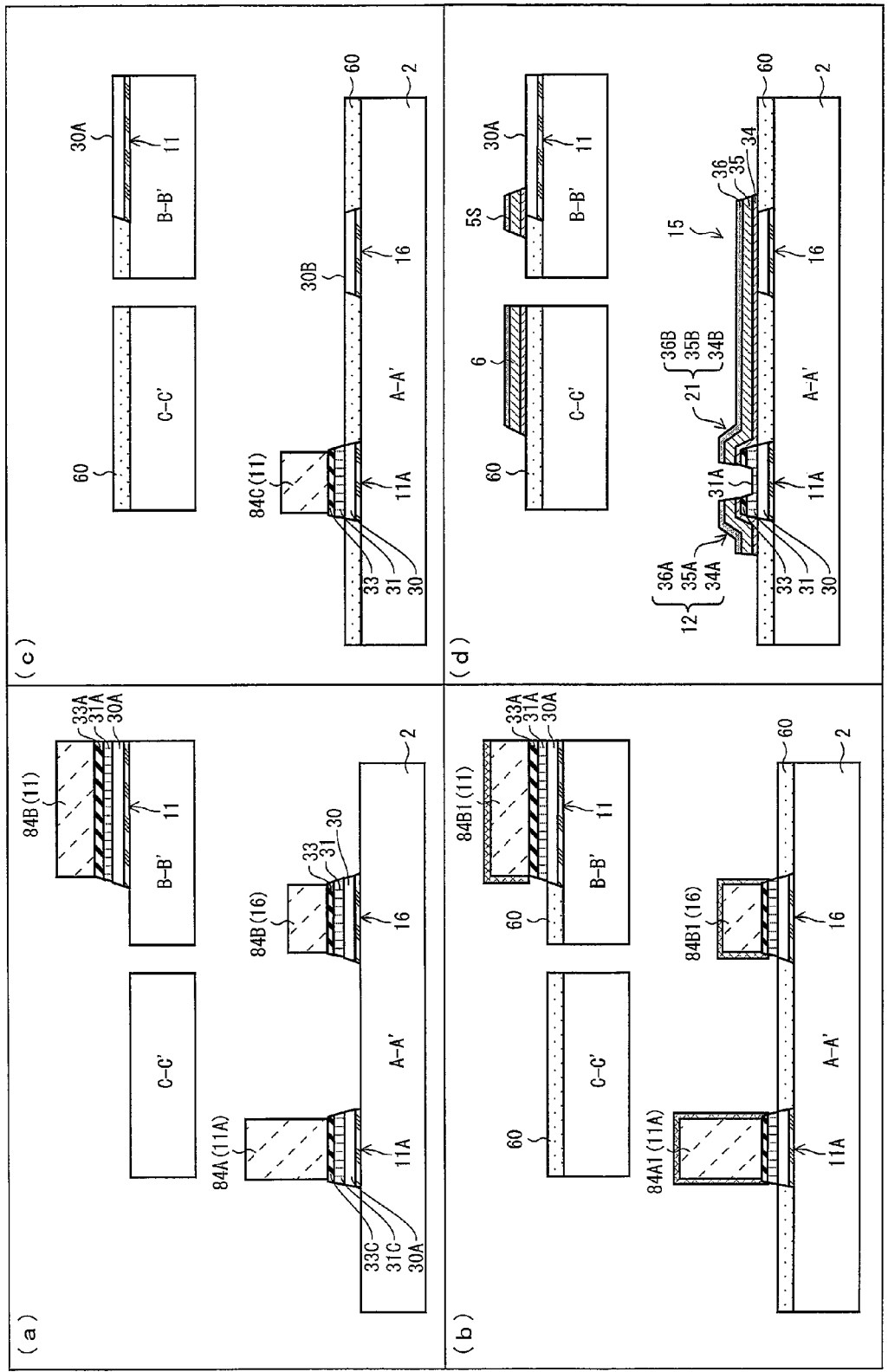
FIG. 29

Next, as shown in (b) of FIG. 27 and (b) of FIG. 29, a coating type transparent insulative resin is applied onto the glass substrate 2. Here, applied as the coating type transparent insulative resin is a transparent resin (transparent inorganic insulative resin) which is inorganic and is prepared by dissolving oxide silicon fine powder and a binder in a solvent. Since the photosensitive resin patterns 84A1 and 84B1, which have been fluorinated, have water repellency, the transparent insulative resin is repelled by the photosensitive resin patterns 84A1 and 84B1, so that the transparent insulative resin is applied in a self-aligned manner onto a region excluding the photosensitive resin patterns 84A1 and 84B1. In Embodiment 5, the transparent insulative resin is applied so as to have substantially the same film thickness as that of a lamination of the scanning signal line 11 and the gate insulative layer 30A, unlike in Embodiments 1 through 4. The reason for this will be described later.

After filling a space in the multiple-layer film pattern with the transparent insulative resin 60, a solvent contained in the transparent insulative resin 60 is heated and evaporated, in order to prevent the solvent from hindering removal using a resist removing solution. Thereafter, a polymer is removed from the fluorinated surface by ashing means such as oxygen plasma, and a film thickness of each of the photosensitive resin patterns 84A1 and 84B1 is reduced by 1 μm or more. Consequently, the photosensitive resin pattern 84B1 disappears. This allows the second amorphous silicon layer 33A above the scanning signal line 11 and the second amorphous silicon layer 33B above the storage capacitor line 16 to be exposed, and also enables to selectively form a photosensitive resin pattern 84C only on the transistor formed region on the gate electrode 11A. However, in a case where the transparent insulative resin 60 is an acrylic resin, the transparent insulative resin 60 loses its thickness and disappears when subjected to the oxygen plasma process. Therefore, unlike in Embodiment 3, an acrylic resin cannot be used as the coating-type transparent insulative resin.

In view of this, as shown in (c) of FIG. 27 and (c) of FIG. 29, by use of the photosensitive resin pattern 84C as a mask, (i) the second amorphous silicon layer 33A and the first amorphous silicon layer 31A above the scanning signal line 11 are removed so as to expose the gate insulative layer 30A, and (ii) the second amorphous silicon layer 33B and the first amorphous silicon layer 31B above the storage capacitor line 16 are removed so as to expose the gate insulative layer 30B. Thereafter, the photosensitive resin pattern 84C is removed by use of the resist removing solution. Further, a heating process is carried out at a temperature as high as possible (typically, at approximately 250° C.) in a range in which film qualities of the amorphous silicon layers 31A and 33A are not deteriorated. Consequently, the transparent insulative layer 60 attains improved film quality.

(Second Step: Step of Forming Source Wire and Drain Wire)

Subsequently, a step of forming a source wire and a drain wire is carried out. In this step, on the entire surface of the glass substrate 2, a second metal layer (i.e., a metal layer for a source wire and a drain wire) is deposited. Thereafter, as shown in (d) of FIG. 27 and (d) of FIG. 29, the second metal layer is etched by a microfabrication technology using a photosensitive resin pattern (i.e., a second photosensitive resin pattern). This selectively forms a data signal line 12 and a drain electrode 21 of an insulated gate transistor. The data signal line 12, which serves also as a source wire of the insulated gate transistor, includes a connection region 6 of the data signal line, which connection region is located outside an image display section, and partially overlaps the gate electrode 11A. The drain electrode 21 partially overlaps the storage capacitor line 16, includes a storage electrode forming a storage capacitor 15, and partially overlaps the gate electrode 11A.

Subsequently, between the source wire 12 and the drain wire 21, the second amorphous silicon layer 33A and the first amorphous silicon layer 31A are sequentially etched. The first amorphous silicon layer 31A is etched so as to be left to have a thickness of approximately 0.05 μm through approximately 0.1 μm. Note that, concurrently with the formation of the source wire 12 and the drain wire 21, (i) a height difference offsetting electrode 5S, which covers a boundary between a connection region 5 of the scanning signal line and the transparent insulative layer 60, and (ii) a height difference offsetting electrode 16S, which covers a boundary between a connection region of the storage capacitor line 16 and the transparent insulative layer 60, are formed. A configuration of the second metal layer is as already described.

(Third Step: Step of Forming Opening in Passivation Insulative Layer)

After the source wire 12 and the drain wire 21 are formed, a second SiNx layer having a film thickness of approximately 0.3 μm is deposited on the entire surface of the glass substrate 2 as a transparent insulative layer, as with Embodiment 4. Thus, a passivation insulative layer 37 is formed. Thereafter, as shown in (a) of FIG. 28 and (a) of FIG. 30, a photosensitive resin pattern 88 (i.e., a third photosensitive resin pattern) having an opening 38 (i.e., a first opening), an opening 63 (i.e., a second opening), and an opening 64 (i.e., a third opening) is formed. The opening 38 is provided so as to correspond to a pixel electrode formed region including a part of the drain electrode 21 and a part of the storage electrode 72. The opening 63 is provided above the connection region 5 of the scanning signal line 11, which connection region 5 is located outside an image display section and includes the height difference offsetting electrode 5S. The opening 64 is provided above the connection region 6 of the data signal line 12. The photosensitive resin pattern 88 has, in each of the openings, a cross section having an inverse tapered shape.

By use of the photosensitive resin pattern 88 as a mask, parts of the passivation insulative layer 37 which parts correspond to the openings 38 and 64 are removed, so as to expose a part of the transparent insulative layer 60, a part of the drain electrode 21, a part of the storage electrode 72, and the connection region 6 between the transparent insulative layer 60 and the data signal line 12. Further, a part of the passivation insulative layer 37 and a part of the gate insulative layer 30A which parts correspond to the opening 63 are removed, so as to expose the connection region 5 between the height difference offsetting electrode 5S and the scanning signal line 11. Note that a part of the passivation insulative layer 37 and a part of the gate insulative layer 30B which parts correspond to the opening 65 are also removed, so as to expose a connection region between the height difference offsetting electrode 16S and the storage capacitor line 16.

Figure 28:
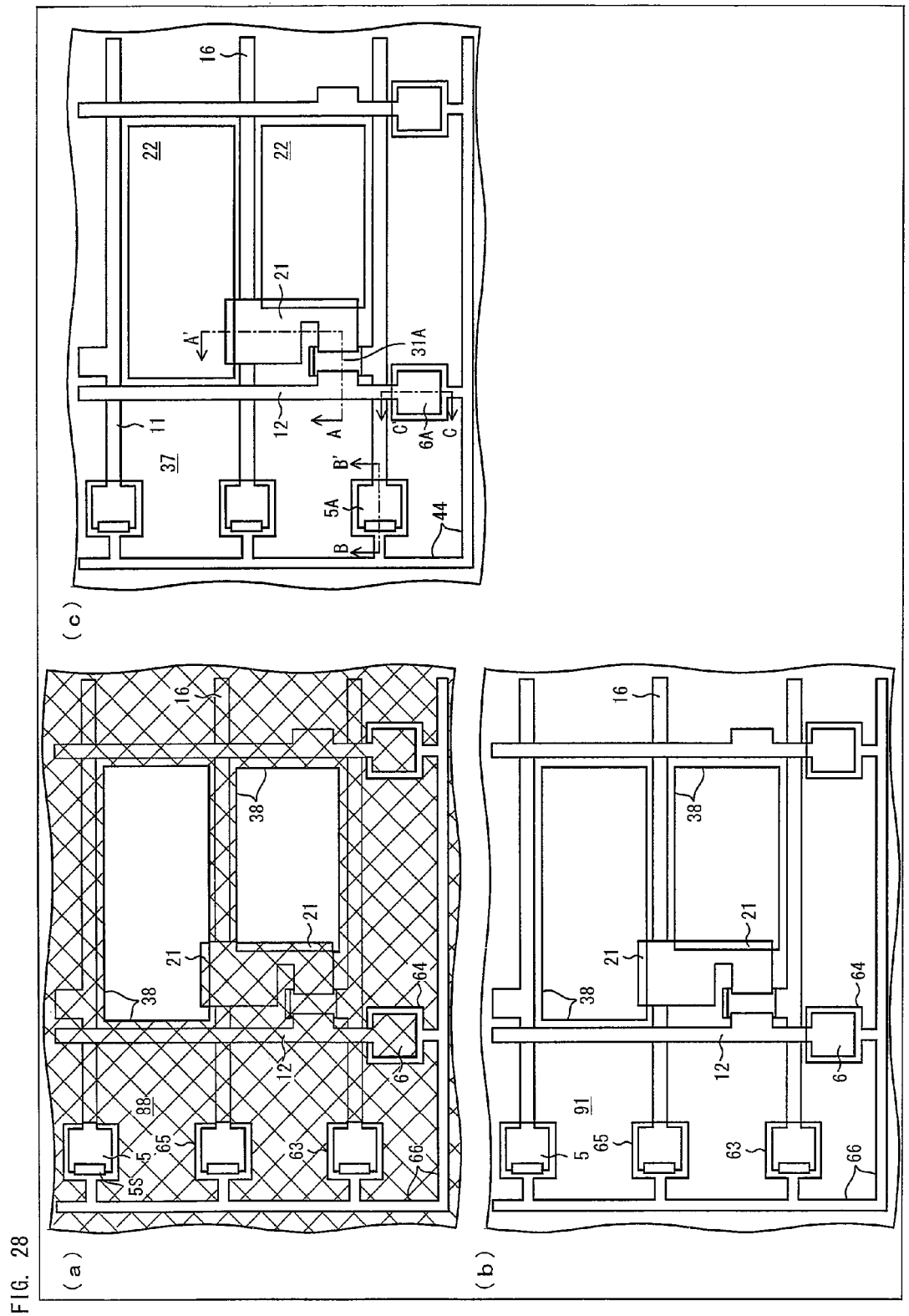
FIG. 28

Subsequently, as shown in (b) of FIG. 28 and (b) of FIG. 30, a transparent electrically conductive layer 91 is deposited on the glass substrate 2 by a vacuum film forming device such as SPT, without removing the photosensitive resin pattern 88. At this time, deposited as the transparent electrically conductive layer 91 is ITO, IZO, or mixed crystal thereof having a film thickness of approximately 0.1 μm. Further, the photosensitive resin pattern 88 is removed by use of a resist removing solution or a specific organic solvent. Consequently, as shown in (c) of FIG. 28 and (c) of FIG. 30, a pixel electrode 22 is formed in a self-aligned manner on a region of the transparent insulative layer 60, which region is located inside the opening 38 and corresponds to the pixel electrode formed region including a part of the drain electrode 21 and a part of the storage electrode 72. Furthermore, an electrode terminal 5A of the scanning signal line is formed in a self-aligned manner in the opening 63, which includes the part (connection region) 5 of the scanning signal line and the height difference offsetting electrode 5S. Moreover, an electrode terminal 6A of the data signal line is formed in a self-aligned manner in the opening 64, which includes the part (connection region) 6 of the data signal line 12. In addition, the passivation insulative layer 37 on the glass substrate 2 is exposed, which bring the process for manufacturing the active matrix substrate 71 to the end. Note that, also in the opening 65, an electrode terminal (not given a reference number) of the storage capacitor line is formed, the electrode terminal being made of the transparent electrically conductive layer.

The active matrix substrate 71 obtained in this manner and a color filter substrate 9 are bonded to each other, so that a liquid crystal panel is obtained. Thus, the manufacturing process of Embodiment 5 is completed. As for a configuration of a storage capacitor 15, the following example is illustrated: As shown in (d) of FIG. 27, the storage capacitor 15 is made of (i) the storage electrode 72, which serves also as the drain electrode 21, and (ii) the storage capacitor line 16, the storage electrode 72 and the storage capacitor line 16 overlapping each other via the gate insulative layer 30B, when viewed in a plan view (a part of the region 50 hatched with lines sloping from left to right). Comparing with the configuration of Embodiment 4, the configuration of Embodiment 5 provides a greater storage capacitor 15, provided that an area of the storage electrode 72 of Embodiment 5 is identical to that of Embodiment 4.

As described above, Embodiment 5 employs (i) the step of forming the scanning signal line and the semiconductor layer by use of the halftone exposure technique (including the step of patterning the semiconductor layer into islands), (ii) the step of forming the source wire and the drain wire, and (iii) the step of forming the openings in the passivation insulative layer and forming the pixel electrode, thereby making it possible to produce the active matrix substrate by use of three photo masks.

(Modification of Embodiment 5)

The active matrix substrate of Embodiment 5, which is manufactured in the streamlined manner, employs TN liquid crystal. By modifying the shape of the pixel electrode, the present invention is also effective in IPS liquid crystal and vertical alignment liquid crystal, each of which provides a wide viewing angle. This will be described below as a part of Embodiment 5.

Here, a basic structure of an IPS liquid crystal panel is applied to the active matrix substrate 71 of Embodiment 5. Then, as shown in (a) of FIG. 31 and (a) of FIG. 32, a plurality of counter electrodes 16A and a plurality of pixel electrodes 21A are formed so as to be away from each other by a predetermined distance. The counter electrodes 16A, which are shaped in stripes, are made of a transparent electrically conductive layer formed in an opening provided in a passivation insulative layer 37 on a transparent insulative layer 60. The pixel electrodes 21A, which are shaped in stripes, are made of a second metal layer connected with a drain electrode 21.

Alternatively, it is possible to provide an IPS liquid crystal panel having a different configuration, in which a position of a counter electrode is changed.

In this case, as shown in (b) of FIG. 31 and (b) of FIG. 32, a plurality of counter electrodes 16A and pixel electrodes 16C are formed so as to be away from each other by a predetermined distance. The counter electrodes 16A, which are shaped in stripes, are made of a transparent electrically conductive layer formed in an opening provided in a passivation insulative layer 37 on a transparent insulative layer 60. The pixel electrodes 16C are made of the transparent electrically conductive layer in an opening provided in the passivation insulative layer 37 on the transparent insulative layer 60 so as to include a part of a drain electrode 21.

In the former IPS liquid crystal panel, although the pixel electrode 21A, which is made of the second metal layer, and the counter electrode 16A, which is made of the transparent electrically conductive layer, are both formed on the transparent insulative layer 60, the pixel electrode 21A is covered with the passivation insulative layer 37; therefore, the possibility of occurrence of a short circuit between these electrodes is low. However, it is highly possible that unevenness of luminance occurs in a display image unless pattern alignment accuracy of these electrodes is high. On the contrary, in the latter IPS liquid crystal panel, since the counter electrode 16A and the pixel electrode 16C, each of which is made of the transparent electrically conductive layer, are both formed on the transparent insulative layer 60, the possibility of occurrence of a short circuit between these electrodes is high. However, with the distance between these electrodes, there is no possibility of occurrence of unevenness of luminance in a display image due to effects of the pattern alignment accuracy. Further, the latter IPS liquid crystal panel is configured not to include an insulative layer existing on the counter electrode 16A or the pixel electrode 16C, each of which is a display electrode. Therefore, comparing the former and latter IPS liquid crystal panels, the latter IPS liquid crystal panel has an advantage of causing less image sticking in a display image.

Alignment regulation means which can be formed in an active matrix substrate 71 included in a vertical alignment liquid crystal panel is a slit provided in a pixel electrode or a projection provided on the pixel electrode. In Embodiment 5, the slit and the projection are formed concurrently, due to the specificity in the step of forming the pixel electrode. As a result, as shown in (c) of FIG. 31 and (c) of FIG. 32, pixel electrodes 22-1 through 22-4, which are transparent and electrically conductive and are shaped in a plurality of stripes, are connected with a drain electrode 21 via a storage electrode 72. Further, in order to provide multi domain, the pixel electrode 22-1 and the pixel electrode 22-3 are formed so that they are substantially orthogonal to each other, and the pixel electrode 22-2 and the pixel electrode 22-4 are formed so that they are substantially orthogonal to each other. There exists a passivation insulative layer 37P in (i) a space between the pixel electrode 22-1 and the pixel electrode 22-2 and (ii) a space between the pixel electrode 22-3 and the pixel electrode 22-4, the insulative layer 37P in each space serving as a projection 41.

In the above-described Embodiment 5, of the regions above the scanning signal line 11, only the transistor formed region is a region where the first amorphous silicon layer and the second amorphous silicon layer exist in a self-aligned manner with the scanning signal line 11; and a storage capacitor 15 has a greater value, provided that an area of the storage electrode 72 of Embodiment 5 is identical to that of Embodiment 3. In terms of these points, Embodiment 5 is different from Embodiment 3.

Lastly, the following will describe a relationship between the film thickness of the height difference offsetting electrode 5S and that of the transparent insulative layer 60. The height difference offsetting electrode 5S is provided so as to deal with the following problem: If there exists a difference in film thickness between (i) the transparent insulative layer 60 exposed in the opening 63 and (ii) the multiple-layer film pattern including the scanning signal line 11, the gate insulative layer 30A, and other thin films, the transparent electrically conductive layer having a film thickness of as thin as approximately 0.1 µm may tear when a static electricity countermeasure line 44 is formed which is connected with the electrode terminal 5A of the scanning signal line, since the transparent insulative layer 60 has a cross section having an inverse tapered shape due to its forming step. This results in disconnection between the electrode terminal 5A of the scanning signal line and the static electricity countermeasure line 44, which is connected with the electrode terminal 5A.

In order to deal with this, for example, in the TN liquid crystal panel of each of Embodiments 3 and 4, the transparent insulative layer 60 is formed so as to fill a space beside the multiple-layer film pattern which is made of the lamination of the scanning signal line 11, the gate insulative layer 30A, the first amorphous silicon layer 31A, and the second amorphous silicon 33A. This prevents occurrence of a height difference in a boundary between the transparent insulative layer 60 and the multiple-layer film pattern.

Alternatively, by modifying the IPS liquid crystal panel and the vertical alignment liquid crystal panel of each of Embodiments 3 and 4 so that the transparent insulative layer 60 is formed to have substantially the same film thickness as that of the laminated pattern including the scanning signal line 11 and the gate insulative layer 30A, it is possible to prevent occurrence of a height difference in a boundary between the transparent insulative layer 60 and the laminated pattern. From this viewpoint, the TN liquid crystal panel of Embodiment 5 is configured to include the transparent insulative layer 60 which is formed to have substantially the same film thickness as that of the lamination of the scanning signal line 11 and the gate insulative layer 30A.

Thus, it is important to set an applied thickness of the transparent insulative layer 60 so as not to cause an inverse tapered shape in a boundary of the base pattern which is exposed in the opening 63. In Embodiments 3 through 5, the height difference offsetting electrode 5S is not essential, provided that the applied thickness of the transparent insulative layer 60 is set optimally. However, providing the height difference offsetting electrode 5S can reduce the possibility of occurrence of disconnection between (i) the electrode terminal 5A of the scanning signal line, which is made of the transparent electrically conductive layer, and (ii) the static electricity countermeasure line 44.

Thus, embodiments of the present invention have been explained as Embodiments 1 through 5.

The above descriptions are summarized as follows: The technique of each embodiment is for making it possible to manufacture an active matrix substrate through a three-mask process by combining the below-described technique (a) and either one of the below-described techniques (b) and (c). The technique (a) is a novel technique provided by the present invention, whereas the technique (b) is described in Patent Literature 2 and the technique (c) is described in Patent Literature 3.

(a): A technique for reducing the number of steps, which technique concurrently forms a scanning signal line and a semiconductor layer, by (i) forming a multiple-layer film pattern made of a lamination of a scanning signal line, a gate insulative layer, and a semiconductor layer by use of a photosensitive resin pattern, and by (ii) filling a space in the multiple-layer film pattern with a transparent insulative resin by utilizing water repellency of the photosensitive resin pattern having been fluorinated, so that a side surface of the scanning signal line is made insulative.

(b): A technique for reducing the number of steps, which technique eliminates the need for a photo-etching step in forming a pixel electrode, by (i) forming a data signal line and a pseudo pixel electrode (drain electrode), each made of a multiple-layer film pattern including a transparent electrically conductive layer, and by (ii) exposing a transparent electrically conductive pixel electrode in the pseudo pixel electrode when forming an opening in a passivation insulative layer.

(c): A technique for reducing the number of steps, which technique eliminates the need for a photo-etching step in forming a pixel electrode, by (i) forming an opening in a passivation insulative layer by use of a photosensitive resin pattern whose cross section has an inverse tapered shape, by (ii) depositing a transparent electrically conductive layer, and by (iii) subjecting the transparent electrically conductive layer to lift-off by use of the photosensitive resin pattern as a lift-off material.

As described previously, the present invention involves, in order to manufacture an active matrix substrate, (i) a step of selectively forming a laminated pattern including an electrically conductive layer (metal layer), an insulative layer, and a semiconductor layer on one main surface of a transparent insulative substrate by use of a photosensitive resin pattern, (ii) a step of fluorinating a surface of the photosensitive resin pattern by dry etching with a fluorine gas, (iii) a step of applying a coating-type transparent insulative resin, and (iv) a step of removing the photosensitive resin pattern having been fluorinated. Further, according to the manufacturing method of the present invention, it is possible to provide an active matrix substrate including (i) a transparent insulative substrate having one main surface on which a laminated pattern including an electrically conductive layer (metal layer), an insulative layer, and a semiconductor layer is formed and (ii) a transparent insulative layer, which is formed so as to cover a side surface of the electrically conductive layer and has a film thickness equal to or greater than that of a lamination of the electrically conductive layer and a gate insulative layer.

Consequently, even in a case where a scanning signal line pattern including a metal layer, a gate insulative layer, and a semiconductor layer (and a storage capacitor line pattern) are formed with a single photo mask, it is possible to provide an active matrix substrate with (i) the scanning signal line pattern (and the storage capacitor line pattern) and (ii) a data signal line pattern intersecting with each other, since an insulative layer is formed so as to cover a side surface of the metal layer and accordingly the metal layer is made insulative. Furthermore, since the semiconductor layer is formed only above the scanning signal line, there is no possibility that, while an insulated gate transistor is off, an amount of leakage current is increased due to light irradiation from a backside light source. Therefore, the step of patterning the semiconductor layer into islands is not necessarily required. In other words, it is possible to eliminate the step of patterning the semiconductor layer into islands, thereby enabling streamlining of the manufacturing process.

Moreover, by (i) forming a data signal line and a pseudo pixel electrode, each of which is made of a lamination of a transparent electrically conductive layer and a metal layer for a source wire and a drain wire, and by (ii) removing the metal layer, of which the pseudo pixel electrode is made, when forming an opening in a passivation insulative layer, it is possible to eliminate the need for independently carrying out the step of forming the pixel electrode, thereby enabling streamlining of the manufacturing process.

Alternatively, the present invention may employ the following technique for streamlining the step of forming the pixel electrode: In a step of forming an opening through which a pixel electrode is connected with a drain electrode, a passivation insulative layer in a pixel electrode formed region is removed so as to expose a transparent insulative layer, and a pixel electrode is formed on the transparent insulative layer by lift-off so that the pixel electrode includes a drain electrode exposed. In view of the pattern design for reliably securing connection to the scanning signal line, a height difference offsetting electrode is provided.

Furthermore, it is also possible to selectively remove the semiconductor layer above the scanning signal line, although this requires halftone exposure. This selective removal prevents formation of a parasitic transistor, thereby reducing an amount of leakage current from the insulated gate transistor to the minimum. Consequently, stability of a display image is increased.

In addition, one example of the present invention can employ the technique described in Patent Literature 4 in forming the opening in the passivation insulative layer. Namely, a black pigment-dispersed photosensitive resin is used instead of a generally-used photosensitive resin, and is left on an active matrix substrate without removing it. This eliminates a step of forming BM from a process for manufacturing a color filter substrate. With this, it is possible to expect not only a reduction of cost of a liquid crystal display device but also improvement of an aperture ratio.

From the pseudo pixel electrode made of the lamination of the transparent electrically conductive layer and the metal layer for the source wire and the drain wire, the metal layer for the source wire and the drain wire may not be removed. This makes it possible to provide a reflective liquid crystal display device. Alternatively, from such the pseudo pixel electrode, the metal layer for the source wire and the drain wire may be partially removed. This makes it possible to provide a transflective liquid crystal display device. However, the reflective liquid crystal display device requires a pixel electrode having a base layer (not illustrated) with recesses having a depth of approximately 0.5 μm through 1 μm, in order to avoid specular reflection. Accordingly, the number of steps for manufacturing an active matrix substrate inevitably increases. Needless to say, such a layer with recesses is necessary also in the streamlined method for manufacturing a pixel electrode by lift-off.

Thus, the present invention is effective not only in a transmissive liquid crystal display device but also in reflective and transflective liquid crystal display devices. In addition, with the same manufacturing method but with a modification to the pattern shape of the pixel electrode which is transparent and electrically conductive, the present invention is effective not only in TN liquid crystal but also in IPS liquid crystal, which is driven by a lateral electric field, and in vertical alignment liquid crystal. Thus, it is possible to attain two objects at once, i.e., a reduction in the number of steps and improvement of a viewing angle.

Furthermore, according to the present invention, a TN liquid crystal panel, an IPS liquid crystal panel, and a vertical alignment liquid crystal panel can be obtained by the same active matrix substrate manufacturing process, regardless of the type of the liquid crystal device. Thus, with the present invention, it is possible to avoid a loss caused by changing a production system in order to change a product type to be manufactured. Accordingly, a production line for a larger scale of mass production can receive the merit of the present invention more.

The point of the present invention is, as is clear from the above descriptions, to manufacture an active matrix substrate by use of three photo masks through (i) the step of concurrently forming a scanning signal line and a semiconductor layer and forming a transparent insulative layer so as to cover a side surface of the scanning signal line, (ii) the step of forming a source wire and a drain wire, and (iii) the step of forming an opening in a passivation insulative layer. Thus, it is clear that the present invention can reduce the number of manufacturing steps, particularly, the number of times for carrying out a photo-etching step. This markedly reduces the manufacturing cost of the active matrix substrate, thereby greatly contributing to a reduction of the cost of a liquid crystal display device. Further, the wire materials of the scanning signal line and the data signal line only need to be capable of preventing them from working as a battery when laminated with the transparent electrically conductive layer. Thus, it is clear that the present invention encompasses use of Al and/or copper for lower resistance. Further, of course, the present invention also encompasses (i) liquid crystal display devices including gate insulative layers and/or others having different materials and/or different film thicknesses and (ii) manufacturing methods therefor. Furthermore, the present invention is effective not only in a transmissive liquid crystal display device but also in a reflective liquid crystal display device and a transflective liquid crystal display device, and it is also clear that the semiconductor layer of the insulated gate transistor is not limited to an amorphous silicon layer.

An active matrix substrate (i.e., a substrate for a display device) of the present invention, a liquid crystal display device of the present invention, and a manufacturing method therefor can also be expressed as follows:

(1) A substrate for a display device includes (a) a transparent insulative substrate having one main surface on which a laminated pattern including an electrically conductive layer, an insulative layer, and a semiconductor layer is formed and (b) a transparent insulative layer, provided in a space in the laminated pattern, which has a film thickness equal to or greater than that of the insulative layer.

According to this configuration, the insulative layer is formed so as to cover a side surface of the electrically conductive layer, and accordingly the electrically conductive layer is made insulative. This makes it possible to provide an active matrix substrate with (a) the laminated pattern and (b) another electrically conductive pattern intersecting with each other.

A specific configuration of a liquid crystal display device including the substrate for the display device described in (1) will be described in (2) through (6) below in details. Firstly described are (2) and (3), each of which is a liquid crystal display device obtained as a result of employing a pseudo pixel electrode made of a lamination of a transparent electrically conductive layer and a metal layer for a signal line, so as to streamline a step of forming a pixel electrode.

(2) A liquid crystal display device is configured to include, as a switching element, a channel-etch type insulated gate transistor, the liquid crystal display device including:

a first transparent insulative substrate;

a scanning line (gate wire), provided on one main surface of the first transparent insulative substrate, which is made of a metal layer;

a gate insulative layer deposited on a region of the scanning line, the region not including an electrode terminal of the scanning line which electrode terminal is located outside an image display section;

a first semiconductor layer deposited thereon, the first semiconductor layer being a pair of source and drain regions, the first semiconductor layer having a great film thickness, and the first semiconductor layer containing no impurity;

a second semiconductor layer deposited on the source and drain regions and on an intersection region where the scanning line and a signal line intersect with each other, the second semiconductor layer being to be formed into a source and a drain, and the second semiconductor layer containing an impurity;

a heat resistant metal layer provided on the second semiconductor layer;

a transparent insulative layer which is provided on a region of the one main surface of the first transparent insulative substrate, the region not including the scanning line, and the transparent insulative layer having a film thickness equal to or greater than that of a lamination of the scanning line and the gate insulative layer;

the signal line (source wire) provided on the heat resistant metal layer and the transparent insulative layer so as to correspond to the source region and said intersection region, and the signal line being made of a lamination of a transparent electrically conductive layer and at least one buffer metal layer;

a pseudo pixel electrode provided on the heat resistant metal layer and the transparent insulative layer so as to correspond to the drain region, the pseudo pixel electrode being made of the lamination of the transparent electrically conductive layer and said at least one buffer metal layer, and the pseudo pixel electrode serving also as a drain wire; and a passivation insulative layer provided on the first transparent insulative substrate, the passivation insulative layer having first, second, and third openings, the first opening being provided above the electrode terminal of the scanning line, the second opening being provided above a pseudo electrode terminal of the signal line which pseudo electrode terminal is located outside the image display section, and the third opening being provided above the pseudo pixel electrode, the electrode terminal of the scanning line made of the metal layer being exposed in the first opening, and parts of said at least one buffer metal layer which parts respectively correspond to the second and third openings being removed, so that an electrode terminal of the signal line is exposed in the second opening and a pixel electrode is exposed in the third opening, each of electrode terminal of the signal line and the pixel electrode being made of the transparent electrically conductive layer.

According to the above configuration, in the liquid crystal display device of (2), a side surface of the scanning line made of the metal layer is made insulative by the transparent insulative layer, and accordingly the scanning line and the signal line can be arranged in multiple layers. Further, the pixel electrode are formed concurrently with the formation of the source and drain wires. Therefore, the buffer metal layer needs to be provided in the source and drain wires, which include aluminum or an aluminum-based material, in order to prevent reduction of the transparent electrically conductive layer in a developing step using an alkaline developer and a resist removing step using an alkaline removing solution. Note that, since the above configuration cannot connect the electrode terminal of the scanning line with the electrode terminal of the signal line by an electrically conductive member, a measure against static electricity should be carefully considered.

(3) As well as in the above configuration, a liquid crystal display device is configured to include:

a first transparent insulative substrate;

a scanning line (gate wire), provided on one main surface of the first transparent insulative substrate, which is made of a metal layer;

a gate insulative layer deposited on a region of the scanning line, the region not including a connection region of the scanning line which connection region is located outside an image display section;

a first semiconductor layer deposited thereon, the first semiconductor layer being a pair of source and drain regions, the first semiconductor layer having a great film thickness, and the first semiconductor layer containing no impurity;

a second semiconductor layer deposited on the source and drain regions and on an intersection region where the scanning line and a signal line intersect with each other, the second semiconductor layer being to be formed into a source and a drain, and the second semiconductor layer containing an impurity;

a heat resistant metal layer provided on the second semiconductor layer;

a transparent insulative layer which is provided on a region of the one main surface of the first transparent insulative substrate, the region not including the scanning line, and the transparent insulative layer having a film thickness equal to or greater than that of a lamination of the scanning line and the gate insulative layer;

a pseudo electrode terminal of the scanning line provided on the transparent insulative layer and the heat resistant metal layer so as to include said connection region, the pseudo electrode terminal being made of a lamination of a transparent electrically conductive layer and at least one buffer metal layer;

the signal line (source wire) provided on the heat resistant metal layer and the transparent insulative layer so as to correspond to the source region and said intersection region, and the signal line being made of the lamination of the transparent electrically conductive layer and said at least one buffer metal layer;

a pseudo pixel electrode provided on the heat resistant metal layer and the transparent insulative layer so as to correspond to the drain region, the pseudo pixel electrode being made of the lamination of the transparent electrically conductive layer and said at least one buffer metal layer, the pseudo pixel electrode serving also as a drain wire; and a passivation insulative layer provided on the first transparent insulative substrate, the passivation insulative layer having openings, the opening being provided above (a) the pseudo electrode terminal of the scanning line, (b) a pseudo electrode terminal of the signal line which pseudo electrode terminal is provided outside the image display section, and (c) the pseudo pixel electrode, respectively, parts of said at least one buffer metal layer which parts correspond to the respective openings are removed, so that an electrode terminal of the scanning line, an electrode terminal of the signal line, and a pixel electrode are exposed in the openings, each of the electrode terminal of the scanning line, the electrode terminal of the signal line, and the pixel electrode being made of the transparent electrically conductive layer.

The liquid crystal display device of (3) has substantially the same configuration as that of the liquid crystal display device of (2). The liquid crystal display device of (3) is different from the liquid crystal display device of (2) only in terms of the configuration of the electrode terminal of the scanning line. With this, the liquid crystal display device of (3) can employ a generally-used measure against static electricity for connecting (a) the electrode terminal of the scanning line with (b) the electrode terminal of the signal line by the transparent electrically conductive layer.

Next, (4) through (6) describe a liquid crystal display device obtained as a result of introducing a lift-off technique, so as to streamline a step of forming a pixel electrode.

(4) As well as in the above configuration, a liquid crystal display device is configured to include:

a first transparent insulative substrate;

a scanning line (gate wire), provided on one main surface of the first transparent insulative substrate, which is made of a metal layer;

a gate insulative layer deposited on a region of the scanning line, the region not including a connection region;

a first semiconductor layer deposited thereon, the first semiconductor layer being a pair of source and drain regions, the first semiconductor layer having a great film thickness, and the first semiconductor layer containing no impurity;

a second semiconductor layer deposited on the source and drain regions and on an intersection region where the scanning line and a signal line intersect with each other, the second semiconductor layer being to be formed into a source and a drain, and the second semiconductor layer containing an impurity;

a transparent insulative layer which is provided on a region of the one main surface of the first transparent insulative substrate, the region not including the scanning line, and the transparent insulative layer having a film thickness equal to or greater than that of a lamination of the scanning line and the gate insulative layer;

source and drain wires provided above the source and the drain, the transparent insulative layer, and said intersection region, each of the source and drain wires being made of at least one buffer metal layer;

a height difference offsetting electrode provided on (a) a region of a lamination of the gate insulative layer, the first semiconductor layer, and the second semiconductor layer and (b) a region of the transparent insulative layer, each of the regions of the lamination and the transparent insulative layer corresponding to an end of the scanning line which end is located outside the image display section, the height difference offsetting electrode also being made of said at least one buffer metal layer; and a passivation insulative layer provided on the first transparent insulative substrate, the passivation insulative layer having openings, the openings being respectively provided in (a) a first region which is in the image display section and includes a part of the drain wire and in which a pixel electrode is to be formed, (b) a second region which is outside the image display section and in which an electrode terminal of the signal line (source wire) is to be formed, and (c) a third region which is outside the image display section and includes the height difference offsetting electrode and in which an electrode terminal of the scanning line is to be formed, the electrode terminal of the scanning line, the electrode terminal of the signal line, and the pixel electrode being provided in the first, second, and third regions, respectively, each of the electrode terminal of the scanning line, the electrode terminal of the signal line, and the pixel electrode being made of the transparent electrically conductive layer.

According to the above configuration, in the liquid crystal display device of (4), a side surface of the scanning line made of the metal layer is made insulative by the transparent insulative layer, and accordingly the scanning line and the signal line can be arranged in multiple layers. Further, the electrode terminal of the scanning line, the electrode terminal of the signal line, and the pixel electrode, each of which is made of the transparent electrically conductive layer, are formed as a result of lift-off with respect to a photosensitive resin pattern (resist) which is used to form the openings in the passivation insulative layer. Namely, these electrodes are formed in the openings in a self-aligned manner. Here, the buffer metal layer needs to be provided in the source and drain wires, which include aluminum or an aluminum-based material, in order to prevent reduction of the transparent electrically conductive layer in a resist removing step using an alkaline removing solution. Further, in the above configuration, the first semiconductor layer exists on the scanning line; therefore, attention should be paid to occurrence of crosstalk.

(5) As well as in the above configuration, a liquid crystal display device is configured to include:

a first transparent insulative substrate;

a scanning line (gate wire), provided on one main surface of the first transparent insulative substrate, which is made of a metal layer;

a gate insulative layer provided on the scanning line;

a first semiconductor layer deposited on a gate electrode, the first semiconductor layer being a pair of source and drain regions, the first semiconductor layer having a great film thickness, and the first semiconductor layer containing no impurity;

a second semiconductor layer deposited on the source and drain regions, the second semiconductor layer being to be formed into a source and a drain, and the second semiconductor layer containing an impurity;

a transparent insulative layer which is provided on a region of the one main surface of the first transparent insulative substrate, the region not including the scanning line, and the transparent insulative layer having a film thickness equal to or greater than that of a lamination of the scanning line and the gate insulative layer;

source and drain wires provided above the source and drain, the transparent insulative layer, and a region of the gate insulative layer which region corresponds to an intersection region where the scanning line and the signal line intersect with each other, each of the source and drain wires being made of at least one buffer metal layer;

a height difference offsetting electrode provided on (a) a region of a lamination of the gate insulative layer, the first semiconductor layer, and the second semiconductor layer and (b) a region of the transparent insulative layer, each of the regions of the lamination and the transparent insulative layer corresponding to an end of the scanning line which end is located outside the image display section, the height difference offsetting electrode also being made of said at least one buffer metal layer; and a passivation insulative layer provided on the first transparent insulative substrate, the passivation insulative layer having openings, the opening being provided in (a) a first region which is in the image display section and includes a part of the drain wire and in which a pixel electrode is to be formed, (b) a second region which is outside the image display section and in which an electrode terminal of the signal line (source wire) is to be formed, and (c) a third region which is outside the image display section and includes the height difference offsetting electrode and in which an electrode terminal of the scanning line is to be formed, respectively, the electrode terminal of the scanning line, the electrode terminal of the signal line, and the pixel electrode being provided in the first, second, and third regions, respectively, each of the electrode terminal of the scanning line, the electrode terminal of the signal line, and the pixel electrode being made of the transparent electrically conductive layer.

The liquid crystal display device of (5) has substantially the same configuration as that of the liquid crystal display device of (4). However, in the liquid crystal display device of (5), the first semiconductor layer does not exist on the scanning line, and therefore no crosstalk occurs.

(6) As well as in the above configuration, a liquid crystal display device is configured to include:

a first transparent insulative substrate;

a scanning line (gate wire), provided on one main surface of the first transparent insulative substrate, which is made of a metal layer;

a gate insulative layer provided on the scanning line;

a first semiconductor layer deposited on a gate electrode, the first semiconductor layer being a pair of source and drain regions, the first semiconductor layer having a great film thickness, and the first semiconductor layer containing no impurity;

a second semiconductor layer deposited on the source and drain regions, the second semiconductor layer being to be formed into a source and a drain, and the second semiconductor layer containing an impurity;

a transparent insulative layer which is provided on a region of the one main surface of the first transparent insulative substrate, the region not including the scanning line, the transparent insulative layer having a film thickness equal to or greater than that of a lamination of the scanning line and the gate insulative layer;

source and drain wires provided above the source and drain, the transparent insulative layer, and a region of the gate insulative layer which region corresponds to an intersection region where the scanning line and the signal line intersect with each other, each of the source and drain wires being made of at least one buffer metal layer;

a height difference offsetting electrode provided above (a) a region of the gate insulative layer and (b) a region of the transparent insulative layer, each of the regions of the gate insulative layer and the transparent insulative layer corresponding to an end of the scanning line which end is located outside the image display section, the height difference offsetting electrode also being made of said at least one buffer metal layer; and a passivation insulative layer provided on the first transparent insulative substrate, the passivation insulative layer having openings, the openings being respectively provided in (a) a first region which is in the image display section and includes a part of the drain wire and in which a pixel electrode is to be formed, (b) a second region which is outside the image display section and in which an electrode terminal of the signal line (source wire) is to be formed, and (c) a third region which is outside the image display section and includes the height difference offsetting electrode and in which an electrode terminal of the scanning line is to be formed, the electrode terminal of the scanning line, the electrode terminal of the signal line, and the pixel electrode being provided in the first, second, and third regions, respectively, each of the electrode terminal of the scanning line, the electrode terminal of the signal line, and the pixel electrode being made of the transparent electrically conductive layer.

The liquid crystal display device of (6) has substantially the same configuration as that of the liquid crystal display device of (5). The liquid crystal display device of (6) is different from the liquid crystal display device of (5) only in terms of (a) the configuration of the electrode terminal of the scanning line and (b) a configuration of a storage capacitor section, each of which does not include a semiconductor layer. This makes it possible to easily increase a storage capacitor.

(7) Further, the liquid crystal display device of (3) may be configured as follows: An opening including a part of the scanning line is provided in the passivation insulative layer, so that the gate insulative layer and the transparent insulative layer are exposed in the opening.

According to the configuration of (7), it is possible to prevent formation of a parasitic transistor. This makes it possible to provide an insulated gate transistor having an excellent on/off performance, thereby providing a liquid crystal display device causing less crosstalk and having high display performance.

(8) The liquid crystal display device of (2) or (3) may be configured as follows: A black pigment photosensitive resin is applied onto at least a region of the passivation insulative layer, said region corresponding to a region into which liquid crystal is to be filled.

According to the configuration of (8), it is not necessary to use a generally-used photosensitive resin in order to form the openings in the passivation insulative layer; furthermore, it is no longer necessary to carry out a step of forming BM on a color filter. In addition, since an active matrix substrate is typically manufactured by use of an exposure device having a high accuracy of mask alignment, an accuracy of positioning BM is increased accordingly, and an aperture ratio is also increased. This configuration is disclosed in Patent Literature 4.

(9) The liquid crystal display device of any one of (3) through (6) may be configured as follows: A lateral electric field is controlled by a pair of a counter electrode and the pixel electrode, the counter electrode being formed on the first transparent insulative substrate concurrently with formation of the scanning line, and the pixel electrode being formed so as to be away from the counter electrode by a predetermined distance.

According to the configuration of (9), it is possible to provide an IPS (In-Plain-Switching) liquid crystal display device, which is excellent in viewing angle characteristics. Furthermore, with the configuration in which the insulative layer does not exist on the pixel electrode, it is possible to reduce image sticking in a display image.

(10) The liquid crystal display device of any one of (3) through (6) may be configured as follows: A lateral electric field is controlled by a pair of a counter electrode and the pixel electrode, the counter electrode being formed on the transparent insulative layer so as to include a part of a common electrode, the common electrode being formed on the first transparent insulative substrate concurrently with formation of the scanning line, said part of the common electrode being exposed in an opening which is formed by removing a part of the insulative layer which part corresponds to the opening, the pixel electrode being formed the concurrently with formation of the counter electrode so as to be away from the counter electrode by a predetermined distance.

According to the configuration of (10), it is possible to provide an IPS liquid crystal display device, which is excellent in viewing angle characteristics. With the configuration in which the pixel electrode and the counter electrode both exist on the transparent insulative layer, an alignment process becomes easy, and a contrast ratio is improved. Furthermore, since the insulative layer does not exist on these display electrodes, no image sticking occurs in a display image.

(11) The liquid crystal display device of (2) or (3) may be configured so as to include: liquid crystal of vertical alignment mode, the liquid crystal aligning vertically while no voltage is applied to the liquid crystal; a plurality of slits provided on the first transparent insulative substrate, the plurality of slits being formed by removing parts of the transparent electrically conductive layer in the pixel electrodes formed on the transparent insulative layer, the plurality of slits serving as first alignment regulation means for regulating a direction in which the liquid crystal aligns in response to application of voltage to the liquid crystal; and second alignment regulation means provided on a second transparent insulative substrate or a color filter, the second alignment regulation means regulating the direction in which the liquid crystal aligns in response to application of voltage to the liquid crystal.

According to the configuration of (11), the slits (cut-out) of the pixel electrode serve as alignment regulation means for vertical alignment liquid crystal, which results in multi-domain liquid crystal cells. This makes it possible to provide a VA (Vertical-Align) liquid crystal display device, which provides a viewing angle superior to that of a TN liquid crystal display device.

(12) The liquid crystal display device of (6) may be configured so as to include: liquid crystal of vertical alignment mode, the liquid crystal aligning vertically while no voltage is applied to the liquid crystal; projections provided on the first transparent insulative substrate, the projections being located between or in a plurality of pixel electrodes which are shaped in stripes and made of the transparent electrically conductive layer formed on the transparent insulative layer, the projections including the passivation insulative layer, the projections serving as first alignment regulation means for regulating a direction in which the liquid crystal aligns in response to application of voltage to the liquid crystal; and second alignment regulation means provided on a second transparent insulative substrate or a color filter, the second alignment regulation means regulating the direction in which the liquid crystal aligns in response to application of voltage to the liquid crystal.

According to the configuration of (12), the projections, which exist between or in the stripe-shaped pixel electrodes and include the passivation insulative layer, serve as alignment regulation means for vertical alignment liquid crystal, which results in multi-domain liquid crystal cells. This makes it possible to provide a VA (Vertical Align) liquid crystal display device, which provides a viewing angle superior to that of a TN liquid crystal display device. Since the projections serving as the alignment regulation means have higher alignment regulation performance, the projections can provide a higher response speed.

(13) A method for manufacturing a substrate for a display device, the method including the steps of:

selectively forming, on one main surface of a transparent insulative substrate, a laminated pattern including an electrically conductive layer, an insulative layer, and a semiconductor layer by use of a photosensitive resin pattern;

fluorinating a surface of the photosensitive resin pattern by dry etching with a fluorine gas;

applying a transparent insulative resin of coating type so that the transparent insulative resin has a film thickness equal to or greater than that of the insulative layer; and removing the photosensitive resin pattern having been fluorinated.

According to this method, even in a case where a laminated pattern including a metal layer, a gate insulative layer, and a semiconductor layer is formed by use of a single photo mask, it is possible to provide an active matrix substrate with the laminated pattern and another electrically conductive pattern intersecting with each other, since the insulative layer is formed so as to cover a side surface of the metal layer and accordingly the metal layer is made insulative.

(14) A method for manufacturing a liquid crystal display device of (2), including the steps of:

sequentially depositing, on one main surface of a first transparent insulative substrate, a metal layer for a scanning line (gate wire), a gate insulative layer, a first amorphous silicon layer containing no impurity, a second amorphous silicon layer containing an impurity, and a heat resistant metal layer;

forming a multiple-layer film pattern corresponding to the scanning line by selectively removing the heat resistant metal layer, the second amorphous silicon layer, the first amorphous silicon layer, the gate insulative layer, and the metal layer for the scanning line by use of a photosensitive resin pattern;

fluorinating the photosensitive resin pattern by dry etching with a fluorine gas;

applying a transparent insulative resin of coating type onto the one main surface of the first transparent insulative substrate and heating it so that a solvent therein is evaporated;

forming (a) the drain wire, which serves also as a pseudo pixel electrode, and (b) a signal line (source wire), which includes a pseudo electrode terminal located outside an image display section, by removing the photosensitive resin pattern having been fluorinated, by depositing a metal layer for a source wire and a drain wire which metal layer includes a transparent electrically conductive layer and at least one buffer metal layer, and by selectively removing a part of the metal layer for the source wire and the drain wire, a part of the transparent electrically conductive layer, a part of the heat resistant metal layer, a part of the second amorphous silicon layer, and a part of the first amorphous silicon layer;

forming, on the first transparent insulative substrate, a passivation insulative layer having first, second, and third openings respectively provided above an electrode terminal of the scanning line which electrode terminal is located outside the image display section, above the pseudo pixel electrode, and above the pseudo electrode terminal of the signal line, and removing a part of the first amorphous silicon layer and a part of the gate insulative layer which parts correspond to the first opening, so as to expose the electrode terminal of the scanning line; and removing parts of the buffer metal layer which parts respectively correspond to the second and third openings, so as to expose a pixel electrode and an electrode terminal of the signal line, each of the pixel electrode and the electrode terminal of the signal line being made of the transparent electrically conductive layer.

According to the method of (14), through the step of forming the scanning line and the semiconductor layer, the step of forming the source and drain wires, and the step of forming the openings in the passivation insulative layer, it is possible to manufacture an active matrix substrate by use of three photo masks, without use of a halftone exposure technique. In this manufacturing method, the pixel electrodes which are transparent and electrically conductive are obtained by removing, in the step of forming the openings in the passivation insulative layer, parts of the metal for the source and drain wires which parts are exposed in the openings.

(15) A method for manufacturing a liquid crystal display device of (3), including the steps of:

sequentially depositing, on one main surface of a first transparent insulative substrate, a metal layer for a scanning line (gate wire), a gate insulative layer, a first amorphous silicon layer containing no impurity, a second amorphous silicon layer containing an impurity, and a heat resistant metal layer;

forming a photosensitive resin pattern on the heat resistant metal layer, the photosensitive resin pattern including (a) a first region corresponding the scanning line and (b) a second region corresponding to a connection region of the scanning line which connection region is located outside an image display section, the first region having a film thickness greater than that of the second region;

selectively removing the heat resistant metal layer, the second amorphous silicon layer, the first amorphous silicon layer, the gate insulative layer, and the metal layer for the scanning line by use of the photosensitive resin pattern as a mask;

fluorinating the photosensitive resin pattern by dry etching with a fluorine gas;

applying a transparent insulative resin of coating type onto the one main surface of the first transparent insulative substrate and heating it so that a solvent therein is evaporated;

reducing the film thicknesses of the photosensitive resin pattern, so as to expose a part of the heat resistant metal layer which part corresponds to the connection region;

selectively removing the heat resistant metal layer, the second amorphous silicon layer, the first amorphous silicon layer, and the gate insulative layer by use of, as a mask, the photosensitive resin pattern whose film thicknesses have been reduced, so as to expose a part of the scanning line which part corresponds to the connection region;

forming (a) a drain wire, which serves also as a pseudo pixel electrode, (b) a signal line (source wire), which includes a pseudo electrode terminal located outside the image display section, and (c) a pseudo electrode terminal of the scanning line which pseudo electrode terminal includes a part of the scanning line, by removing the photosensitive resin pattern whose film thicknesses have been reduced, by depositing a metal layer for the source wire and the drain wire which metal layer includes a transparent electrically conductive layer and at least one buffer metal layer, and by selectively removing a part of the metal layer for the source wire and the drain wire, a part of the transparent electrically conductive layer, a part of the heat resistant metal layer, a part of the second amorphous silicon layer, and a part of the first amorphous silicon layer; and forming, on the first transparent insulative substrate, a passivation insulative layer having openings respectively provided above the pseudo pixel electrode, above the pseudo electrode terminal of the scanning line, and above the pseudo electrode terminal of the signal line, and removing parts of the buffer metal layer which parts correspond to the respective openings, so as to expose a pixel electrode, an electrode terminal of the scanning line, and an electrode terminal of the signal line, each of the pixel electrode, the electrode terminal of the scanning line, and the electrode terminal of the signal line being made of the transparent electrically conductive layer.

According to the method of (15), through the step of forming the scanning line and the semiconductor layer by use of the halftone exposure technique and forming a contact to the scanning line, the step of forming the source and drain wires, and the step of forming the openings in the passivation insulative layer, it is possible to manufacture an active matrix substrate by use of three photo masks. Also according to this method, the pixel electrode which is transparent and electrically conductive is obtained by removing, in the step of forming the openings in the passivation insulative layer, the metal layer for the source wire and the drain wire from the pseudo pixel electrode, which is made of the lamination of the transparent electrically conductive layer and the metal layer for the source wire and the drain wire.

(16) The method of (15) may be arranged as follows: In the step of forming the openings in the passivation insulative layer, another opening is additionally formed above the scanning line by removing a part of the first amorphous silicon layer which part corresponds to said another opening, so that the gate insulative layer and the transparent insulative layer are exposed in said another opening.

According to the method of (15), it is possible to prevent formation of a parasitic transistor. This makes it possible to provide an insulated gate transistor having an excellent on/off performance, thereby providing a liquid crystal display device having high display performance.

(17) The method of (14) or (15) may be arranged as follows: The openings are formed in the passivation insulative layer by use of a black pigment photosensitive resin, and the process for forming the active matrix substrate is ended without removing it.

According to the method of (17), it is not necessary to use a generally-used photosensitive resin to form the openings in the passivation insulative layer, and it is not necessary to carry out a step of removing the black pigment photosensitive resin. Furthermore, this eliminates the need for the step of forming BM on the color filter, thereby promoting reduction of the manufacturing cost.

(18) A method for manufacturing a liquid crystal display device of (4), including the steps of:

sequentially depositing, on one main surface of a first transparent insulative substrate, a metal layer for a scanning line (gate wire), a gate insulative layer, a first amorphous silicon layer containing no impurity, and a second amorphous silicon layer containing an impurity;

forming a multiple-layer film pattern corresponding to the scanning line, by selectively removing the second amorphous silicon layer, the first amorphous silicon layer, the gate insulative layer, and the metal layer for the scanning line by use of a photosensitive resin pattern;

fluorinating the photosensitive resin pattern by dry etching with a fluorine gas;

applying a transparent insulative resin of coating type onto the one main surface of the first transparent insulative substrate and heating it so that a solvent therein is evaporated;

forming (a) a source wire and a drain wire and (b) a height difference offsetting electrode, by removing the photosensitive resin pattern having been fluorinated, by depositing a metal layer for the source wire and the drain wire which metal layer includes at least one buffer metal layer, and by selectively removing a part of the metal layer for the source wire and the drain wire, a part of the second amorphous silicon layer, and a part of the first amorphous silicon layer, the height difference offsetting electrode being positioned above a boundary between the transparent insulative layer and an end of the scanning line which end is located outside the image display section;

depositing a passivation insulative layer on the first transparent insulative substrate, and thereafter forming a photosensitive resin pattern on the first transparent insulative substrate, the photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning line is to be formed, and the third opening being provided in a third region which is outside the image display section and in which an electrode terminal of the signal line (source wire) is to be formed, the photosensitive resin pattern having, in each of the first, second, and third openings, a cross section having an inverse tapered shape;

removing, by use of the photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line and the height difference offsetting electrode are exposed in the second opening, and a part of the signal line is exposed in the third opening;

depositing a transparent electrically conductive layer on the first transparent insulative substrate; and removing the photosensitive resin pattern, so that (a) the pixel electrode is formed in the first region including the part of the drain wire, (b) the electrode terminal of the scanning line is formed in the second region including the part of the scanning line and the height difference offsetting electrode, and (c) the electrode terminal of the signal line is formed in the third region including the part of the signal line, each of the pixel electrode, the electrode terminal of the scanning line, and the electrode terminal of the signal line being made of the transparent electrically conductive layer.

According to the method of (18), through the step of forming the scanning line and the semiconductor layer, the step of forming the source and drain wires, and the step of forming the openings in the passivation insulative layer, it is possible to manufacture an active matrix substrate by use of three photo masks, without use of a halftone exposure technique. Note that, in this manufacturing method, the pixel electrode which is transparent and electrically conductive is obtained by the lift-off of the photosensitive resin pattern carried out in the step of forming the openings in the passivation insulative layer.

(19) A method for manufacturing a liquid crystal display device of (5), including the steps of:

sequentially depositing, on one main surface of a first transparent insulative substrate, a metal layer for a scanning line (gate wire), a gate insulative layer, a first amorphous silicon layer containing no impurity, and a second amorphous silicon layer containing an impurity;

forming a multiple-layer film pattern corresponding to the scanning line, by selectively removing the second amorphous silicon layer, the first amorphous silicon layer, the gate insulative layer, and the metal layer for the scanning line by use of a photosensitive resin pattern;

fluorinating the photosensitive resin pattern by dry etching with a fluorine gas;

applying a transparent insulative resin of coating type onto the one main surface of the first transparent insulative substrate and heating it so that a solvent therein is evaporated;

removing the photosensitive resin pattern having been fluorinated, depositing a metal layer for a source wire and a drain wire which metal layer includes at least one buffer metal layer, and thereafter forming the source and drain wires and a photosensitive resin pattern, the photosensitive resin pattern having a first region and a second region, the first region having a film thickness greater than that of the second region, the first region corresponding to a height difference offsetting electrode positioned above a boundary between a transparent insulative layer and an end of the scanning line which end is located outside an image display section, and the second region corresponding to a channel region provided between the source wire and the drain wire;

selectively removing the metal layer for the source wire and the drain wire, the second amorphous silicon layer, and the first amorphous silicon layer by use of the photosensitive resin pattern as a mask;

reducing the film thicknesses of the photosensitive resin pattern so as to expose, between the source wire and the drain wire, the metal layer for the source wire and the drain wire, and selectively removing again a part of the metal layer for the source wire and the drain wire, a part of the second amorphous silicon layer, and a part of the first amorphous silicon layer by use of, as a mask, the photosensitive resin pattern whose film thicknesses have been reduced;

depositing a passivation insulative layer on the first transparent insulative substrate, and thereafter forming a photosensitive resin pattern on the first transparent insulative substrate, the photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning line is to be formed, the third opening being provided in a third region which is outside the image display section and in which an electrode terminal of the signal line (source wire) is to be formed, the photosensitive resin pattern having, in each of the first, second, and third openings, a cross section having an inverse tapered shape;

removing, by use of the photosensitive resin pattern as a mask, (a) parts of the passivation insulative layer which parts respectively correspond to the first and third openings and (b) a part of the passivation insulative layer and a part of the gate insulative layer which parts correspond to the second opening, so that a part of the drain wire and the transparent insulative resin are exposed in the first opening, a part of the scanning signal line and the height difference offsetting electrode are exposed in the second opening, and a part of the signal line is exposed in the third opening;

depositing a transparent electrically conductive layer on the first transparent insulative substrate; and removing the photosensitive resin pattern, so that (a) the pixel electrode is formed in the first region including the part of the drain wire, (b) the electrode terminal of the scanning line is formed in the second region including the part of the scanning line and the height difference offsetting electrode, and (c) the electrode terminal of the signal line is formed in the third region including the part of the signal line, each of the pixel electrode, the electrode terminal of the scanning line, and the electrode terminal of the signal line being made of the transparent electrically conductive layer.

According to the method of (19), through (i) the step of forming the scanning line and the semiconductor layer, (ii) the step of forming the source and drain wires through use of the halftone exposure technique and the step of patterning the semiconductor layer into islands through use of the halftone exposure technique, and (iii) the step of forming the openings in the passivation insulative layer, it is possible to manufacture an active matrix substrate by use of three photo masks. Also according to this manufacturing method, the pixel electrode which is transparent and electrically conductive is obtained by lift-off of the photosensitive resin pattern carried out in the step of forming the openings in the passivation insulative layer.

(20) A method for manufacturing a liquid crystal display device of (6), including the steps of:

sequentially depositing, on one main surface of a first transparent insulative substrate, a metal layer for a scanning line (gate wire), a gate insulative layer, a first amorphous silicon layer containing no impurity, and a second amorphous silicon layer containing an impurity;

forming a photosensitive resin pattern on the second amorphous silicon layer, the photosensitive resin pattern corresponding to the scanning line, the photosensitive resin pattern including one region having a film thickness greater than that of the other region, the one region corresponding to a part of the semiconductor layer which part is above the gate electrode;

selectively removing the second amorphous silicon layer, the first amorphous silicon layer, the gate insulative layer, and the metal layer for the scanning line by use of the photosensitive resin pattern as a mask;

fluorinating the photosensitive resin pattern by dry etching with a fluorine gas;

applying a transparent insulative resin of coating type onto the one main surface of the first transparent insulative substrate and heating it so that a solvent therein is evaporated;

reducing the film thicknesses of the photosensitive resin pattern so as to expose a part of the second amorphous silicon layer which part is above the scanning line;

selectively removing the second amorphous silicon layer and the first amorphous silicon layer by use of the photosensitive resin pattern whose thicknesses have been reduced, so as to expose a part of the gate insulative layer which part is above the scanning line;

forming (a) a source wire and a drain wire and (b) a height difference offsetting electrode, by depositing a metal layer for the source wire and the drain wire which metal layer includes at least one buffer metal layer, and by selectively removing a part of the metal layer for the source wire and the drain wire, a part of the second amorphous silicon layer which part is between the source wire and the drain wire, and a part of the first amorphous silicon layer which part is between the source wire and the drain wire, the height difference offsetting electrode being positioned above a boundary between the transparent insulative layer and an end of the scanning line which end is located outside the image display section;

depositing a passivation insulative layer on the first transparent insulative substrate, and thereafter forming a photosensitive resin pattern on the first transparent insulative substrate, the photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning line is to be formed, the third opening being provided in a third region which is outside the image display section and in which an electrode terminal of the signal line (source wire) is to be formed, the photosensitive resin pattern having, in each of the first, second, and third openings, a cross section having an inverse tapered shape;

removing, by use of the photosensitive resin pattern as a mask, (a) parts of the passivation insulative layer which parts respectively correspond to the first and third openings and (b) a part of the passivation insulative layer and a part of the gate insulative layer which parts correspond to the second opening, so that a part of the drain wire and the transparent insulative resin are exposed in the first opening, a part of the scanning signal line and the height difference offsetting electrode are exposed in the second opening, and a part of the signal line is exposed in the third opening;

depositing a transparent electrically conductive layer on the first transparent insulative substrate; and removing the photosensitive resin pattern, so that (a) the pixel electrode is formed in the first region including the part of the drain wire, (b) the electrode terminal of the scanning line is formed in the second region including the part of the scanning line and the height difference offsetting electrode, and (c) the electrode terminal of the signal line is formed in the third region including the part of the signal line, each of the pixel electrode, the electrode terminal of the scanning line, and the electrode terminal of the signal line being made of the transparent electrically conductive layer.

According to the method of (20), through (i) the step of forming the scanning line and the semiconductor layer by use of the halftone exposure technique and the step of patterning the semiconductor layer into islands by use of the halftone exposure technique, (ii) the step of forming the source and drain wires, and (iii) the step of forming the openings in the passivation insulative layer, it is possible to manufacture an active matrix substrate by use of three photo masks. Also in this manufacturing method, the pixel electrode which is transparent and electrically conductive is obtained by lift-off of the photosensitive resin pattern carried out in the step of forming the openings in the passivation insulative layer.

In order to attain the foregoing objects, a method for manufacturing an active matrix substrate according to the present invention is a method for manufacturing an active matrix substrate, the active matrix substrate including a data signal line, a scanning signal line, a transistor connected with the data signal line and the scanning signal line, and a pixel electrode connected with the data signal line via the transistor, said method including the steps of: (i) selectively forming a pattern of a laminated structure, by forming the laminated structure on a substrate, by forming a first photosensitive resin pattern on the laminated structure, and by selectively forming the pattern of the laminated structure by use of the first photosensitive resin pattern, the laminated structure including (a) a metal layer, which is a material of the scanning signal line, (b) a gate insulative layer, and (c) a semiconductor layer, which is a material of the transistor; (ii) fluorinating a surface of the first photosensitive resin pattern by dry etching with a fluorine gas; (iii) applying a transparent insulative resin of coating type onto the substrate so that the transparent insulative resin fills a space in the pattern of the laminated structure; and (iv) removing the first photosensitive resin pattern which has been fluorinated.

According to the above method, by use of the first photosensitive resin pattern, the pattern of the laminated structure is formed, the laminated structure including (i) the metal layer (first metal layer) for the scanning signal line, (ii) the gate insulative layer, and (iii) the semiconductor layer. Further, by utilizing water repellency of the first photosensitive resin pattern having been fluorinated, the transparent insulative resin is selectively formed in the space in the pattern of the laminated structure, so that the space in the pattern of the laminated structure is filled with the transparent insulative resin. Consequently, a side surface of the scanning signal line is made insulative. In this manner, the scanning signal line and the semiconductor layer are formed concurrently (concurrent patterning).

Thus, according to the above method, it is possible to form the scanning signal line and the semiconductor layer by use of only a single photosensitive resin pattern (photo mask). Consequently, according to the above method, it is possible to reduce the number of steps, as compared with the conventional manufacturing methods which require at least two photo masks until the semiconductor layer is formed.

Also, according to the above method, even in the case where the pattern of the laminated structure including the metal layer, the gate insulative layer, and the semiconductor layer is formed by use of a single photo mask (first photosensitive resin pattern), it is possible to provide the active matrix substrate with (i) the pattern of the laminate structure and (ii) another electrically conductive pattern intersecting with each other, since the insulative layer is formed so as to cover a side surface of the metal layer and accordingly the metal layer is made insulative.

Preferably, the method for manufacturing the active matrix substrate according to the present invention is such that: the active matrix substrate includes a drain wire by which the transistor and the pixel electrode are connected with each other; the step (i) includes the sub-steps of: after sequentially depositing the metal layer and the gate insulative layer, sequentially depositing a first amorphous silicon layer containing no impurity, a second amorphous silicon layer containing an impurity, and a heat resistant metal layer, the first and second amorphous silicon layers being included in the semiconductor layer; and forming the pattern of the laminated structure so that the pattern corresponds to the scanning signal line, by selectively removing the heat resistant metal layer, the second amorphous silicon layer, the first amorphous silicon layer, the gate insulative layer, and the metal layer by use of the first photosensitive resin pattern; and said method further includes the steps of, after the step (iv):(v) forming the drain wire and a source wire, by depositing a transparent electrically conductive layer and a second metal layer which includes at least one buffer metal layer and which is a material of the data signal line and the drain wire, and by selectively removing the second metal layer, the transparent electrically conductive layer, the heat resistant metal layer, the second amorphous silicon layer, and the first amorphous silicon layer so as to form (a) the drain wire, which serves also as a pseudo pixel electrode, and (b) the data signal line including a pseudo electrode terminal located outside an image display section; (vi) forming, on the substrate, a passivation insulative layer having first, second, and third openings respectively provided above the pseudo pixel electrode, above an electrode terminal of the scanning signal line which electrode terminal is located outside the image display section, and above the pseudo electrode terminal of the data signal line, and removing a part of the first amorphous silicon layer and a part of the gate insulative layer which parts correspond to the second opening, so as to expose the electrode terminal of the scanning signal line; and (vii) removing parts of the buffer metal layer which parts respectively correspond to the first and third openings, so as to expose the pixel electrode and the electrode terminal of the data signal line, and each of the pixel electrode and the electrode terminal of the data signal line being made of the transparent electrically conductive layer.

Here, the drain wire may also be called a drain electrode. The "pseudo pixel electrode" means a virtual pixel electrode, which is formed in a region being formed into a pixel electrode in the later step and is made of a lamination of the transparent electrically conductive layer and the second metal layer. The "pseudo electrode terminal" means a virtual electrode terminal, which is formed in a region being formed into an electrode terminal in the later step and is made of a lamination of the transparent electrically conductive layer and the second metal layer. Note that the electrode terminal is a terminal for each wire, and is provided outside the image display region in order to make connection with a driving circuit and/or the like provided outside the substrate.

According to the above method, the pixel electrode which is transparent and electrically conductive is obtained by forming the data signal line and the pseudo pixel electrode (drain electrode), each made of a laminated pattern including the transparent electrically conductive layer and the second metal layer, and by removing, in the step of forming the openings in the passivation insulative layer, the part of the second metal layer which part is exposed in the opening. This can eliminate the need for the step of photo-etching for forming the pixel electrode, thereby reducing the number of steps.

Thus, according to the above method, one photosensitive resin pattern (photo mask) is used in each of (i) the step of forming the scanning signal line and the semiconductor layer, (ii) the step of forming the source and drain wires, and (iii) the step of forming the openings in the passivation insulative layer. Namely, according to the above method, it is possible to manufacture an active matrix substrate by use of a total of three photo masks.

Preferably, the method for manufacturing the active matrix substrate according to the present invention is such that: the active matrix substrate includes a drain wire by which the transistor and the pixel electrode are connected with each other; the step (i) includes the sub-steps of: after sequentially depositing the metal layer and the gate insulative layer, sequentially depositing a first amorphous silicon layer containing no impurity, a second amorphous silicon layer containing an impurity, and a heat resistant metal layer, the first and second amorphous silicon layers being included in the semiconductor layer; forming the first photosensitive resin pattern on a region of the heat resistant metal layer which region corresponds to the scanning signal line, the first photosensitive resin pattern including one region having a film thickness greater than that of the other region, the one region being above a connection region which is located outside an image display section and in which the scanning signal line and another wire are connected with each other; and forming the pattern of the laminated structure so that the pattern corresponds to the scanning signal line, by selectively removing the heat resistant metal layer, the second amorphous silicon layer, the first amorphous silicon layer, the gate insulative layer, and the metal layer by use of the first photosensitive resin pattern; the step (iv) includes the sub-steps of: reducing the film thicknesses of the first photosensitive resin pattern, so as to expose a part of the heat resistant metal layer which part corresponds to the connection region; selectively removing the heat resistant metal layer, the second amorphous silicon layer, the first amorphous silicon layer, and the gate insulative layer by use of, as a mask, the first photosensitive resin pattern whose film thicknesses have been reduced, so as to expose a part of the scanning signal line which part is in the connection region; and removing the first photosensitive resin pattern whose film thicknesses have been reduced; and said method further includes the steps of, after the step (iv):(v) forming the drain wire and a source wire, by depositing a transparent electrically conductive layer and a second metal layer which includes at least one buffer metal layer and which is a material of the data signal line and the drain wire, and by selectively removing the second metal layer, the transparent electrically conductive layer, the heat resistant metal layer, the second amorphous silicon layer, and the first amorphous silicon layer so as to form (i) the drain wire, which serves also as a pseudo pixel electrode, (ii) the data signal line including a pseudo electrode terminal located outside the image display section, and (iii) a pseudo electrode terminal of the scanning signal line, the pseudo electrode terminal of the scanning signal line being formed in the connection region; and (vi) forming, on the substrate, a passivation insulative layer having openings respectively provided above the pseudo pixel electrode, above the pseudo electrode terminal of the scanning signal line, and above the pseudo electrode terminal of the data signal line, and removing parts of the buffer metal layer which parts correspond to the respective openings, so as to expose the pixel electrode, an electrode terminal of the scanning signal line, and an electrode terminal of the data signal line, and each of the pixel electrode, the electrode terminal of the scanning signal line, and the electrode terminal of the data signal line being made of the transparent electrically conductive layer.

According to the above method, the pixel electrode which is transparent and electrically conductive is obtained by forming the data signal line and the pseudo pixel electrode (drain electrode), each made of a laminated pattern including the transparent electrically conductive layer and the second metal layer, and by removing, in the step of forming the openings in the passivation insulative layer, the part of the second metal layer which part is exposed in the opening. This can eliminate the need for the step of photo-etching for forming the pixel electrode, thereby reducing the number of steps.

Further, according to the above method, in the step of forming the scanning signal line and the semiconductor layer, a region (i.e., the connection region in which the scanning signal line and another wire are connected with each other) which is located outside the image display section and in which the electrode terminal of the scanning signal line is to be formed is exposed by use of a so-called halftone exposure technique. This allows, in the later step, (a) the electrode terminal of the scanning signal line and (b) the electrode terminal of the data signal line to be connected with each other by, e.g., a short-circuit wire which is made of the transparent electrically conductive layer. Thus, a measure against static electricity can be attained.

Furthermore, according to the above method, one photosensitive resin pattern (photo mask) is used in each of (i) the step of forming the scanning signal line and the semiconductor layer by use of the halftone exposure technique (including the step of forming a contact to the scanning signal line), (ii) the step of forming the source and drain wires, and (iii) the step of forming the openings in the passivation insulative layer. Namely, according to the above method, it is possible to manufacture an active matrix substrate by use of a total of three photo masks.

Preferably, the method for manufacturing the active matrix substrate according to the present invention is such that: the active matrix substrate includes a drain wire by which the transistor and the pixel electrode are connected with each other; the step (i) includes the sub-steps of: after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer; and forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern; and said method further includes the steps of, after the step (iv):(v) forming the drain wire and a source wire, by depositing a second metal layer which includes at least one buffer metal layer and which is a material of the data signal line and the drain wire, and by selectively removing the second metal layer, the second amorphous silicon layer, and the first amorphous silicon layer so as to form the data signal line, the drain wire, and a height difference offsetting electrode, the height difference offsetting electrode being positioned above a boundary between the transparent insulative resin and an end of the scanning signal line which end is located outside an image display section; (vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which the pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed; (vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening; (viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, and each of the pixel electrode, the electrode terminal of the scanning signal line, and the electrode terminal of the data signal line being made of the transparent electrically conductive layer.

According to the above method, the pixel electrode is formed in such a manner that, in the step of forming the openings in the passivation layer, the openings are formed by use of the third photosensitive resin pattern having the end whose cross section has an inverse tapered shape, the transparent electrically conductive layer is then deposited, and the transparent electrically conductive layer is subjected to lift-off by use of the third photosensitive resin pattern as a lift-off material. This can eliminate the need for the step of photo-etching for forming the pixel electrode, thereby reducing the number of steps.

Thus, according to the above method, one photosensitive resin pattern (photo mask) is used in each of (i) the step of forming the scanning signal line and the semiconductor layer, (ii) the step of forming the source and drain wires, and (iii) the step of forming the openings in the passivation insulative layer. Namely, according to the above method, it is possible to manufacture an active matrix substrate by use of a total of three photo masks.

Preferably, the method for manufacturing the active matrix substrate according to the present invention is such that: the active matrix substrate includes a drain wire by which the transistor and the pixel electrode are connected with each other; the step (i) includes the sub-steps of: after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer; and forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern; and said method further includes the steps of, after the step (iv):(v) forming the drain wire and a source wire, the step (v) including the sub-steps of: depositing a second metal layer which includes at least one buffer metal layer and which is a material of the data signal line and the drain wire, and thereafter forming a second photosensitive resin pattern having a first region and a second region, the first region having a film thickness greater than that of the second region, the first region corresponding to the data signal line, the drain wire, and a height difference offsetting electrode positioned above a boundary between the transparent insulative resin and an end of the scanning signal line which end is located outside an image display section, and the second region corresponding to a channel region provided between the data signal line and the drain wire; selectively removing the second metal layer, the second amorphous silicon layer, and the first amorphous silicon layer by use of the second photosensitive resin pattern as a mask; and reducing the film thicknesses of the second photosensitive resin pattern so as to expose a part of the second metal layer which part corresponds to the channel region, and selectively removing again the second metal layer, the second amorphous silicon layer, and the first amorphous silicon layer by use of, as a mask, the second photosensitive resin pattern whose film thicknesses have been reduced; (vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed; (vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening; (viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, and each of the pixel electrode, the electrode terminal of the scanning signal line, and the electrode terminal of the data signal line being made of the transparent electrically conductive layer.

According to the above method, the pixel electrode is formed in such a manner that, in the step of forming the openings in the passivation layer, the openings are formed by use of the third photosensitive resin pattern having the end whose cross section has an inverse tapered shape, the transparent electrically conductive layer is then deposited, and the transparent electrically conductive layer is subjected to lift-off by use of the third photosensitive resin pattern as a lift-off material. This can eliminate the need for the step of photo-etching for forming the pixel electrode, thereby reducing the number of steps.

Thus, according to the above method, one photosensitive resin pattern (photo mask) is used in each of (i) the step of forming the scanning signal line and the semiconductor layer, (ii) the step of forming the source and drain wires (including the step of patterning the semiconductor into islands), and (iii) the step of forming the openings in the passivation insulative layer. Namely, according to the above method, it is possible to manufacture an active matrix substrate by use of a total of three photo masks.

Furthermore, according to the above method, a part of the first amorphous silicon layer is removed which part corresponds to the channel region of the transistor above the scanning signal line; therefore, it is possible to suppress crosstalk between the data signal lines.

Preferably, the method for manufacturing the active matrix substrate according to the present invention is such that: the active matrix substrate includes a drain wire by which the transistor and the pixel electrode are connected with each other; the step (i) includes the sub-steps of: after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer; forming the first photosensitive resin pattern on a region of the second amorphous silicon layer which region corresponds to the scanning signal line, the first photosensitive resin pattern including one region having a film thickness greater than that of the other region, the one region being above a region in which the semiconductor layer is formed and which is above a gate electrode included in the transistor; and forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern as a mask; the step (iv) includes the sub-steps of: reducing the film thicknesses of the first photosensitive resin pattern, so as to expose a part of the second amorphous silicon layer which part is above the scanning signal; selectively removing the second amorphous silicon layer and the first amorphous silicon layer by use of, as a mask, the first photosensitive resin pattern whose film thicknesses have been reduced, so as to expose a part of the gate insulative layer which part is above the scanning signal line; and removing the first photosensitive resin pattern whose film thicknesses have been reduced; and said method further includes the steps of, after the step (iv):(v) forming the drain wire and a source wire, by depositing a second metal layer which includes at least one buffer metal layer and which is a material of the data signal line and the drain wire, and by selectively removing the second metal layer, the second amorphous silicon layer, and the first amorphous silicon layer so as to form the data signal line, the drain wire, and a height difference offsetting electrode, the height difference offsetting electrode being positioned above a boundary between the transparent insulative resin and an end of the scanning signal line which end is located outside an image display section; (vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed; (vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening; (viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, each of the pixel electrode, the electrode terminal of the scanning signal line, and the electrode terminal of the data signal line being made of the transparent electrically conductive layer.

According to the above method, the pixel electrode is formed in such a manner that, in the step of forming the openings in the passivation layer, the openings are formed by use of the third photosensitive resin pattern having the end whose cross section has an inverse tapered shape, the transparent electrically conductive layer is then deposited, and the transparent electrically conductive layer is subjected to lift-off by use of the third photosensitive resin pattern as a lift-off material. This can eliminate the need for the step of photo-etching for forming the pixel electrode, thereby reducing the number of steps.

Thus, according to the above method, one photosensitive resin pattern (photo mask) is used in each of (i) the step of forming the scanning line and the semiconductor layer by use of the halftone exposure technique (including the step of patterning the semiconductor layer into islands), (ii) the step of forming the source and drain wires, and (iii) the step of forming the openings in the passivation insulative layer. Namely, according to the above method, it is possible to manufacture an active matrix substrate by use of a total of three photo masks.

Furthermore, the above method includes the sub-step (the step of patterning the semiconductor into islands) of selectively removing the second amorphous silicon layer and the first amorphous silicon layer by use of, as a mask, the first photosensitive resin pattern whose film thicknesses have been reduced, so as to expose a part of the gate insulative layer which part is above the scanning signal line. Therefore, according to the above method, the electrode terminal of the scanning signal line and a storage capacitor, each of which is to be formed later in a region of the scanning signal line in which region the gate insulative layer is exposed, can be configured so as not to include the semiconductor layer. With this, a great storage capacitor can be easily achieved.

Preferably, the method for manufacturing the active matrix substrate according to the present invention further includes the step of: (x) forming the openings in the passivation insulative layer formed on the substrate, the step (x) including the sub-step of: forming, in the passivation insulative layer, a fourth opening above the scanning signal line, and removing a part of the first amorphous silicon layer which part corresponds to the fourth opening, so that the gate insulative layer and the transparent insulative resin are exposed in the fourth opening.

According to the above method, it is possible to prevent formation of a parasitic transistor. This makes it possible to provide an active matrix substrate including an insulated gate transistor having excellent on/off performance. Therefore, it is possible to provide a liquid crystal display device having high display performance by use of the active matrix substrate.

Preferably, the method for manufacturing the active matrix substrate according to the present invention further includes the step of: forming the openings in the passivation insulative layer formed on the substrate, wherein the openings are formed by use of a third photosensitive resin pattern which is made of a black pigment photosensitive resin, and the third photosensitive resin pattern is left without being removed after the openings are formed.

According to the above method, by using, in the step of forming the openings in the passivation insulative layer, a black pigment photosensitive resin as the third photosensitive resin pattern, it is possible to allow the black pigment photosensitive resin to serve as BM (black matrix). This eliminates the need for (i) the step of removing the third photosensitive resin pattern and (ii) the step of forming BM on the color filter substrate, thereby further promoting reduction of the manufacturing cost.

Preferably, the method for manufacturing the active matrix substrate according to the present invention is such that: in the step (iii), the transparent insulative resin, which fills the space in the pattern of the laminated structure, is applied so as to have a film thickness equal to or greater than that of a lamination of the metal layer and the gate insulative layer.

According to the above method, the side surface of the metal layer is reliably made insulative by the transparent insulative resin. This makes it possible to provide an active matrix substrate with (i) the pattern of the laminated structure and (ii) another electrically conductive pattern intersecting with each other.

Preferably, the method for manufacturing the active matrix substrate according to the present invention is such that: in the step (iii), the transparent insulative resin, which fills the space in the pattern of the laminated structure, is applied so as to have a film thickness equal to or greater than that of the laminated structure including the metal layer, the gate insulative layer, and the semiconductor layer.

According to the above method, the side surface of the metal layer is further reliably made insulative by the transparent insulative resin. This makes it possible to provide an active matrix substrate with (i) the pattern of the laminated structure and (ii) another electrically conductive pattern intersecting with each other.

A method for manufacturing a liquid crystal display device according to the present invention includes: manufacturing an active matrix substrate by any of the above active matrix substrate manufacturing methods; and filling liquid crystal into a space between the active matrix substrate and a counter substrate.

In the method for manufacturing the liquid crystal display device according to the present invention, the liquid crystal display device may be a twisted nematic liquid crystal display device.

In the method for manufacturing the liquid crystal display device according to the present invention, the liquid crystal display device may be an in-plane switching liquid crystal display device.

According to the above method, it is possible to provide an IPS (In-Plain-Switching) liquid crystal display device excellent in viewing angle characteristics. Furthermore, with the configuration in which the insulative layer does not exist on the pixel electrode, it is possible to reduce image sticking in a display image in the liquid crystal display device.

In the method for manufacturing the liquid crystal display device according to the present invention, the liquid crystal display device may be a vertical alignment liquid crystal display device.

According to the above method, it is possible to provide a VA (Vertical-Align) liquid crystal display device, which provides a viewing angle superior to that of a TN liquid crystal display device.

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

An active matrix substrate and a liquid crystal display device each of which is obtained by the manufacturing method of the present invention can be used in products provided with liquid crystal displays. Particularly, the active matrix substrate and the liquid crystal display device are suitably used in liquid crystal displays included in televisions, mobile phones, on-vehicle instrument panels, etc.

Reference Signs List

1 Liquid crystal panel
2 Glass substrate (substrate)
3 Semiconductor integrated circuit chip
4 TCP film
5 Part of or electrode terminal (connection region) of scanning signal line (gate wire, scanning line)
5A Electrode terminal (of scanning signal line)
6 Part of or electrode terminal (connection region) of data signal line (source wire, signal line)
6A Electrode terminal (of data signal line)
9 Color filter substrate (counter substrate, second transparent insulative substrate)
10 Transistor (insulated gate transistor)
11 Scanning signal line (gate wire, scanning line, gate electrode)
11A Gate electrode
12 Data signal line (signal line, source wire, source electrode)
14 Counter electrode (common electrode)
15 Storage capacitor (auxiliary capacitor)
16 Storage capacitor line
17 Liquid crystal
21 Drain electrode (drain wire, drain electrode)
22 Pixel electrode (pseudo pixel electrode)
30 Gate insulative layer (first silicon nitride layer)
31 First amorphous silicon layer (semiconductor layer)
33 Second amorphous silicon layer (semiconductor layer)
34 Heat resistant metal layer (Ti thin film layer)
35 Low resistant metal layer (second metal layer)
36 Buffer electrically conductive layer
37 Passivation insulative layer
38 Opening (first opening) (above pixel electrode)
40 Projection
41 Projection
42 Slit (space)
44 Static electricity countermeasure line (short-circuit wire)
45 Control circuit
45c Storage capacitor line driving circuit
45g Scanning signal line driving circuit
45s Data signal line driving circuit
50 Storage capacitor formed region
60 Transparent insulative resin (transparent insulative layer)
62 Opening (above drain electrode)
63 Opening (second opening) (above part of scanning signal line)
64 Opening (third opening) (above part of data signal line)
65 Opening (above storage capacitor line or common electrode line)
70 Liquid crystal panel
71 Active matrix substrate (first transparent insulative substrate)
75 Opening (fourth opening)
80A Photosensitive resin pattern (second photosensitive resin pattern)
80B Photosensitive resin pattern (second photosensitive resin pattern)
83A Photosensitive resin pattern (first photosensitive resin pattern)
83B Photosensitive resin pattern (first photosensitive resin pattern)
84A Photosensitive resin pattern (first photosensitive resin pattern)
84B Photosensitive resin pattern (first photosensitive resin pattern)
88 Photosensitive resin pattern (third photosensitive resin pattern)
90 Black pigment photosensitive resin
91 Transparent electrically conductive layer
100 Liquid crystal display device
P22 Pseudo pixel electrode (pixel electrode)
P5 Pseudo electrode terminal
P6 Pseudo electrode terminal
PR Photosensitive resin pattern (first photosensitive resin pattern)
PR1 Photosensitive resin pattern whose surface has been fluorinated

The invention claimed is:

1. A method for manufacturing an active matrix substrate, the active matrix substrate including a data signal line, a scanning signal line, a transistor connected with the data signal line and the scanning signal line, and a pixel electrode connected with the data signal line via the transistor, said method comprising the steps of:
  (i) selectively forming a pattern of a laminated structure, by forming the laminated structure on a substrate, by forming a first photosensitive resin pattern on the laminated structure, and by selectively forming the pattern of the laminated structure by use of the first photosensitive resin pattern, the laminated structure including (a) a metal layer, which is a material of the scanning signal line, (b) a gate insulative layer, and (c) a semiconductor layer, which is a material of the transistor;
  (ii) fluorinating a surface of the first photosensitive resin pattern by dry etching with a fluorine gas;
  (iii) applying a transparent insulative resin of coating type onto the substrate so that the transparent insulative resin fills a space in the pattern of the laminated structure; and
  (iv) removing the first photosensitive resin pattern which has been fluorinated.

2. The method as set forth in claim 1, wherein:
the active matrix substrate includes a drain wire by which the transistor and the pixel electrode are connected with each other;
the step (i) includes the sub-steps of:
  after sequentially depositing the metal layer and the gate insulative layer, sequentially depositing a first amorphous silicon layer containing no impurity, a second amorphous silicon layer containing an impurity, and a heat resistant metal layer, the first and second amorphous silicon layers being included in the semiconductor layer; and
  forming the pattern of the laminated structure so that the pattern corresponds to the scanning signal line, by selectively removing the heat resistant metal layer, the second amorphous silicon layer, the first amorphous silicon layer, the gate insulative layer, and the metal layer by use of the first photosensitive resin pattern; and
said method further comprises the steps of, after the step (iv):
  (v) forming the drain wire and a source wire, by depositing a transparent electrically conductive layer and a second metal layer which includes at least one buffer metal layer and which is a material of the data signal line and the drain wire, and by selectively removing the second metal layer, the transparent electrically conductive layer, the heat resistant metal layer, the second amorphous silicon layer, and the first amorphous silicon layer so as to form (a) the drain wire, which serves also as a pseudo pixel electrode, and (b) the data signal line including a pseudo electrode terminal located outside an image display section;
  (vi) forming, on the substrate, a passivation insulative layer having first, second, and third openings respectively provided above the pseudo pixel electrode, above an electrode terminal of the scanning signal line which electrode terminal is located outside the image display section, and above the pseudo electrode terminal of the data signal line, and removing a part of the first amorphous silicon layer and a part of the gate insulative layer which parts correspond to the second opening, so as to expose the electrode terminal of the scanning signal line; and
  (vii) removing parts of the buffer metal layer which parts respectively correspond to the first and third openings, so as to expose the pixel electrode and the electrode terminal of the data signal line, and each of the pixel electrode and the electrode terminal of the data signal line being made of the transparent electrically conductive layer.

3. The method as set forth in claim 1, wherein:
the active matrix substrate includes a drain wire by which the transistor and the pixel electrode are connected with each other;
the step (i) includes the sub-steps of:
  after sequentially depositing the metal layer and the gate insulative layer, sequentially depositing a first amorphous silicon layer containing no impurity, a second amorphous silicon layer containing an impurity, and a heat resistant metal layer, the first and second amorphous silicon layers being included in the semiconductor layer;
  forming the first photosensitive resin pattern on a region of the heat resistant metal layer which region corresponds to the scanning signal line, the first photosensitive resin pattern including one region having a film thickness greater than that of the other region, the one region being above a connection region which is located outside an image display section and in which the scanning signal line and another wire are connected with each other; and
  forming the pattern of the laminated structure so that the pattern corresponds to the scanning signal line, by selectively removing the heat resistant metal layer, the second amorphous silicon layer, the first amorphous silicon layer, the gate insulative layer, and the metal layer by use of the first photosensitive resin pattern;
the step (iv) includes the sub-steps of:
  reducing the film thicknesses of the first photosensitive resin pattern, so as to expose a part of the heat resistant metal layer which part corresponds to the connection region;
  selectively removing the heat resistant metal layer, the second amorphous silicon layer, the first amorphous silicon layer, and the gate insulative layer by use of, as a mask, the first photosensitive resin pattern whose film thicknesses have been reduced, so as to expose a part of the scanning signal line which part is in the connection region; and
  removing the first photosensitive resin pattern whose film thicknesses have been reduced; and
said method further comprises the steps of, after the step (iv):
  (v) forming the drain wire and a source wire, by depositing a transparent electrically conductive layer and a second metal layer which includes at least one buffer metal layer and which is a material of the data signal line and the drain wire, and by selectively removing the second metal layer, the transparent electrically conductive layer, the heat resistant metal layer, the second amorphous silicon layer, and the first amorphous silicon layer so as to form (i) the drain wire, which serves also as a pseudo pixel electrode, (ii) the data signal line including a pseudo electrode terminal located outside the image display section, and (iii) a pseudo electrode terminal of the scanning signal line, the pseudo electrode terminal of the scanning signal line being formed in the connection region; and
  (vi) forming, on the substrate, a passivation insulative layer having openings respectively provided above the pseudo pixel electrode, above the pseudo electrode terminal of the scanning signal line, and above the pseudo electrode terminal of the data signal line, and removing parts of the buffer metal layer which parts correspond to the respective openings, so as to expose the pixel electrode, an electrode terminal of the scanning signal line, and an electrode terminal of the data signal line, and each of the pixel electrode, the electrode terminal of the scanning signal line, and the electrode terminal of the data signal line being made of the transparent electrically conductive layer.

4. The method as set forth in claim 1, wherein:

the active matrix substrate includes a drain wire by which the transistor and the pixel electrode are connected with each other;

the step (i) includes the sub-steps of:

after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer; and forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern; and said method further comprises the steps of, after the step (iv):

(v) forming the drain wire and a source wire, by depositing a second metal layer which includes at least one buffer metal layer and which is a material of the data signal line and the drain wire, and by selectively removing the second metal layer, the second amorphous silicon layer, and the first amorphous silicon layer so as to form the data signal line, the drain wire, and a height difference offsetting electrode, the height difference offsetting electrode being positioned above a boundary between the transparent insulative resin and an end of the scanning signal line which end is located outside an image display section;

(vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which the pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed;

(vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening;

(viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, and each of the pixel electrode, the electrode terminal of the scanning signal line, and the electrode terminal of the data signal line being made of the transparent electrically conductive layer.

5. The method as set forth in claim 1, wherein:

the active matrix substrate includes a drain wire by which the transistor and the pixel electrode are connected with each other;

the step (i) includes the sub-steps of:

after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer; and forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern; and said method further comprises the steps of, after the step (iv):

(v) forming the drain wire and a source wire, the step (v) including the sub-steps of:

depositing a second metal layer which includes at least one buffer metal layer and which is a material of the data signal line and the drain wire, and thereafter forming a second photosensitive resin pattern having a first region and a second region, the first region having a film thickness greater than that of the second region, the first region corresponding to the data signal line, the drain wire, and a height difference offsetting electrode positioned above a boundary between the transparent insulative resin and an end of the scanning signal line which end is located outside an image display section, and the second region corresponding to a channel region provided between the data signal line and the drain wire;

selectively removing the second metal layer, the second amorphous silicon layer, and the first amorphous silicon layer by use of the second photosensitive resin pattern as a mask; and reducing the film thicknesses of the second photosensitive resin pattern so as to expose a part of the second metal layer which part corresponds to the channel region, and selectively removing again the second metal layer, the second amorphous silicon layer, and the first amorphous silicon layer by use of, as a mask, the second photosensitive resin pattern whose film thicknesses have been reduced;

(vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed;

(vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening;

(viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, and each of the pixel electrode, the electrode terminal of the scanning signal line, and the electrode terminal of the data signal line being made of the transparent electrically conductive layer.

6. The method as set forth in claim 1, wherein:

the active matrix substrate includes a drain wire by which the transistor and the pixel electrode are connected with each other;

the step (i) includes the sub-steps of:
  after sequentially depositing the metal layer and the gate insulative layer, sequentially depositing a first amorphous silicon layer containing no impurity and a second amorphous silicon layer containing an impurity, the first and second amorphous silicon layers being included in the semiconductor layer;
  forming the first photosensitive resin pattern on a region of the second amorphous silicon layer which region corresponds to the scanning signal line, the first photosensitive resin pattern including one region having a film thickness greater than that of the other region, the one region being above a region in which the semiconductor layer is formed and which is above a gate electrode included in the transistor; and
  forming the pattern of the laminated structure so that the pattern corresponds to the scanning signal line, by selectively removing the second amorphous silicon layer, the first amorphous silicon layer, the gate insulative layer, and the metal layer by use of the first photosensitive resin pattern as a mask;

the step (iv) includes the sub-steps of:
  reducing the film thicknesses of the first photosensitive resin pattern, so as to expose a part of the second amorphous silicon layer which part is above the scanning signal;
  selectively removing the second amorphous silicon layer and the first amorphous silicon layer by use of, as a mask, the first photosensitive resin pattern whose film thicknesses have been reduced, so as to expose a part of the gate insulative layer which part is above the scanning signal line; and
  removing the first photosensitive resin pattern whose film thicknesses have been reduced; and said method further comprises the steps of, after the step (iv):

(v) forming the drain wire and a source wire, by depositing a second metal layer which includes at least one buffer metal layer and which is a material of the data signal line and the drain wire, and by selectively removing the second metal layer, the second amorphous silicon layer, and the first amorphous silicon layer so as to form the data signal line, the drain wire, and a height difference offsetting electrode, the height difference offsetting electrode being positioned above a boundary between the transparent insulative resin and an end of the scanning signal line which end is located outside an image display section;

(vi) depositing a passivation insulative layer on the substrate, and thereafter forming a third photosensitive resin pattern on the substrate, the third photosensitive resin pattern having an end whose cross section has an inverse tapered shape, the third photosensitive resin pattern having first, second, and third openings, the first opening being provided in a first region which is in the image display section and includes a part of the drain wire and in which a pixel electrode is to be formed, the second opening being provided in a second region which is outside the image display section and includes the height difference offsetting electrode and in which an electrode terminal of the scanning signal line is to be formed, and the third opening being provided in a third region which is outside the image display section and in which an electrode terminal of the data signal line is to be formed;

(vii) removing, by use of the third photosensitive resin pattern as a mask, (a) parts of the passivation insulative layer which parts respectively correspond to the first and third openings and (b) a part of the passivation insulative layer, a part of the first amorphous silicon layer, and a part of the gate insulative layer which parts correspond to the second opening, so that a part of the drain wire and the transparent insulative resin are exposed in the first opening, a part of the scanning signal line, the height difference offsetting electrode, and the transparent insulative resin are exposed in the second opening, and a part of the data signal line and the transparent insulative resin are exposed in the third opening;

(viii) depositing a transparent electrically conductive layer on the substrate; and (ix) removing the third photosensitive resin pattern, so that (a) the pixel electrode is formed in the first region including the part of the drain wire, (b) the electrode terminal of the scanning signal line is formed in the second region including the part of the scanning signal line and the height difference offsetting electrode, and (c) the electrode terminal of the data signal line is formed in the third region including the part of the data signal line, each of the pixel electrode, the electrode terminal of the scanning signal line, and the electrode terminal of the data signal line being made of the transparent electrically conductive layer.

7. The method as set forth in claim 3, further comprising the step of:
(x) forming the openings in the passivation insulative layer formed on the substrate,
the step (x) including the sub-step of:
forming, in the passivation insulative layer, a fourth opening above the scanning signal line, and removing a part of the first amorphous silicon layer which part corresponds to the fourth opening, so that the gate insulative layer and the transparent insulative resin are exposed in the fourth opening.

8. The method as set forth in claim 2, further comprising the step of:
forming the openings in the passivation insulative layer formed on the substrate, wherein the openings are formed by use of a third photosensitive resin pattern which is made of a black pigment photosensitive resin, and the third photosensitive resin pattern is left without being removed after the openings are formed.

9. The method as set forth in claim 1, wherein:
in the step (iii), the transparent insulative resin, which fills the space in the pattern of the laminated structure, is applied so as to have a film thickness equal to or greater than that of a lamination of the metal layer and the gate insulative layer.

10. The method as set forth in claim 1, wherein:
in the step (iii), the transparent insulative resin, which fills the space in the pattern of the laminated structure, is applied so as to have a film thickness equal to or greater than that of the laminated structure including the metal layer, the gate insulative layer, and the semiconductor layer.

11. A method for manufacturing a liquid crystal display device, comprising:
manufacturing an active matrix substrate by a method as set forth in claims 1; and
filling liquid crystal into a space between the active matrix substrate and a counter substrate.

12. The method as set forth in claim 11, wherein:
the liquid crystal display device is a twisted nematic liquid crystal display device.

13. The method as set forth in claim 11, wherein:
the liquid crystal display device is an in-plane switching liquid crystal display device.

14. The method as set forth in claim 11, wherein:
the liquid crystal display device is a vertical alignment liquid crystal display device.

* * * * *